(12) United States Patent
Kozuma et al.

(10) Patent No.: US 12,400,605 B2
(45) Date of Patent: Aug. 26, 2025

(54) SEMICONDUCTOR DEVICE, DISPLAY APPARATUS, AND ELECTRONIC DEVICE

(71) Applicant: Semiconductor Energy Laboratory Co., Ltd., Atsugi (JP)

(72) Inventors: Munehiro Kozuma, Atsugi (JP); Tatsuya Onuki, Atsugi (JP); Takanori Matsuzaki, Atsugi (JP); Minato Ito, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/560,716

(22) PCT Filed: May 20, 2022

(86) PCT No.: PCT/IB2022/054713
§ 371 (c)(1),
(2) Date: Nov. 14, 2023

(87) PCT Pub. No.: WO2022/249001
PCT Pub. Date: Dec. 1, 2022

(65) Prior Publication Data
US 2024/0265882 A1    Aug. 8, 2024

(30) Foreign Application Priority Data
May 27, 2021    (JP) ................. 2021-089485

(51) Int. Cl.
*G09G 3/3275*    (2016.01)
*G09G 3/3233*    (2016.01)
(Continued)

(52) U.S. Cl.
CPC ......... *G09G 3/3275* (2013.01); *G09G 3/3233* (2013.01); *G09G 2300/0842* (2013.01);
(Continued)

(58) Field of Classification Search
CPC ......... G09G 2310/0297; G09G 3/3614; G09G 2310/027; G09G 2310/0291;
(Continued)

(56) References Cited

U.S. PATENT DOCUMENTS 5,926,156 A    7/1999   Katoh et al.
7,956,854 B2   6/2011   Hashimoto
(Continued)

FOREIGN PATENT DOCUMENTS

CN    001897080 A    1/2007
JP    09-015557 A    1/1997
(Continued)

OTHER PUBLICATIONS

International Search Report (Application No. PCT/IB2022/054713) Dated Aug. 16, 2022.
(Continued)

*Primary Examiner* — Sanjiv D. Patel
(74) *Attorney, Agent, or Firm* — Robinson Intellectual Property Law Office, P.C.; Eric J. Robinson

(57) ABSTRACT

A semiconductor device having redundancy is provided. The semiconductor device includes a first driver circuit, a second driver circuit, a first selection circuit, a second selection circuit, and a switch circuit. An output terminal of the first driver circuit is electrically connected to an input terminal of the first selection circuit and a first terminal of the switch circuit, and an output terminal of the second driver circuit is electrically connected to an input terminal of the second selection circuit and a second terminal of the switch circuit.

4 Claims, 31 Drawing Sheets

(51) Int. Cl.
*H10D 30/67* (2025.01)
*H10K 59/131* (2023.01)

(52) U.S. Cl.
CPC .............. *G09G 2310/0243* (2013.01); *G09G 2310/0291* (2013.01); *G09G 2330/021* (2013.01); *H10D 30/6734* (2025.01); *H10D 30/6755* (2025.01); *H10K 59/131* (2023.02)

(58) Field of Classification Search
CPC ... G09G 2310/0275; G09G 2310/0251; G09G 3/3685
See application file for complete search history.

(56) References Cited

U.S. PATENT DOCUMENTS

| | | | |
|---|---|---|---|
| 8,339,349 | B2 | 12/2012 | Shin et al. |
| 11,132,939 | B2 | 9/2021 | Yen et al. |
| 11,132,940 | B2 | 9/2021 | Yen et al. |
| 11,423,844 | B2 | 8/2022 | Ikeda et al. |
| 2003/0112204 | A1 | 6/2003 | Pettersen |
| 2006/0214898 | A1* | 9/2006 | Woo .................... G09G 3/3688 345/90 |
| 2007/0013573 | A1 | 1/2007 | Hashimoto |
| 2017/0025098 | A1 | 1/2017 | Keramidas et al. |
| 2018/0211579 | A1 | 7/2018 | Bae et al. |
| 2018/0315390 | A1* | 11/2018 | Kong .................... G09G 3/3688 |

FOREIGN PATENT DOCUMENTS

| | | |
|---|---|---|
| JP | 2007-047728 A | 2/2007 |
| JP | 2009-008891 A | 1/2009 |
| JP | 2010-015125 A | 1/2010 |
| KR | 2006-0101970 A | 9/2006 |
| KR | 2018-0087644 A | 8/2018 |
| TW | 200634714 | 10/2006 |
| WO | WO-2019/220278 | 11/2019 |

OTHER PUBLICATIONS

Written Opinion (Application No. PCT/IB2022/054713) Dated Aug. 16, 2022.

* cited by examiner

FIG. 1A
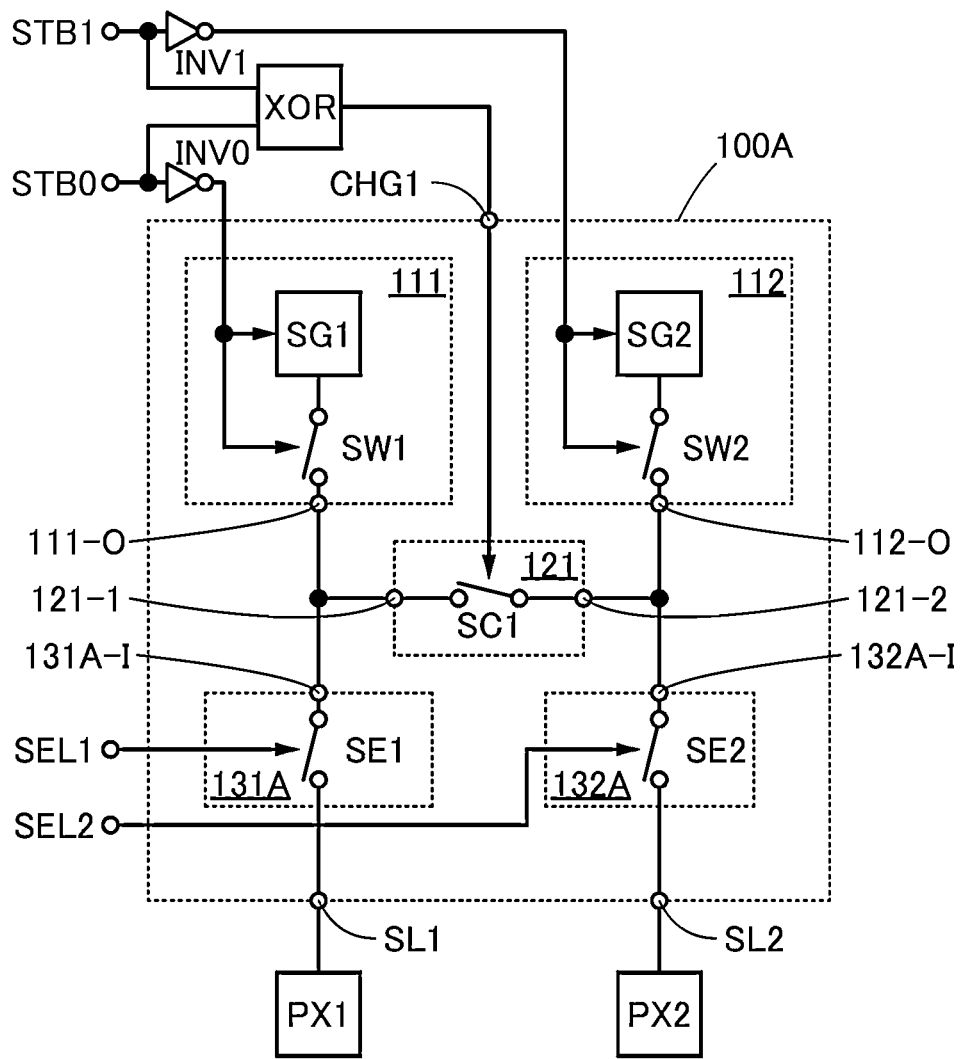
FIG. 1B
SW1,SW2,SC1
FIG. 1C
SG1,SG2
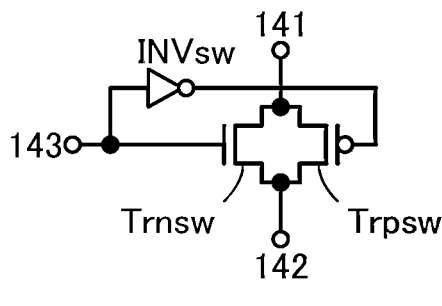
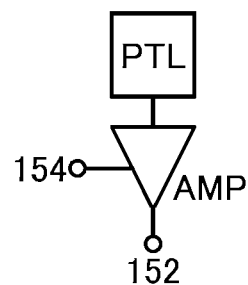

FIG. 27A
| Amorphous | Crystalline | Crystal |
|---|---|---|
| •completely amorphous | •CAAC<br>•nc<br>•CAC<br>excluding single crystal and poly crystal | •single crystal<br>•poly crystal |
Intermediate state
New crystalline phase
FIG. 27B
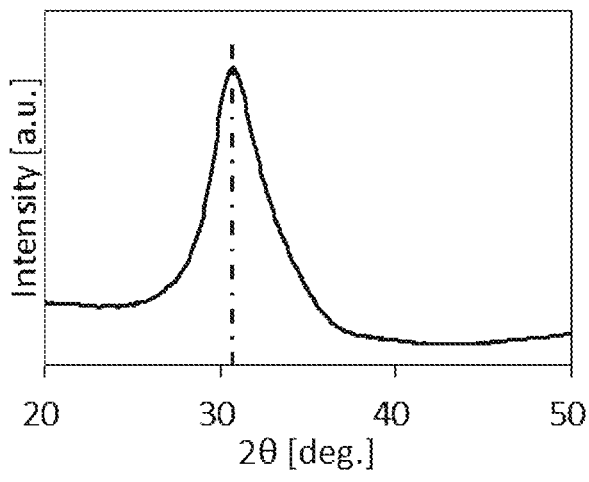
FIG. 27C
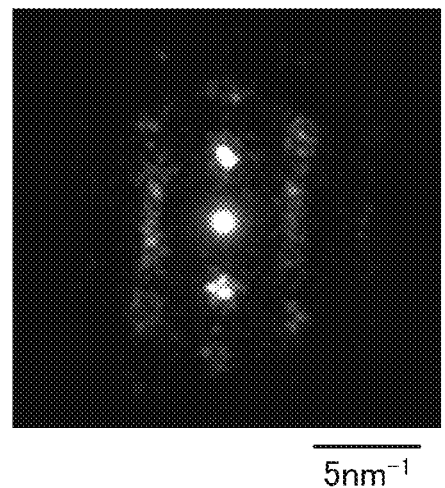

FIG. 29A
FIG. 29B
FIG. 29C
FIG. 29D
FIG. 29E
FIG. 29F
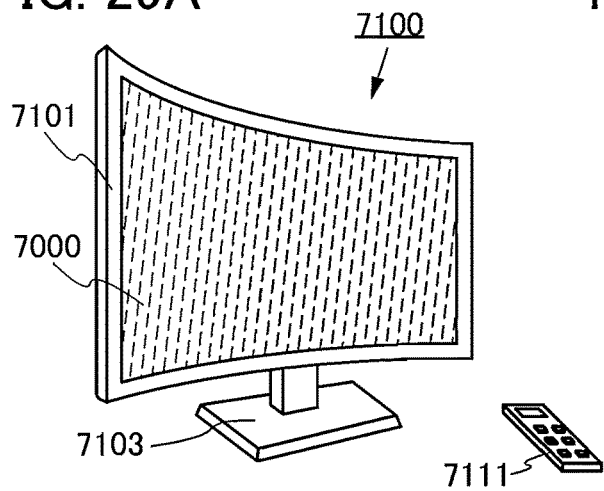
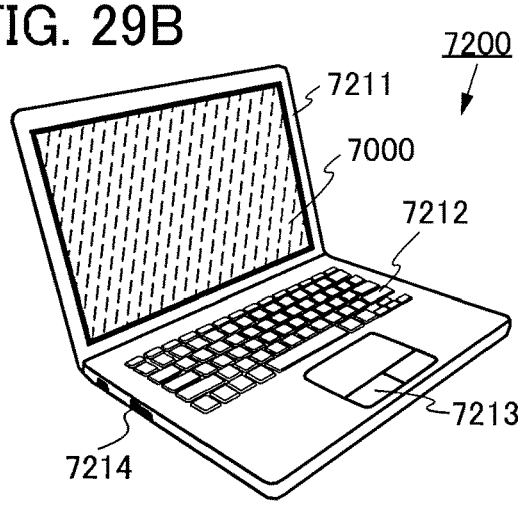
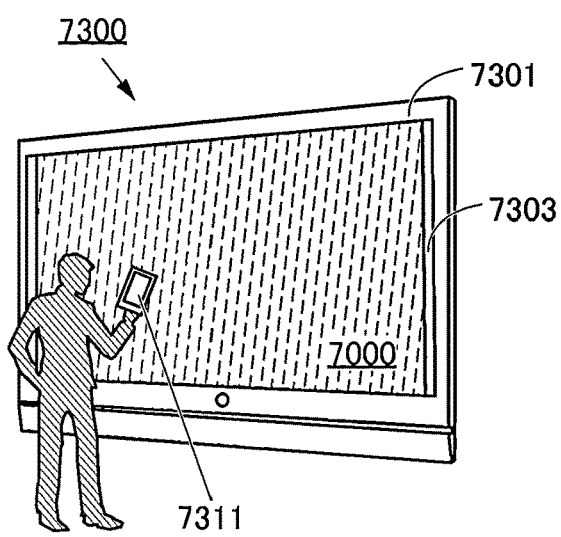
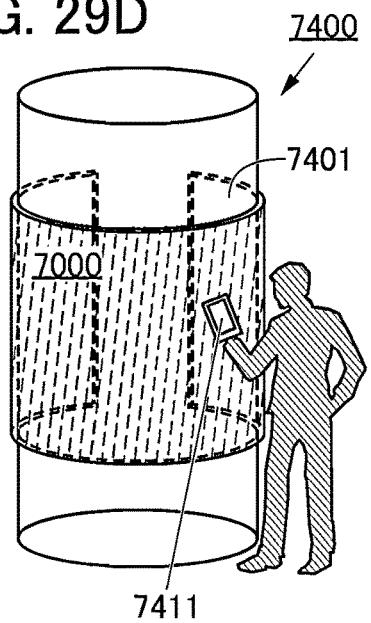
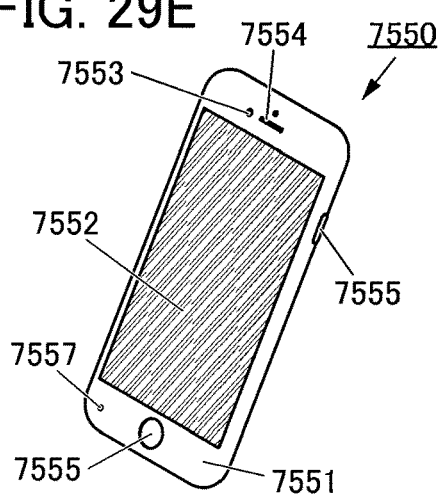
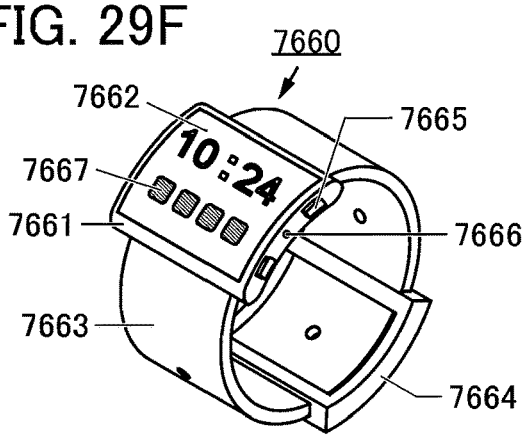

SEMICONDUCTOR DEVICE, DISPLAY APPARATUS, AND ELECTRONIC DEVICE

TECHNICAL FIELD

One embodiment of the present invention relates to a semiconductor device, a display apparatus, and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display apparatus, a liquid crystal display apparatus, a light-emitting device, a power storage device, an imaging device, a memory device, a signal processing device, a processor, an electronic device, a system, a driving method thereof, a manufacturing method thereof, and a testing method thereof.

BACKGROUND ART

For example, display apparatuses applicable for XR such as VR (virtual reality) and AR (augmented reality) have been required. Specifically, such display apparatuses have been desired to have a high definition, high color reproducibility, and the like so as to offer enhanced realistic feeling and an enhanced sense of immersion, for example.

Examples of devices applicable to such display apparatuses include a liquid crystal display apparatus and a light-emitting apparatus including a light-emitting device such as organic EL (Electro Luminescence) or a light-emitting diode (LED). Patent Document 1 discloses a high-definition display apparatus with a large number of pixels, which includes a light-emitting device containing organic EL.

REFERENCE

Patent Document

[Patent Document 1] PCT International Publication No. 2019/220278

SUMMARY OF THE INVENTION

Problems to be Solved by the Invention

As described above, a display apparatus having high display quality is required for XR equipment. The display apparatus used in the XR equipment needs to have high resolution so as to offer an enhanced sense of reality and an enhanced sense of immersion. In that case, designing a smaller pitch width between pixels, wirings, or the like or a smaller pixel size in a predetermined size, for example, can increase the number of pixels provided in the size in the display apparatus. Note that when the number of pixels in the display apparatus is large, the amount of data per frame is increased; therefore, the speed of a driver circuit (e.g., a source driver circuit or a gate driver circuit) that drives the display apparatus is required to be increased.

In the case where the resolution of the display apparatus is increased, the number of pixels included in the display apparatus is increased, which increases the scale of a driver circuit for driving the display apparatus. Thus, in a display apparatus included in a device for XR equipment, the circuit area of the driver circuit is preferably small. For decreasing the circuit area of the driver circuit, a means of reducing the size of a circuit element such as a transistor is given, for example. However, in the case where the size of the circuit element is reduced, variations in characteristics of the circuit elements might occur. As a result of this, there is a possibility that the driver circuit does not operate as appropriate (a malfunction might occur in the driver circuit).

An object of one embodiment of the present invention is to provide a semiconductor device with low power consumption. Another object of one embodiment of the present invention is to provide a semiconductor device with a driver circuit having redundancy. Another object of one embodiment of the present invention is to provide a semiconductor device with a high yield. Another object of one embodiment of the present invention is to provide a novel semiconductor device. Another object of one embodiment of the present invention is to provide a display apparatus including one or more of the above semiconductor devices. Another object of one embodiment of the present invention is to provide a display apparatus having high display quality. Another object of one embodiment of the present invention is to provide an electronic device including any of the above display apparatuses.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all of the objects listed above and the other objects.

Means for Solving the Problems (1)

One embodiment of the present invention is a semiconductor device including a first driver circuit, a second driver circuit, a first selection circuit, a second selection circuit, and a switch circuit. The first driver circuit includes a first output terminal; the second driver circuit includes a second output terminal; the first selection circuit includes an input terminal and an output terminal; the second selection circuit includes an input terminal and an output terminal; the switch circuit includes a first terminal and a second terminal; the first output terminal is electrically connected to the input terminal of the first selection circuit and the first terminal; the second output terminal is electrically connected to the input terminal of the second selection circuit and the second terminal; the first driver circuit has a function of generating a first data signal and outputting the first data signal to the first output terminal; the second driver circuit has a function of generating a second data signal and outputting the second data signal to the second output terminal; the first selection circuit has a function of establishing one of electrical continuity and electrical discontinuity between the input terminal of the first selection circuit and the output terminal of the first selection circuit; the second selection circuit has a function of establishing one of electrical continuity and electrical discontinuity between the input terminal of the second selection circuit and the output terminal of the second selection circuit; and the switch circuit has a function of establishing one of electrical continuity and electrical discontinuity between the first terminal and the second terminal.

(2)

The semiconductor device in the above (1) preferably includes a function of operating in a first mode, a second mode, and a third mode. In the first mode, one of electrical continuity and electrical discontinuity is established between the input terminal of the first selection circuit and the output terminal of the first selection circuit; the other of electrical continuity and electrical discontinuity is established between the input terminal of the second selection circuit and the output terminal of the second selection circuit; electrical continuity is established between the first terminal and the second terminal; the first data signal is output to one of the output terminal of the first selection circuit and the output terminal of the second selection circuit through the output terminal of the first driver circuit; and the second data signal is not output to the output terminal of the second driver circuit. In the second mode, one of electrical continuity and electrical discontinuity is established between the input terminal of the first selection circuit and the output terminal of the first selection circuit; the other of electrical continuity and electrical discontinuity is established between the input terminal of the second selection circuit and the output terminal of the second selection circuit; electrical continuity is established between the first terminal and the second terminal; the first data signal is not output to the output terminal of the first driver circuit; and the second data signal is output to one of the output terminal of the first selection circuit and the output terminal of the second selection circuit through the output terminal of the second driver circuit. In the third mode; electrical continuity is established between the input terminal of the first selection circuit and the output terminal of the first selection circuit; electrical continuity is established between the input terminal of the second selection circuit and the output terminal of the second selection circuit; electrical discontinuity is established between the first terminal and the second terminal; the first data signal is output to the output terminal of the first selection circuit through the output terminal of the first driver circuit, and the second data signal is output to the output terminal of the second selection circuit through the output terminal of the second driver circuit.

(3)

In the semiconductor device of the above (1) or the above (2), preferably, the first driver circuit includes a first signal generation circuit and a first switch; the second driver circuit includes a second signal generation circuit and a second switch; the switch circuit includes a third switch; an output terminal of the first signal generation circuit is electrically connected to a first terminal of the first switch; a second terminal of the first switch is electrically connected to an output terminal of the first driver circuit; an output terminal of the second signal generation circuit is electrically connected to a first terminal of the second switch; a second terminal of the second switch is electrically connected to the output terminal of the second driver circuit; a first terminal of the third switch is electrically connected to the first terminal; a second terminal of the third switch is electrically connected to the second terminal; the first signal generation circuit has a function of generating the first data signal; and the second signal generation circuit has a function of generating the second data signal.

(4)

In the semiconductor device in the above (3), the first switch, the second switch, and the third switch are preferably each an analog switch.

(5)

A display apparatus includes the semiconductor device in any one of the above (1) to the above (4), a first pixel circuit and, a second pixel circuit. The first pixel circuit is electrically connected to the output terminal of the first selection circuit, and the second pixel circuit is electrically connected to the output terminal of the second selection circuit.

(6)

Another embodiment of the present invention is a semiconductor device including a first driver circuit, a second driver circuit, a first selection circuit, a second selection circuit, and a switch circuit. The first driver circuit includes a first output terminal; the second driver circuit includes a second output terminal; the first selection circuit includes an input terminal and a plurality of output terminals; the second selection circuit includes an input terminal and a plurality of output terminals; the switch circuit includes a first terminal and a second terminal; the first output terminal is electrically connected to the input terminal of the first selection circuit and the first terminal; the second output terminal is electrically connected to the input terminal of the second selection circuit and the second terminal; the first driver circuit has a function of generating a first data signal and outputting the first data signal to the first output terminal; the second driver circuit has a function of generating a second data signal and outputting the second data signal to the second output terminal; the first selection circuit has a function of establishing electrical continuity between the input terminal of the first selection circuit and at least one of the plurality of output terminals of the first selection circuit and electrical discontinuity between the input terminal of the first selection circuit and the others of the plurality of output terminals of the first selection circuit; the second selection circuit has a function of establishing electrical continuity between the input terminal of the second selection circuit and at least one of the plurality of output terminals of the second selection circuit and electrical discontinuity between the input terminal of the second selection circuit and the others of the plurality of output terminals of the second selection circuit, and the switch circuit has a function of establishing one of electrical continuity and electrical discontinuity between the first terminal and the second terminal.

(7)

The semiconductor device in the above (6) preferably has a function of operating a first mode, a second mode, and a third mode. In the first mode, electrical continuity is established between the input terminal of the first selection circuit and the one terminal of the plurality of output terminals of the first selection circuit or between the input terminal of the second selection circuit and the one terminal of the plurality of output terminals of the second selection circuit; electrical discontinuity is established between the input terminal of the first selection circuit and the others of the plurality of output terminals of the first selection circuit and between the input terminal of the second selection circuit and the others of the plurality of output terminals of the second selection circuit; electrical continuity is established between the first terminal and the second terminal; the first data signal is output to any one of the plurality of output terminals of the first selection circuit or any one of the plurality of output terminals of the second selection circuit through the output terminal of the first driver circuit; and the second data signal is not output to the output terminal of the second driver circuit. In the second mode, electrical continuity is established between the input terminal of the first selection circuit and the one terminal of the plurality of output terminals of the first selection circuit or between the input terminal of the second selection circuit and the one terminal of the plurality of output terminals of the second selection circuit; electrical discontinuity is established between the input terminal of the first selection circuit and the others of the plurality of output terminals of the first selection circuit or between the input terminal of the second selection circuit and the others of the plurality of output terminals of the second selection circuit; electrical continuity is established between the first terminal and the second terminal; the first data signal is not output to the output terminal of the first driver circuit; and the second data signal is output to any one of the plurality of output terminals of the first selection circuit or any one of the plurality of output terminals of the second selection circuit through the output terminal of the second driver circuit. In the third mode, electrical continuity is established between the input terminal of the first selection circuit and the one terminal of the plurality of output terminals of the first selection circuit and electrical discontinuity is established between the input terminal of the first selection circuit and the others of the plurality of output terminals of the first selection circuit; electrical continuity is established between the input terminal of the second selection circuit and the one terminal of the plurality of output terminals of the second selection circuit and electrical discontinuity is established between the input terminal of the second selection circuit and the others of the plurality of output terminals of the second selection circuit; electrical discontinuity is established between the first terminal and the second terminal; the first data signal is output to any one of the plurality of output terminals of the first selection circuit through the output terminal of the first driver circuit; and the second data signal is output to any one of the plurality of output terminals of the second selection circuit through the output terminal of the second driver circuit.

(8)

In the semiconductor device in the above (6) or the above (7), preferably, the first driver circuit includes a first signal generation circuit and a first switch; the second driver circuit includes a second signal generation circuit and a second switch; the switch circuit includes a third switch; an output terminal of the first signal generation circuit is electrically connected to a first terminal of the first switch; a second terminal of the first switch is electrically connected to an output terminal of the first driver circuit; an output terminal of the second signal generation circuit is electrically connected to a first terminal of the second switch; a second terminal of the second switch is electrically connected to an output terminal of the second driver circuit; a first terminal of the third switch is electrically connected to the first terminal; a second terminal of the third switch is electrically connected to the second terminal; the first signal generation circuit has a function of generating the first data signal, and the second signal generation circuit has a function of generating the second data signal.

(9)

In the semiconductor device in the above (8), the first switch, the second switch, and the third switch are preferably each an analog switch.

(10)

A display apparatus includes the semiconductor device in any one of the above (6) to the above (9), a first pixel circuit and, a second pixel circuit. The first pixel circuit is electrically connected to at least one of the plurality of output terminals of the first selection circuit, and the second pixel circuit is electrically connected to at least one of the plurality of output terminals of the second selection circuit.

(11)

A display apparatus includes the semiconductor device in any one of the above (6) to the above (9), a first pixel circuit and, a second pixel circuit. The first pixel circuit is electrically connected to all of the plurality of output terminals of the first selection circuit, and the second pixel circuit is electrically connected to all of the plurality of output terminals of the second selection circuit.

(12)

An electronic device includes the display apparatus described in the above (5), the above (10), or the above (11) and a housing.

Note that in this specification and the like, a semiconductor device refers to, for example, a device that utilizes semiconductor characteristics, and means a circuit including a semiconductor element (e.g., a transistor, a diode, a photodiode, or the like), a device including the circuit, or the like. The semiconductor device also means all devices that can function by utilizing semiconductor characteristics. For example, an integrated circuit, a chip including an integrated circuit, and an electronic component including a chip in a package or the like are examples of the semiconductor device. Moreover, for example, a memory device, a display apparatus, a light-emitting apparatus, a lighting device, an electronic device, and the like themselves are semiconductor devices or include semiconductor devices in some cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, a load, or the like) can be connected between X and Y. Note that a switch has a function of being controlled to be in an on state or an off state. That is, the switch has a function of being in a conducting state (on state) or a non-conducting state (off state) to control whether current flows or not.

For example, in the case where X and Y are functionally connected, one or more circuits that allow functional connection between X and Y (e.g., a logic circuit (e.g., an inverter, a NAND circuit, or a NOR circuit); a signal converter circuit (e.g., a digital-analog converter circuit, an analog-digital converter circuit, or a gamma correction circuit); a potential level converter circuit (e.g., a power supply circuit (e.g., a step-up circuit and a step-down circuit) or a level shifter circuit for changing the potential level of a signal); a voltage source; a current source; a switch circuit; an amplifier circuit (e.g., a circuit that can increase signal amplitude, the current amount, or the like, an operational amplifier, a differential amplifier circuit, a source follower circuit, or a buffer circuit); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween) and the case where X and Y are directly connected (i.e., the case where X and Y are connected without another element or another circuit provided therebetween).

It can be expressed as, for example, "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components that are a wiring and an electrode. Thus, electrical connection in this specification includes, in its category, such a case where one conductive film has functions of a plurality of components.

In this specification and the like, a "resistor" can be, for example, a circuit element, a wiring, or the like having a resistance value higher than 0Ω. Therefore, in this specification and the like, examples of the "resistor" include a wiring having a resistance value, a transistor in which current flows between its source and drain, a diode, and a coil. Thus, for example, the term "resistor element" can be sometimes replaced with the terms "resistor", "load", or "region having a resistance"; conversely, the terms "resistor", "load", or "region having a resistance" can be sometimes replaced with the term "resistor element" or the like. The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance value may be higher than or equal to 1 (2 and lower than or equal to $1 \times 10^9 \Omega$.

In this specification and the like, a "capacitor" can be, for example, a circuit element having an electrostatic capacitance value higher than 0 F, a region of a wiring having an electrostatic capacitance value higher than 0 F, parasitic capacitance, gate capacitance of a transistor, or the like. For example, the terms "capacitor", "parasitic capacitance", "gate capacitance", or the like can be replaced with e.g., the term "capacitance" or the like in some cases. Conversely, for example, the term "capacitance" can be replaced with the terms "capacitor", "parasitic capacitance", "gate capacitance", or the like in some cases. The term "pair of electrodes" of "capacitor" can be replaced with "pair of conductors", "pair of conductive regions", or "pair of regions", for example. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In this specification and the like, a transistor includes three terminals called a gate, a source, and a drain. The gate is a control terminal for controlling the conducting state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can be sometimes replaced with each other in this specification and the like. In this specification and the like, expressions "one of a source and a drain" (or a first electrode or a first terminal) or "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like, for example.

In this specification and the like, for example, a transistor with a multi-gate structure having two or more gate electrodes can be used as the transistor. In a transistor having the multi-gate structure, channel formation regions are connected in series; accordingly, a plurality of transistors are connected in series. Thus, in the transistor having the multi-gate structure, the amount of off-state current can be reduced, and the withstand voltage of the transistor can be increased (the reliability can be improved). Alternatively, in the transistor having the multi-gate structure, drain-source current does not change very much even if drain-source voltage changes at the time of operation in a saturation region, so that a flat slope of voltage-current characteristics can be obtained. The transistor having the flat slope of the voltage-current characteristics can achieve an ideal current source circuit or an active load having an extremely high resistance value. As a result, the transistor having the flat slope of the voltage-current characteristics can achieve, for example, a differential circuit, a current mirror circuit, or the like having high characteristics.

In this specification and the like, the case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. As another example, the case where a single capacitor is illustrated in a circuit diagram may indicate a case where two or more capacitors are electrically connected to each other in parallel. As another example, the case where a single transistor is illustrated in a circuit diagram may indicate a case where two or more transistors are electrically connected to each other in series and their gates are electrically connected to each other. Similarly, as another example, the case where a single switch is illustrated in a circuit diagram may indicate a case where the switch includes two or more transistors which are electrically connected to each other in series or in parallel and whose gates are electrically connected to each other.

In this specification and the like, for example, "node" can be referred to as a terminal, a wiring, an electrode, a conductive layer, a conductor, an impurity region, or the like depending on a circuit configuration, a device structure, or the like. Furthermore, a terminal or a wiring can be referred to as a node, for example.

In this specification and the like, "voltage" and "potential" can be replaced with each other as appropriate. The term "voltage" refers to a potential difference from a reference potential. When the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, are changed with a change of the reference potential, for example.

In this specification and the like, the term "high-level potential" or "low-level potential" does not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

In this specification and the like, "current" means a charge transfer (electrical conduction). For example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion. The type of carrier differs between current flow systems (e.g., a semiconductor, a metal, an electrolyte solution, and a vacuum). The "direction of current" in a wiring or the like refers to, for example, the direction in which a carrier with a positive charge moves, and the amount of current is expressed as a positive value. In other words, the direction in which a carrier with a negative charge moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", or "third" in this specification and the like are used to avoid confusion among components. Thus, the ordinal numbers do not limit the number of components. In addition, the ordinal numbers do not limit the order of components. In this specification and the like, for example, a "first" component in one embodiment can be referred to as a "second" component in other embodiments or the scope of claims. Furthermore, in this specification and the like, for example, a "first" component in one embodiment can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction in which the components are described. Thus, the positional relation is not limited to the terms described in this specification and the like, and can be described with another term as appropriate depending on the situation. For example, the expression "an insulator positioned over (on) the top surface of a conductor" can be replaced with the expression "an insulator positioned under (on) a bottom surface of a conductor" when the direction of a drawing showing these components is rotated by 180°.

Furthermore, the term "over" or "under" does not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, components arranged in a matrix and their positional relation are sometimes described using a term such as "row" or "column", for example. The positional relation between components is changed as appropriate in accordance with the direction in which the components are described. Thus, the positional relation is not limited to the term such as "row" or "column" described in this specification and the like, and can be described with another term as appropriate depending on the situation. For example, the term "row direction" can be replaced with the term "column direction" when the direction of the diagram is rotated by 90°.

In this specification and the like, the term "film", "layer", or the like can be interchanged with each other depending on the situation in some cases. For example, the term "conductive layer" can be changed into the term "conductive film" in some cases. Also, for example, the term "insulating film" can be changed into the term "insulating layer" in some cases. In addition, for example, the term "film", "layer", or the like can be interchanged with another term depending on the situation in some cases, without using the term "film", "layer", or the like. For example, the term "conductive layer" or "conductive film" can be changed into the term "conductor" in some cases. Furthermore, for example, the term "insulating layer" or "insulating film" can be changed into the term "insulator" in some cases.

In this specification and the like, for example, the term "electrode", "wiring", "terminal", or the like does not limit the function of a component. For example, an "electrode" is used as part of a "wiring" in some cases, and vice versa. Furthermore, the term "electrode" or "wiring" also includes, for example, the case where a plurality of "electrodes" or "wirings" are formed in an integrated manner. For example, a "terminal" is used as part of a "wiring" or an "electrode" in some cases, and vice versa. Furthermore, the term "terminal" also includes the case where a plurality of "electrodes", "wirings" or "terminals" are formed in an integrated manner, for example. Therefore, for example, an "electrode" can be part of a "wiring" or a "terminal". In addition, for example, a "terminal" can be part of a "wiring" or an "electrode". Moreover, the terms "electrode", "wiring", "terminal", and the like are sometimes replaced with the term "region" or the like depending on the case.

In this specification and the like, for example, the terms "wiring", "signal line", "power supply line", and the like can be interchanged with each other depending on the situation in some cases. For example, the term "wiring" can be changed into the term "signal line" in some cases. For another example, the term "wiring" can be changed into the term "power supply line" or the like in some cases. Conversely, the term "signal line", "power supply line", or the like can be changed into the term "wiring" in some cases, for example. For example, the term "power supply line" or the like can be changed into the term "signal line" or the like in some cases. Conversely, the term "signal line" or the like can be changed into the term "power supply line" or the like in some cases, for example. Moreover, the term "potential" that is applied to a wiring can be sometimes changed into the term such as "signal" depending on the situation, for example. Conversely, the term "signal" or the like can be changed into the term "potential" in some cases, for example.

In this specification and the like, an impurity in a semiconductor refers to, for example, an element other than a main component of a semiconductor layer. For example, an element with a concentration of lower than 0.1 atomic % is an impurity. When an impurity is contained in a semiconductor, for example, the density of defect states in a semiconductor is increased, carrier mobility is decreased, or crystallinity is decreased in some cases. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor. Specific examples include hydrogen (included in water), lithium, sodium, silicon, boron, phosphorus, carbon, and nitrogen. In addition, in the case where the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conducting state (on state) or a non-conducting state (off state) to determine whether current flows or not. Alternatively, a switch has a function of selecting and changing a current path. Thus, a switch may have two terminals or three or more terminals through which current flows, in addition to a control terminal. Examples of the switch that can be used are an electrical switch, a mechanical switch, and the like. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conducting state" of the transistor refers to a state where a source electrode and a drain electrode of the transistor can be regarded as being electrically short-circuited or a state where current can be made to flow between the source electrode and the drain electrode. Furthermore, a "non-conducting state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conducting and non-conducting states with movement of the electrode.

In this specification and the like, a structure where light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Structures of light-emitting devices can be classified roughly into a single structure and a tandem structure. A light-emitting device having a single structure includes one light-emitting unit between a pair of electrodes. The light-emitting unit preferably includes one or more light-emitting layers. To obtain white light emission by using two light-emitting layers in the light-emitting unit, two light-emitting layers are selected such that the light-emitting layers emit light of complementary colors. For example, when emission colors of a first light-emitting layer and a second light-emitting layer are complementary colors, the light-emitting device can be configured to emit white light as a whole. To obtain white light emission by using three or more light-emitting layers in the light-emitting unit, the light-emitting device is configured to emit white light as a whole by combining emission colors of the three or more light-emitting layers.

A light-emitting device with a tandem structure includes two or more light-emitting units between a pair of electrodes. Each light-emitting unit preferably includes one or more light-emitting layers. To obtain white light emission, the light-emitting device with a tandem structure may have a structure in which light from light-emitting layers of a plurality of light-emitting units can be combined to be white light. Note that a structure for obtaining white light emission is similar to that in the case of a single structure. In the device having a tandem structure, an intermediate layer such as a charge-generation layer is suitably provided between the plurality of light-emitting units, for example.

When the white-light-emitting device (having a single structure or a tandem structure) and a light-emitting device having an SBS structure are compared to each other, the light-emitting device having an SBS structure can have lower power consumption than the white-light-emitting device. In a light-emitting device of one embodiment of the present invention, a light-emitting device having an SBS structure is preferably used for reduction of power consumption. Meanwhile, a manufacturing process of the white-light-emitting device is simpler than that of a light-emitting device having an SBS structure. A display apparatus of one embodiment of the present invention can lower manufacturing cost or increase manufacturing yield by utilizing the white-light-emitting device appropriately.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Effect of the Invention

According to another embodiment of the present invention, a semiconductor device with reduced power consumption can be provided. According to another embodiment of the present invention, a semiconductor device with a driver circuit having redundancy can be provided. According to another embodiment of the present invention, a semiconductor device with a high yield can be provided. According to one embodiment of the present invention, a novel semiconductor device can be provided. According to another embodiment of the present invention, a display apparatus including one or more of the above semiconductor devices can be provided. According to another embodiment of the present invention, a display apparatus having high display quality can be provided. According to another embodiment of the present invention, an electronic device including any of the above display apparatuses can be provided.

Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted as appropriate from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 1A to FIG. 1C are diagrams illustrating a structure example of a semiconductor device.

FIG. 27A is a diagram showing classification of crystal structures of IGZO. FIG. 27B is a diagram showing an XRD spectrum of a CAAC-IGZO film. FIG. 27C is a diagram showing a nanobeam electron diffraction pattern of the CAAC-IGZO film.

FIG. 29A to FIG. 29F are diagrams illustrating examples of electronic devices.

MODE FOR CARRYING OUT THE INVENTION

Figure 2A:
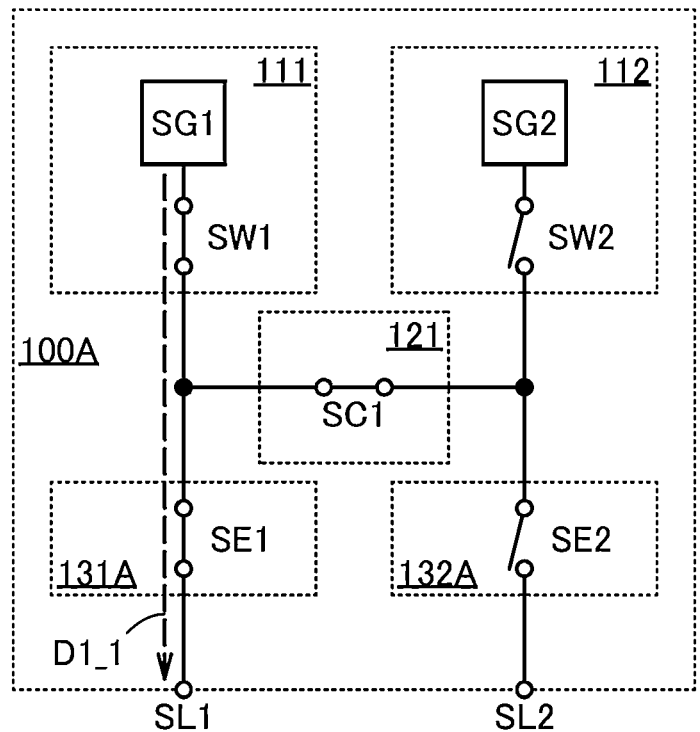
FIG. 2A and FIG. 2B are diagrams illustrating operation examples of a semiconductor device.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like, for example. For example, in the case where a metal oxide is included in a channel formation region of a transistor, the metal oxide is referred to as an oxide semiconductor in some cases. That is, when a metal oxide is used as a material that can be used for a channel formation region of a transistor that has at least one of an amplifying function, a rectifying function, and a switching function, the metal oxide can be referred to as a metal oxide semiconductor. In addition, the term OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined with each other as appropriate.

Note that a content (or part of the content) described in one embodiment can be applied to, combined with, or replaced with at least one of another content (or part of the content) in the embodiment and a content (or part of the content) described in one or a plurality of different embodiments, for example.

Note that in each embodiment, content described in the embodiment is content described using a variety of diagrams or content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. However, embodiments can be implemented with various modes. Thus, it is easily understood by those skilled in the art that the modes and details of the present invention can be easily modified in various ways without departing from the spirit and scope of the present invention. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings, for example.

In this specification and the like, when a plurality of components are denoted with the same reference numerals, and in particular need to be distinguished from each other, an identification sign such as "_1", "[n]", or "[m,n]" is sometimes added to the reference numerals, for example. Components denoted with identification signs such as "_1", "[n]", and "[m,n]" in the drawings and the like are sometimes denoted without such identification signs in this specification and the like when the components do not need to be distinguished from each other, for example.

In the drawings in this specification, the size, the layer thickness, or the region is exaggerated for clarity in some cases. Therefore, the drawings are not necessarily limited to the illustrated scale. The drawings are schematic views showing ideal examples, and shapes, values, or the like shown in the drawings are not limiting, for example. For example, variation in signal, voltage, or current due to noise, variation in signal, voltage, or current due to difference in timing, or the like can be included.

In this specification and the like, the term "electrode", "wiring", "terminal", or the like does not limit the function of a component. For example, an "electrode" is used as part of a "wiring" in some cases, and vice versa. Furthermore, the term "electrode" or "wiring" also includes, for example, the case where a plurality of "electrodes" or "wirings" are formed in an integrated manner. For example, a "terminal" is used as part of a "wiring" or an "electrode" in some cases, and vice versa. Furthermore, the term "terminal" also includes, for example, the case where a plurality of "electrodes", "wirings", "terminals", or the like are formed in an integrated manner. Therefore, for example, an "electrode" can be part of a "wiring" or a "terminal". In addition, for example, "terminal" can be part of a "wiring" or an "electrode". Moreover, the terms "electrode", "wiring", "terminal", and the like are sometimes replaced with the term "region" or the like depending on the case.

Embodiment 1

In this embodiment, a semiconductor device of one embodiment of the present invention is described.

FIG. 1A is a block diagram illustrating the semiconductor device of one embodiment of the present invention. A circuit 100A in FIG. 1A includes a driver circuit 111, a driver circuit 112, a switch circuit 121, a selection circuit 131A, and a selection circuit 132A. An output terminal 111-O of the circuit 111 is electrically connected to an input terminal 131A-I of the selection circuit 131A. An output terminal 112-O of the driver circuit 112 is electrically connected to an input terminal 132A-I of the selection circuit 132A. A first terminal 121-1 of the switch circuit 121 is electrically connected to the input terminal 131A-I of the selection circuit 131A. A second terminal 121-2 of the switch circuit 121 is electrically connected to the input terminal 132A-I of the selection circuit 132A.

The driver circuit 111 includes a signal generation circuit SG1 and a switch SW1. The output terminal of the signal generation circuit SG1 is electrically connected to a first terminal of the switch SW1. A second terminal of the switch SW1 is electrically connected to the output terminal 111-O of the driver circuit 111. A control terminal of the switch SW1 is electrically connected to an output terminal of INV0 described later. The signal generation circuit SG1 has a function of generating a first data signal.

The driver circuit 112 includes a signal generation circuit SG2 and a switch SW2. The output terminal of the signal generation circuit SG2 is electrically connected to a first terminal of the switch SW2. A second terminal of the switch SW2 is electrically connected to the output terminal 112-O of the driver circuit 112. A control terminal of the switch SW2 is electrically connected to an output terminal of INV1 described later. The signal generation circuit SG2 has a function of generating a second data signal.

The switch circuit 121 includes a switch SC1. A first terminal of the switch SC1 is electrically connected to the first terminal 121-1 of the switch circuit 121. A second terminal of the switch SC1 is electrically connected to the second terminal 121-2 of the switch circuit 121. In FIG. 1A, a control terminal of the switch SC1 is electrically connected to a terminal CHG1.

An analog switch can be used as each of the switch SW1, the switch SW2, and the switch SC1, for example. Alternatively, one or more transistors may be used as each of the switch SW1, the switch SW2, and the switch SC1. A mechanical switch such as MEMS may be used as each of the switch SW1, the switch SW2, and the switch SC1. In this operation example, an analog switch is used as each of the switch SW1, the switch SW2, and the switch SC1. Each of the switch SW1, the switch SW2, and the switch SC1 is turned on when a high-level potential is applied to its control terminal, and is turned off when a low-level potential is applied to its control terminal.

Note that in the semiconductor device of one embodiment of the present invention, transistors including a variety of semiconductors can be used. For example, a transistor including a single crystal semiconductor, a polycrystalline semiconductor, a microcrystalline semiconductor, or an amorphous semiconductor in a channel formation region can be used in the semiconductor device of one embodiment of the present invention. Furthermore, the semiconductor is not limited to a single-element semiconductor including mainly a single element (e.g., silicon (Si) or germanium (Ge). As the semiconductor, a compound semiconductor (e.g., silicon germanium (SiGe) or gallium arsenide (GaAs)), an oxide semiconductor, or the like can be used.

FIG. 1B is a circuit diagram of an analog switch applicable to the switch SW1, the switch SW2, and the switch SC1. The analog switch included in FIG. 1B includes an n-channel transistor Trnsw, a p-channel transistor Trpsw, and an inverter INVsw. In the analog switch, electrical continuity is established between a terminal 141 and a terminal 142 when a high-level potential is supplied to a terminal 143, for example. For example, supply of a low-level potential to the terminal 143 establishes electrical discontinuity between the terminal 141 and the terminal 142. For example, the first terminals of the switch SW1, the switch SW2, and the switch SC1 each correspond to the terminal 141 illustrated in FIG. 1B. The second terminals of the switch SW1, the switch SW2, and the switch SC1 each correspond to the terminal 142 in FIG. 1B, for example. In addition, the control terminals of the switch SW1, the switch SW2, and the switch SC1 each correspond to the terminal 143 in FIG. 1B, for example.

Note that the values of the high-level potential and the low-level potential are preferably set such that the potential difference between the high-level potential and the low-level potential is larger than each of the threshold voltages of the n-channel transistor Trnsw and the p-channel transistor Trpsw.

The potential of a terminal STB0 is input to the driver circuit 111 through the inverter INV0. For example, a high-level potential is supplied to the terminal STB0 to put the signal generation circuit SG1 into a standby state and turn off the switch SW1. In addition, a low-level potential is supplied to the terminal STB0 to put the signal generation circuit SG1 into an active state and turn on the switch SW1.

The potential of the terminal STB1 is input to the driver circuit 112 through the inverter INV1. For example, when a high-level potential is supplied to the terminal STB1, the signal generation circuit SG2 is put into a standby state and the switch SW2 is turned off. In addition, when a low-level potential is supplied to the terminal STB1, the signal generation circuit SG2 is put into an active state and the switch SW2 is turned on.

The potential of the terminal CHG1 is input to the switch circuit 121. For example, a high-level potential is supplied to the terminal CHG1 to turn on the switch SC1. In addition, a low-level potential is supplied to the terminal CHG1 to turn off the switch SC1, for example.

Note that the potential of the terminal CHG1 can be set to a potential based on the potentials of the terminal STB0 and the terminal STB1. For example, a signal supplied to the terminal CHG1 can be a signal generated by exclusive or of a signal supplied to the terminal STB0 and a signal supplied to the terminal STB1. Thus, a circuit to perform an exclusive-or operation may be provided inside or outside the circuit 100A. FIG. 1A illustrates an example in which a circuit to perform an exclusive-or operation, XOR, is provided outside the circuit 100A.

FIG. 1C is a block diagram illustrating an example of the configuration of the signal generation circuit SG1 and the signal generation circuit SG2. The signal generation circuit in FIG. 1C includes a pass transistor logic circuit PTL and an amplifier AMP. The amplifier AMP includes a terminal 152 as an output terminal and a terminal 154 as a terminal for inputting a signal for controlling an operating state.

An output terminal of the pass transistor logic circuit PTL is electrically connected to an input terminal of the amplifier AMP.

The pass transistor logic circuit PTL has a function of converting a digital video data signal into an analog video data signal so as to be output to the output terminal of the pass transistor logic circuit PTL, for example.

The amplifier AMP has a function of amplifying an analog video data signal input to the input terminal of the amplifier AMP and outputting the signal to the terminal 152, for example.

The amplifier AMP has a function of controlling an operating state in accordance with a signal input to the terminal 154. For example, by supplying a high-level potential to the terminal 154, the amplifier AMP operates to activate a function of outputting the analog video data signal amplified in the amplifier AMP to the terminal 152. In addition, by supplying a low-level potential to the terminal 154, the amplifier AMP stops to deactivate a function of outputting a signal to the terminal 152. Thus, a steady current flowing through the amplifier AMP can be stopped.

In the operation of the driver circuit 111 and the driver circuit 112, each of the signal generation circuit SG1 and the signal generation circuit SG2 is placed in either an active state or a standby state in accordance with a potential input to the terminal 154, for example. The active state means, for example, that an analog video data signal is supplied to the terminal 152 by the amplifier AMP when a high-level potential is input to the terminal 154. The standby state means, for example, that the operation of the amplifier AMP is stopped to cut off the supply of an analog video data signal to the terminal 152 when a low-level potential is input to the terminal 154.

Example 1 of Selection Circuit Configuration

Note that the selection circuit in the semiconductor device of one embodiment of the present invention can include one or more switches. FIG. 1A illustrates an example in which each of the selection circuit 131A and the selection circuit 132A includes one switch.

The selection circuit 131A includes a switch SE1. The first terminal of the switch SE1 is electrically connected to the input terminal 131A-I of the selection circuit 131A. A second terminal of the switch SE1 is electrically connected to a terminal SL1. In FIG. 1A, a control terminal of the switch SE1 is electrically connected to a terminal SEL1.

The selection circuit 132A includes a switch SE2. A first terminal of the switch SE2 is electrically connected to the input terminal 132A-I of the selection circuit 132A. A second terminal of the switch SE2 is electrically connected to a terminal SL2. In FIG. 1A, a control terminal of the switch SE2 is electrically connected to a terminal SEL2.

The potential of the terminal SEL1 is input to the selection circuit 131A. For example, a high-level potential is supplied to the terminal SEL1, so that electrical continuity is established between the input terminal 131A-I of the selection circuit 131A and the terminal SL1. For example, a low-level potential is supplied to the terminal SEL1, so that electrical discontinuity is established between the input terminal 131A-I of the selection circuit 131A and the terminal SL1.

The potential of the terminal SEL2 is input to the selection circuit 132A. For example, a high-level potential is supplied to the terminal SEL2, so that electrical continuity is established between the terminal 132A-I of the selection circuit 132A and the terminal SL2. For example, a low-level potential is supplied to the terminal SEL2, so that electrical discontinuity is established between the terminal 132A-I of the selection circuit 132A and the terminal SL2.

As the switch SE1 and the switch SE2, a switch similar to the switch SW1, the switch SW2, and the switch SC1 described above can be used.

The circuit 100A may be electrically connected to the pixel circuit. FIG. 1A illustrates an example in which the circuit 100A is electrically connected to the pixel circuit PX1 and the pixel circuit PX2. The pixel circuit PX1 is electrically connected to the circuit 100A through the terminal SL1. The pixel circuit PX2 is electrically connected to the circuit 100A through the terminal SL2.

Configuration Example 1 of Operation Mode

The circuit 100A can operate in any of a plurality of modes to be switched depending on the situation. Examples of the plurality of modes include a normal operation mode, a redundant operation mode, and a high-speed operation mode.

The normal operation mode is a mode in which the first data signal generated by the signal generation circuit SG1 is supplied to either the terminal SL1 or the terminal SL2. The redundant operation mode is a mode in which the second data signal generated by the signal generation circuit SG2 is supplied to either the terminal SL1 or the terminal SL2. The high-operation operation mode is a mode in which the first data signal generated by the signal generation circuit SG1 is supplied to the terminal SL1 and the second data signal generated by the signal generation circuit SG2 is supplied to the terminal SL2.

Although not illustrated in FIG. 1A, the circuit in FIG. 1A may be configured in such a way that a logic circuit is provided outside the circuit 100A, and signals generated in the logic circuit are supplied to the terminal STB0 and the terminal STB1. Furthermore, the logic circuit preferably has a function of supplying potentials corresponding to each of the normal operation mode, the redundant operation mode, and the high-speed operation mode to the terminal STB0, the terminal STB1, and the terminal CHG1. Note that the logic circuit may change the mode to any one of the normal operation, the redundant operation mode, and the high-speed operation mode by changing setting parameters in the logic circuit, depending on the situation.

Next, the normal operation mode, the redundant operation mode, and the high-speed operation mode will each be described in detail.

Operation Example 1 of Normal Operation Mode

Figure 2B:
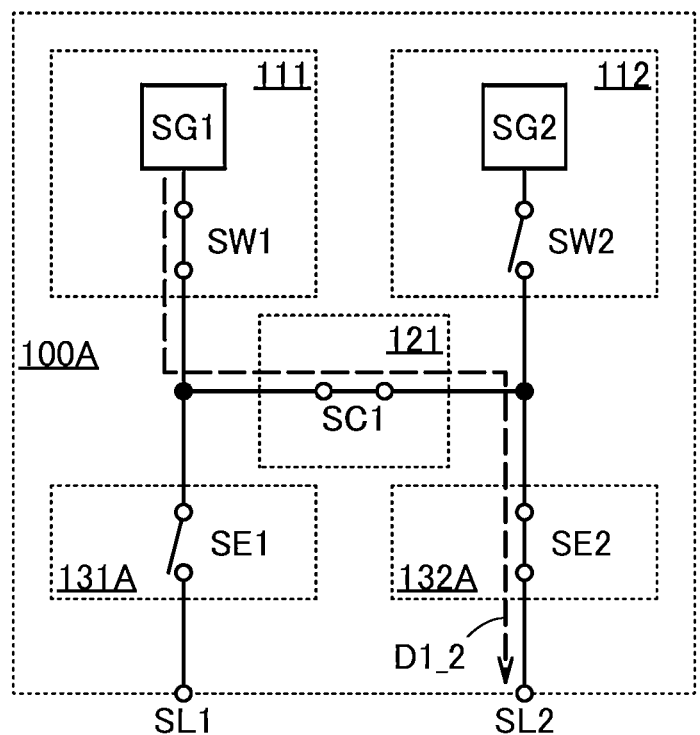

FIG. 2A and FIG. 2B are block diagrams for describing states of the switch SW1, the switch SW2, and the switch SC1, states of the switch SE1 and the switch SE2, and flow of a data signal generated by the signal generation circuit in the normal operation mode. Note that the flow of the data signal is denoted by a dashed arrow. In particular, FIG. 2A illustrates a driving state of the circuit 100A in the first period. FIG. 2B illustrates a driving state of the circuit 100A in the second period.

In the normal operation mode, a low-level potential is supplied to the terminal STB0 and a high-level potential is supplied to the terminal STB1. Thus, the switch SW1 is turned on, the switch SW2 is turned off, and the switch SC1 is turned on. When the signal generation circuit SG1 is put into an active state, the first data signal is supplied to the output terminal of the signal generation circuit SG1. In addition, when the signal generation circuit SG2 is put into a standby state, the supply of the data signal to the output terminal of the signal generation circuit SG2 is cut off.

Figure 3:
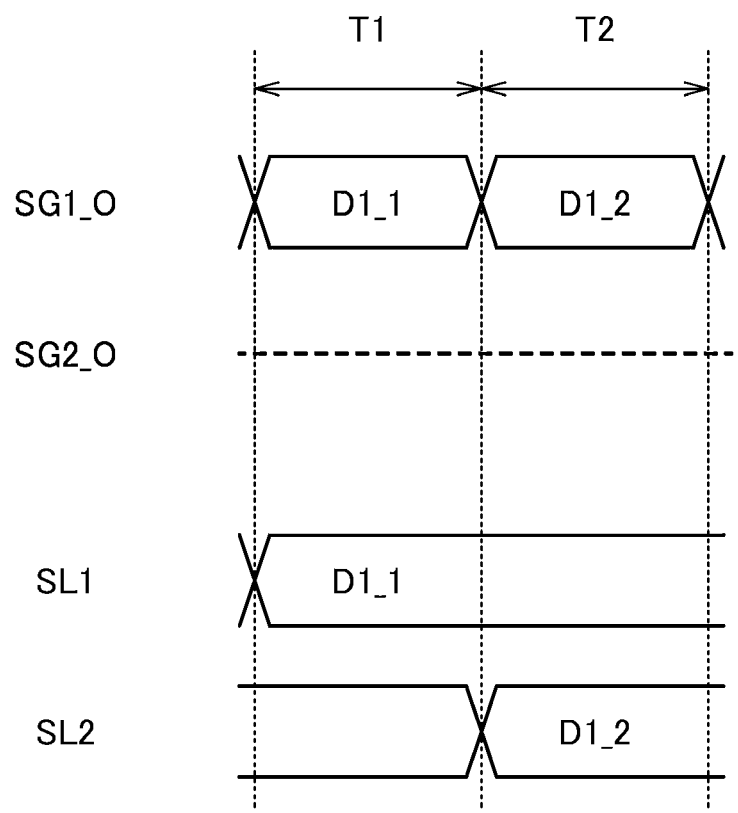
FIG. 3 is a diagram illustrating an operation example of a semiconductor device.

FIG. 3 is an example of a timing chart illustrating states of potentials supplied to the terminal SL1 and the terminal SL2 in the normal operation mode. Note that the timing chart in FIG. 3 shows the states of potentials in the first period in FIG. 2A as the period T1 and the states of potentials in the second period in FIG. 2B as the period T2. Potential states of the output terminals of the signal generation circuit SG1 and the signal generation circuit SG2 are denoted by SG1_O and SG2_O, respectively.

In FIG. 2A, FIG. 2B, and FIG. 3, the first data signal generated by the signal generation circuit SG1 in the first period is denoted by a data signal D1_1 and the first data signal generated by the signal generation circuit SG1 in the second period is denoted by a data signal D1_2. In the normal operation mode in FIG. 3, the potential state SG2_O of the output terminal of the signal generation circuit SG2 is shown by a dashed line since the supply of a data signal to the output terminal of the signal generation circuit SG2 is cut off.

In the normal operation mode, the first data signal generated by the signal generation circuit SG1 is supplied to either the terminal SL1 or the terminal SL2. For example, in the first period shown as the period T1 in FIG. 2A and FIG. 3, a high-level potential is supplied to the terminal SEL1 and a low-level potential is supplied to the terminal SEL2. Thus, the potential of the terminal SL2 is kept at a potential of the previous period, and the data signal D1_1 is supplied to the terminal SL1. In addition, in the second period shown as the period T2 in FIG. 2B and FIG. 3, the low-level potential is supplied to the terminal SEL1 and the high-level potential is supplied to the terminal SEL2. Thus, the potential of the terminal SL1 is kept at a potential of the previous period, and the data signal D1_2 is supplied to the terminal SL2.

In the circuit 100A in the normal operation mode, the signal generation circuit SG2 is put into a standby state, whereby the operation of the amplifier AMP of the signal generation circuit SG2 can be stopped. In this manner, the steady current of the amplifier AMP can be stopped in the circuit 100A. Furthermore, the semiconductor device of one embodiment of the present invention can have reduced power consumption.

Operation Example 1 of Redundant Operation Mode

Figure 4A:
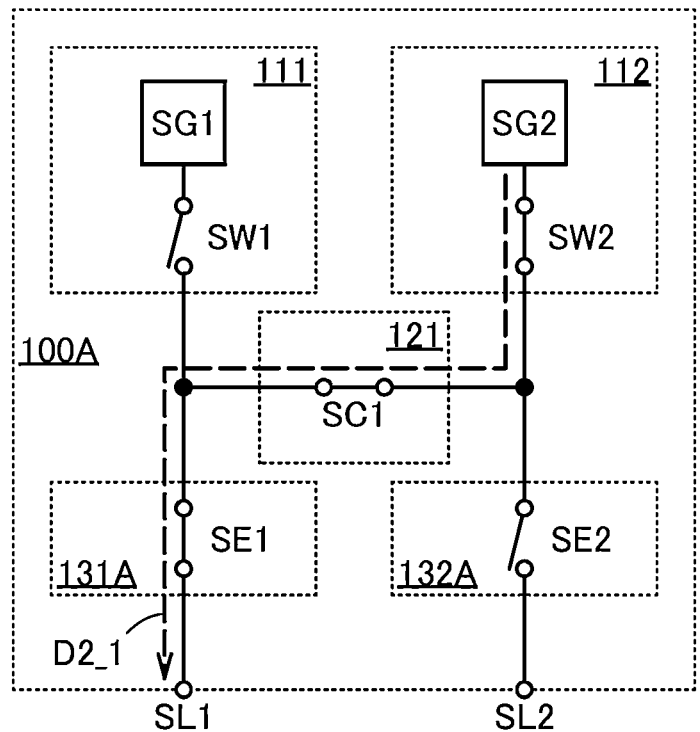
FIG. 4A and FIG. 4B are diagrams illustrating operation examples of a semiconductor device.
Figure 4B:
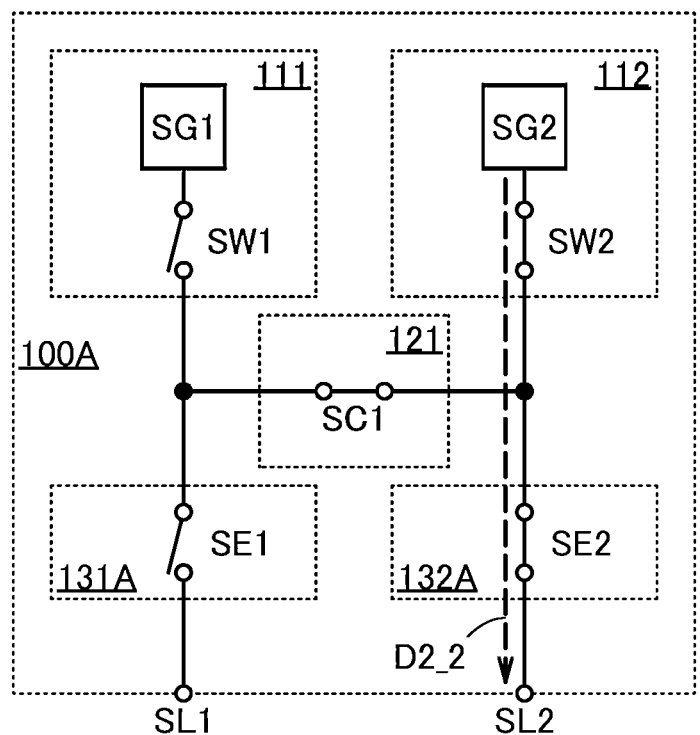

FIG. 4A and FIG. 4B are block diagrams illustrating states of the switch SW1, the switch SW2, and the switch SC1, states of the switch SE1 and the switch SE2, and flow of a data signal generated by the signal generation circuit in the redundant operation mode. Note that the flow of the data signal is denoted by a dashed arrow. In particular, FIG. 4A illustrates a driving state of the circuit 100A in the first period. FIG. 4B illustrates a driving state of the circuit 100A in the second period.

In the redundant operation mode, the high-level potential is supplied to the terminal STB0 and the low-level potential is supplied to the terminal STB1. Thus, the switch SW1 is turned off, the switch SW2 is turned on, and the switch SC1 is turned on. When the signal generation circuit SG1 is put into a standby state, the supply of data signal to the output terminal of the signal generation circuit SG1 is cut off. In addition, when the signal generation circuit SG2 is put into an active state, the second data signal is supplied to the output terminal of the signal generation circuit SG2.

Figure 5:
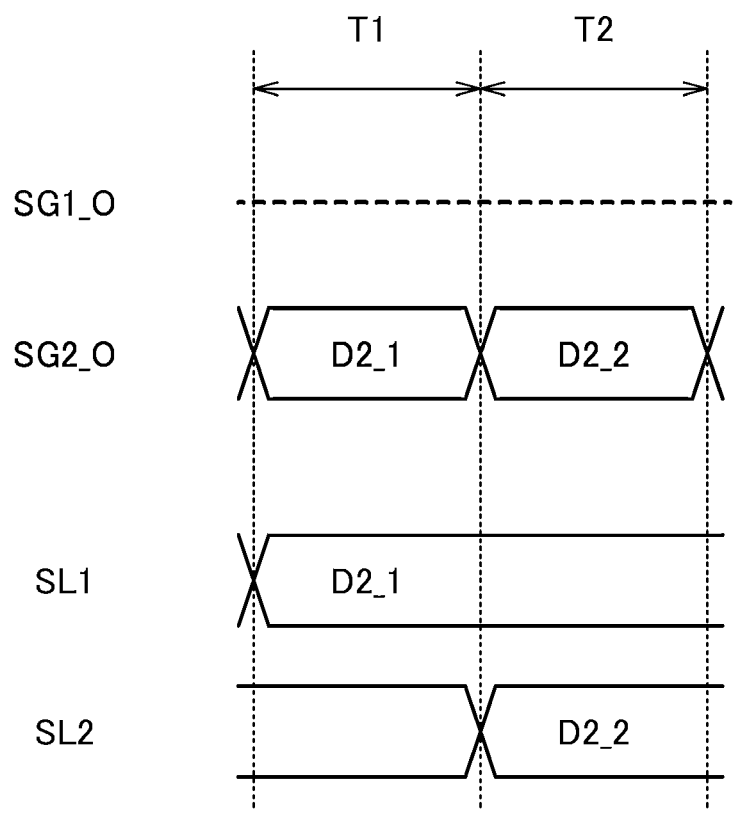
FIG. 5 is a diagram illustrating an operation example of a semiconductor device.

FIG. 5 is an example of a timing chart illustrating the states of potentials supplied to the terminal SL1 and the terminal SL2 in the redundant operation mode. Note that the timing chart in FIG. 5 shows the states of potentials in the first period in FIG. 4A as the period T1 and the states of potentials in the second period in FIG. 4B as the period T2. The potential states of output terminals of the signal generation circuit SG1 and the signal generation circuit SG2 are denoted by SG1_O and SG2_O, respectively.

In FIG. 4A, FIG. 4B, and FIG. 5, the second data signal generated by the signal generation circuit SG2 in the first period is denoted by a data signal D2_1 and the second data signal generated by the signal generation circuit SG2 in the second period is denoted by a data signal D2_2. In the redundant operation mode in FIG. 5, the potential state SG1_O of the output terminal of the signal generation circuit SG1 is shown by a dashed line since the supply of a data signal to the output terminal of the signal generation circuit SG1 is cut off.

In the redundant operation mode, the second data signal generated by the signal generation circuit SG2 is supplied to either the terminal SL1 or the terminal SL2. For example, in the first period shown as the period T1 in FIG. 4A and FIG. 5, a high-level potential is supplied to the terminal SEL1 and a low-level potential is supplied to the terminal SEL2. Thus, the potential of the terminal SL2 is kept at a potential of the previous period, and the data signal D2_1 is supplied to the terminal SL1. In addition, in the second period shown as the period T2 in FIG. 4A and FIG. 5, the low-level potential is supplied to the terminal SEL1 and the high-level potential is supplied to the terminal SEL2. Thus, the potential of the terminal SL1 is kept at the potential of the previous period, and the data signal D2_2 is supplied to the terminal SL2.

The circuit 100A in the redundant operation mode can have a redundancy. In other words, the circuit 100A can change its operation mode from the normal operation mode to the redundant operation mode, when the signal generation circuit SG1 cannot output normally the first data signal due to a characteristic defect or a process defect caused in some of circuit elements in the circuit 100A. Thus, in the circuit 100A, the second data signal generated by the signal generation circuit SG2 can be used. Therefore, the reliability of the circuit 100A is improved. Accordingly, with the semiconductor device of one embodiment of the present invention, the fabrication yield of the circuit 100A can be improved.

The normal mode is described with reference to FIG. 2A, FIG. 2B, and FIG. 3 and the redundant mode is described with reference to FIG. 4A, FIG. 4B, and FIG. 5 in this embodiment, but one embodiment of the present invention is not limited thereto. In one embodiment of the present invention, FIG. 2A, FIG. 2B, and FIG. 3 may be for the redundant mode and FIG. 4A, FIG. 4B, and FIG. 5 may be for the normal mode.

Operation Example 1 of High-Speed Operation Mode

Figure 6A:
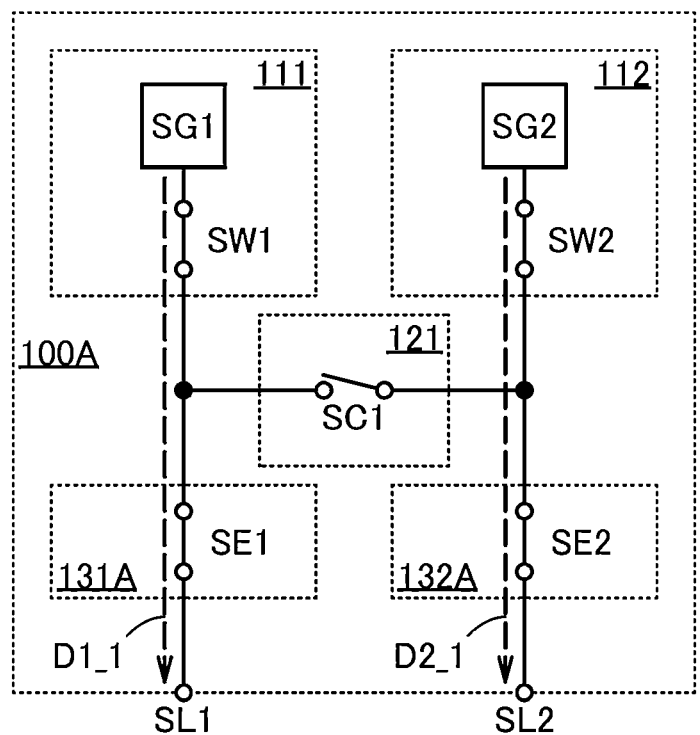
FIG. 6A and FIG. 6B are diagrams illustrating operation examples of a semiconductor device.
Figure 6B:
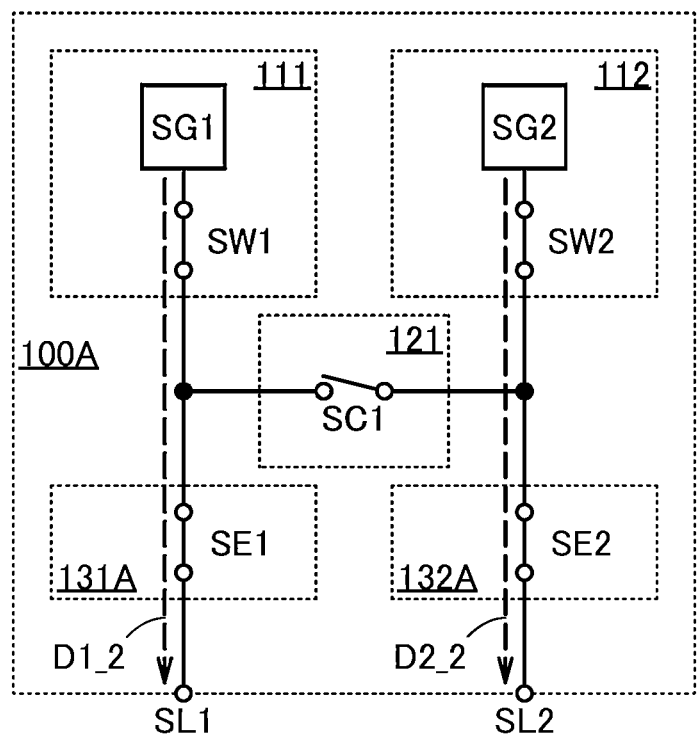

FIG. 6A and FIG. 6B are block diagrams for describing states of the switch SW1, the switch SW2, and the switch SC1, states of the switch SE1 and the switch SE2, and flow of a data signal generated by the signal generation circuit in the high-speed operation mode. Note that the flow of the data signal is denoted by dashed arrows. In particular, FIG. 6A illustrates a driving state of the circuit 100A in the first period. FIG. 6B illustrates a driving state of the circuit 100A in the second period.

In the high-speed operation mode, the low-level potential is supplied to the terminal STB0 and the terminal STB1. Thus, the switch SW1 is turned on, the switch SW2 is turned on, and the switch SC1 is turned off. When the signal generation circuit SG1 is put into an active state, the first data signal is supplied to the output terminal of the signal generation circuit SG1. In addition, when the signal generation circuit SG2 is put into an active state, the second data signal is supplied to the output terminal of the signal generation circuit SG2.

Figure 7A:
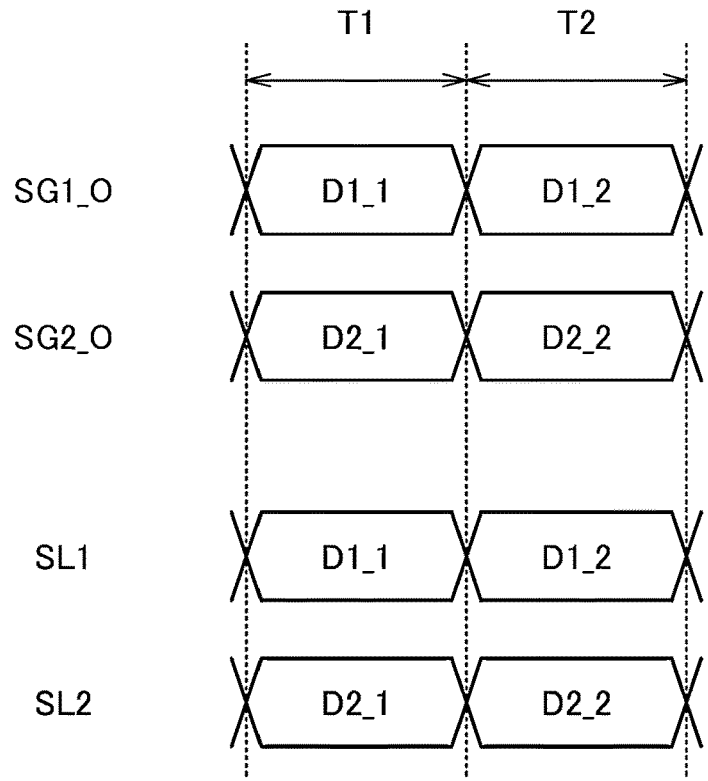
FIG. 7A and FIG. 7B are diagrams illustrating operation examples of a semiconductor device.

FIG. 7A is an example of a timing chart illustrating states of potentials supplied to the terminal SL1 and the terminal SL2 in the high-speed operation mode. Note that the timing chart in FIG. 7A show the states of potentials in the first period in FIG. 6A as the period T1 and the states of potentials in the second period in FIG. 6B as the period T2. The potential states of output terminals of the signal generation circuit SG1 and the signal generation circuit SG2 are denoted by SG1_O and SG2_O, respectively.

In FIG. 6A, FIG. 6B, and FIG. 7, in the first period, the first data signal generated by the signal generation circuit SG1 in the first period is denoted by the data signal D1_1 and the second data signal generated by the signal generation circuit SG2 in the second period is denoted by the data signal D2_1. In addition, in the second period, the first data signal generated by the signal generation circuit SG1 is denoted by the data signal D1_2 and the second data signal generated by the signal generation circuit SG2 in the second period is denoted by the data signal D2_2.

In the high-speed operation mode, the first data signal generated by the signal generation circuit SG1 is supplied to the terminal SL1 and the second data signal generated by the signal generation circuit SG2 is supplied to the terminal SL2. For example, in the first period shown as the period T1 in FIG. 6A and FIG. 7A, a high-level potential is supplied to the terminal SEL1 and the terminal SEL2. Thus, the data signal D1_1 is supplied to the terminal SL1 and the data signal D2_1 is supplied to the terminal SL2. For example, in the second period shown as the period T2 in FIG. 6B and FIG. 7A, a high-level potential is supplied to the terminal SEL1 and the terminal SEL2. Thus, the data signal D1_2 is supplied to the terminal SL1 and the data signal D2_2 is supplied to the terminal SL2.

In the circuit 100A in the high-speed operation mode, different data signals can be supplied to the terminal SL1 and the terminal SL2 at the same time. Thus, the circuit 100A in the high-speed operation mode can supply a data signal at higher speed than the circuit 100A in the normal operation mode. Therefore, the display apparatus in which the circuit 100A in the high-speed operation mode is used can have higher frame rate. That is, the circuit performance of a display apparatus including the semiconductor device of one embodiment of the present invention can be improved. Accordingly, the display apparatus including the semiconductor device of one embodiment of the present invention can have improved display quality.

[Operation Example of Write Rate Improvement Mode]

The circuit 100A can operate in a write rate improvement mode as a modification example of the high-speed operation mode. Note that the operation timing chart of the circuit 100A is different between the write rate improvement mode and the high-speed operation mode. In addition, the states of the switches and the flows of data signals in the circuit 100A are similar to those of the high-speed operation mode, and thus the description of the high-speed operation mode can be referred to.

Figure 7B:
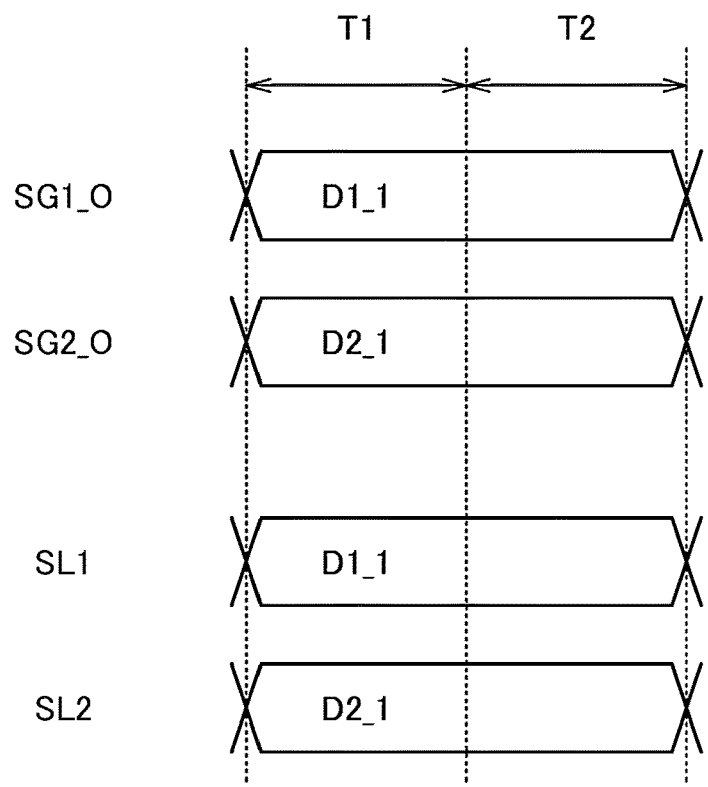

FIG. 7B is an example of a timing chart illustrating states of potentials supplied to the terminal SL1 and the terminal SL2 in the write rate improvement mode. Note that the timing chart in FIG. 7B shows the state of potentials in the first period is shown as the period T1 and the states of potentials in the second period as the period T2. The potential states of output terminals of the signal generation circuit SG1 and the signal generation circuit SG2 are denoted by SG1_O and SG2_O, respectively.

In the write rate improvement mode, for example, in the first period (period T1) and the second period (period T2) in FIG. 7B, the high-level potential is supplied to the terminal SEL1 and the high-level potential is supplied to the terminal SEL2. Thus, the data signal D1_1 is supplied to the terminal SL1 and the data signal D2_1 is supplied to the terminal SL2. Note that in the write rate improvement mode described above, the states of the switches and the flows of data signals in the circuit 100A in the period T1 and the period T2 correspond to those in FIG. 6A.

The circuit 100A in the write rate improvement mode can supply data signals over both the period T1 and the period T2. Thus, the circuit 100A in the write rate improvement mode can have a longer write period of a data signal than that in the normal operation mode. Accordingly, in a display apparatus in which the circuit 100A in the write rate improvement mode is used, the write rate of data signals can be improved. That is, the circuit performance of a display apparatus including the semiconductor device of one embodiment of the present invention can be improved. Accordingly, the display apparatus including the semiconductor device of one embodiment of the present invention can have improved display quality.

Modification Example 1

Note that the semiconductor device of one embodiment of the present invention is not limited to the configuration example illustrated in the block diagram in FIG. 1A. The semiconductor device of one embodiment of the present invention may be changed as appropriate as long as an object is achieved.

Although FIG. 1A illustrates the circuit 100A including the driver circuit 111, the driver circuit 112, the switch circuit 121, the selection circuit 131A, and the selection circuit 132A, one embodiment of the present invention is not limited thereto. A semiconductor device of one embodiment of the present invention may include three or more driver circuits, two or more switch circuits, and three or more selection circuits.

Figure 8:
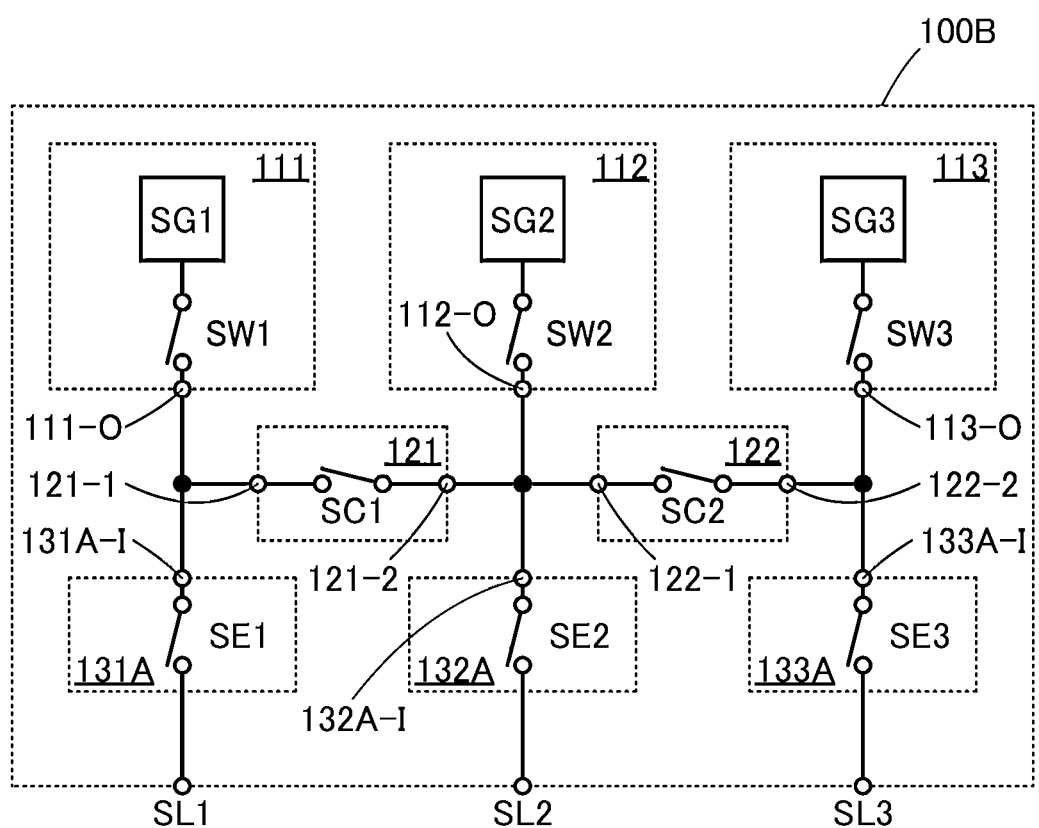
FIG. 8 is a diagram illustrating a structure example of a semiconductor device.

FIG. 8 is a block diagram illustrating an example of the semiconductor device of one embodiment of the present invention. A circuit 100B in FIG. 8 includes the driver circuit 111 to a driver circuit 113, the switch circuit 121 and a switch circuit 122, and the selection circuit 131A to a selection circuit 133A. The output terminal 111-O of the driver circuit 111 is electrically connected to an input terminal 131A-I of the selection circuit 131A. The output terminal 112-O of the driver circuit 112 is electrically connected to an input terminal 132A-I of the selection circuit 132A. An output terminal 113-O of the driver circuit 113 is electrically connected to an input terminal 133A-I of the selection circuit 133A. The first terminal 121-1 of the switch circuit 121 is electrically connected to the input terminal 131A-I of the selection circuit 131A. The second terminal 121-2 of the switch circuit 121 is electrically connected to the input terminal 132A-I of the selection circuit 132A. A first terminal 122-1 of the switch circuit 122 is electrically connected to the input terminal 132A-I of the selection circuit 132A. A second terminal 122-2 of the switch circuit 122 is electrically connected to the input terminal 133A-I of the selection circuit 133A.

Note that the configuration of the driver circuit 113 can be similar to those of the driver circuit 111 and the driver circuit 112 described with reference to FIG. 1A. The configuration of the switch circuit 122 can be similar to that of the switch circuit 121 described with reference to FIG. 1A. The configuration of the selection circuit 133A can be similar to those of the selection circuit 131A and the selection circuit 132A described with reference to FIG. 1A.

The configuration of the circuit 100B in FIG. 8 can further reduce the power consumption as compared with the circuit 100A in FIG. 1A. Furthermore, the configuration of the circuit 100B can have a high redundancy as compared with the circuit 100A. Therefore, the fabrication yield of the circuit 100B can be improved by the configuration of the circuit 100B in the semiconductor device of one embodiment of the present invention. In the display apparatus including the semiconductor device of one embodiment of the present invention, the circuit performance can be improved, for example, increase in frame rate or write rate, by the configuration of the circuit 100B. Accordingly, the display apparatus including the semiconductor device of one embodiment of the present invention can have improved display quality.

Example 2 of Selection Circuit Configuration

Although in the circuit 100A illustrated in FIG. 1A, the selection circuit 131A and the selection circuit 132A each include one switch, one embodiment of the present invention is not limited thereto. Here, an example of a configuration of a circuit 100C is described as the case where the selection circuit includes a plurality of switches.

Figure 9:
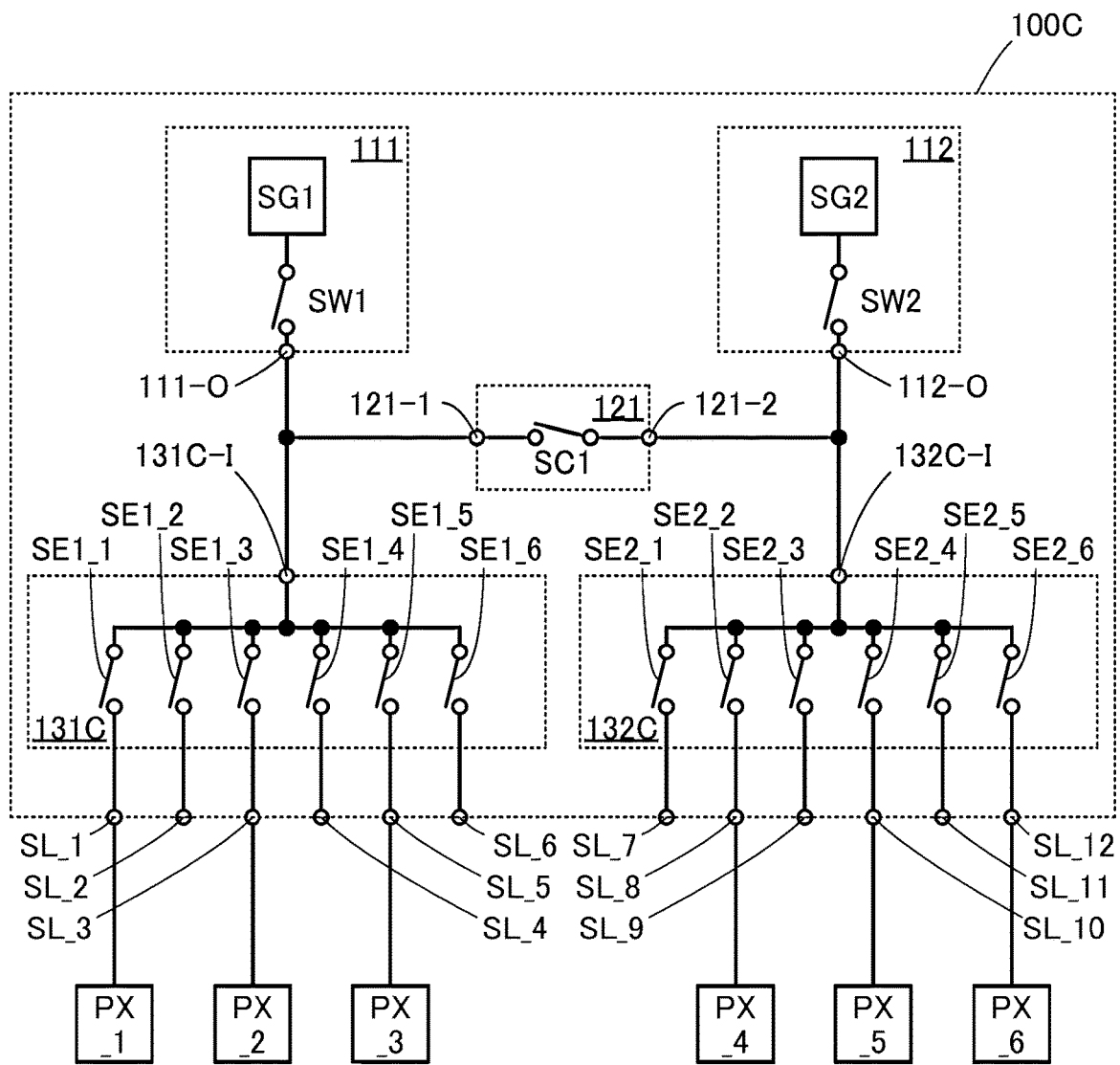
FIG. 9 is a diagram showing a structure example of a semiconductor device.

FIG. 9 is a block diagram illustrating an example of a configuration of the circuit 100C. The circuit 100C in FIG. 9 includes the driver circuit 111, the driver circuit 112, the switch circuit 121, the selection circuit 131C, and the selection circuit 132C. The output terminal 111-O of the driver circuit 111 is electrically connected to an input terminal 131C-I of the selection circuit 131C. The output terminal 112-O of the driver circuit 112 is electrically connected to an input terminal 132C-I of the selection circuit 132C. The first terminal 121-1 of the switch circuit 121 is electrically connected to the input terminal 131C-I of the selection circuit 131C. The second terminal 121-2 of the switch circuit 121 is electrically connected to the input terminal 132C-I of the selection circuit 132C.

An example of the selection circuit 131C and the selection circuit 132C each including six switches is described here. Note that the number of the switches is not limited to six and may be an integer greater than or equal to 2. The number of the switches may be determined depending on the resolution of the display apparatus including the semiconductor device of one embodiment of the present invention. Specifically, the number of the switches is preferably set in such a manner that resolution of the display apparatus can be divisible by the number of the switches. The numbers of the switches included in the selection circuit 131C and the selection circuit 132C may be equal or different.

The selection circuit 131C includes a switch SE1_1 to a switch SE1_6. First terminals of the switch SE1_1 to the switch SE1_6 are electrically connected to the input terminal 131C-I of the selection circuit 131C. Second terminals of the switch SE1_1 to the switch SE1_6 are electrically connected to a terminal SL_1 to a terminal SL_6, respectively.

The selection circuit 132C includes a switch SE2_1 to a switch SE2_6. A first terminal of each of the switch SE2_1 to the switch SE2_6 is electrically connected to an input terminal 132C-I of the selection circuit 132C. Second terminals of the switch SE2_1 to the switch SE2_6 are electrically connected to a terminal SL_7 to a terminal SL_12, respectively.

The selection circuit 131C has a function of turning on at least one switch of the switch SE1_1 to the switch SE1_6, and turning off the other switches in an example. Specifically, a demultiplexer circuit can be used as the selection circuit 131C, for example.

The selection circuit 132C has a function of turning on at least one switch of the switch SE2_1 to the switch SE2_6, and turning off the other switches in an example. Specifically, a demultiplexer circuit can be used as the selection circuit 132C, for example.

For each of the switch SE1_1 to the switch SE1_6, and the switch SE2_1 to the switch SE2_6, any of switches that can be used as the switch SW1, the switch SW2, and the switch SC1 can be used.

The circuit 100C may be electrically connected to the pixel circuit. FIG. 9 illustrates an example in which the circuit 100C is electrically connected to a pixel circuit PX_1 to a pixel circuit PX_6. The pixel circuit PX_1 to the pixel circuit PX_6 are electrically connected to the circuit 100C through the terminal SL_1, the terminal SL_3, the terminal SL_5, the terminal SL_8, the terminal SL_10, and the terminal SL_12, respectively.

Although FIG. 9 illustrates an example in which the terminal SL_2, the terminal SL_4, the terminal SL_6, the terminal SL_7, the terminal SL_9, and the terminal SL_11 are not connected to the pixel circuit, one embodiment of the present invention is not limited thereto. In one embodiment of the present invention, the terminal SL_2, the terminal SL_4, the terminal SL_6, the terminal SL_7, the terminal SL_9, and the terminal SL_11 may be connected to the pixel circuit.

Figure 10:
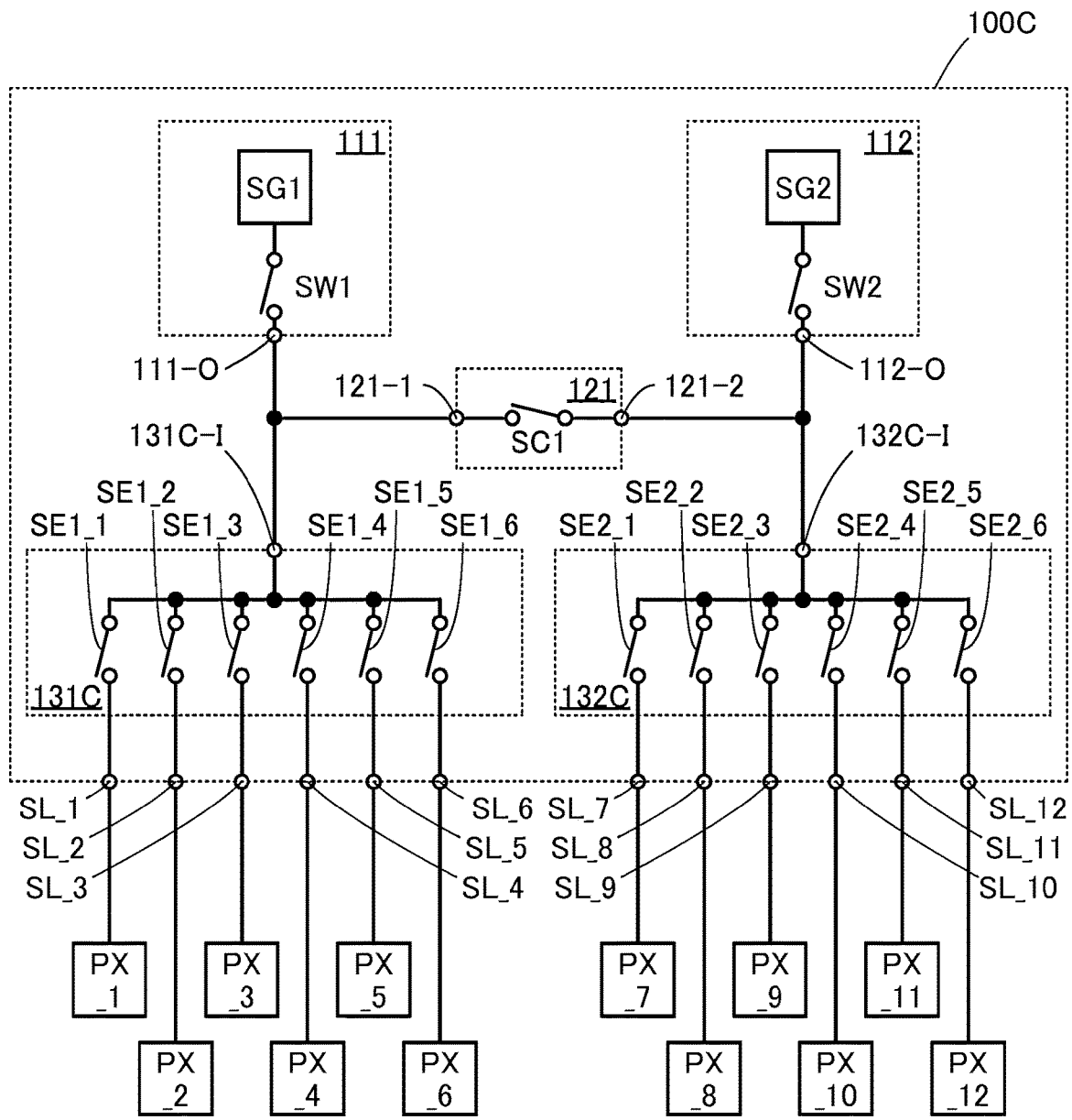
FIG. 10 is a diagram illustrating a structure example of a semiconductor device.

FIG. 10 is a block diagram illustrating a semiconductor device according to one embodiment of the present invention. FIG. 10 illustrates an example where the circuit 100C is electrically connected to the pixel circuit PX_1 to a pixel circuit PX_12. The pixel circuit PX_1 to the pixel circuit PX_12 are electrically connected to the circuit 100C through the terminal SL_1 to the terminal SL_12, respectively.

As illustrated in FIG. 9 and FIG. 10, the number of pixel circuits connected to the circuit 100C is not limited in one embodiment of the present invention. Thus, one embodiment of the present invention can increase or decrease the number of pixel circuits connected to the circuit 100C in accordance with the resolution of the display apparatus, without changing the configuration of the circuit 100C. In that case, the circuit 100C can operate in a high-resolution mode described later.

Although not illustrated in FIG. 9 and FIG. 10, for example, the inverter INV0, the inverter INV1, the circuit XOR, and the like may be provided to control the operation mode of the circuit 100C outside the circuit 100C, as in the circuit 100A illustrated in FIG. 1A. For the connection configuration of the inverter INV0, the inverter INV1, the circuit XOR, and the like, the description of the circuit 100A illustrated in FIG. 1A can be referred to.

Configuration Example 2 of Operation Mode

The circuit 100C can operate in any of a plurality of modes to be switched depending on the situation. Examples of the plurality of modes include the normal operation mode, the redundant operation mode, the high-speed operation mode, and the high-resolution mode.

The normal operation mode is a mode in which the first data signal generated by the signal generation circuit SG1 is supplied to any one of the terminal SL_1, the terminal SL_3, the terminal SL_5, the terminal SL_8, the terminal SL_10, and the terminal SL_12 in FIG. 9. The redundant operation mode is a mode in which the second data signal generated by the signal generation circuit SG2 is supplied to any one of the terminal SL_1, the terminal SL_3, the terminal SL_5, the terminal SL_8, the terminal SL_10, and the terminal SL_12 in FIG. 9. The high-speed operation mode is a mode in which the first data signal generated by the signal generation circuit SG1 is supplied to any one of the terminal SL_1, the terminal SL_3, and the terminal SL_5, and the second data signal generated by the signal generation circuit SG2 is supplied to any one of the terminal SL_8, the terminal SL_10, and the terminal SL_12 in FIG. 9. The high-resolution mode is a mode in which the first data signal generated by the signal generation circuit SG1 is supplied to any one of the terminal SL_1 to the terminal SL_6, and the second data signal generated by the signal generation circuit SG2 is supplied to any one of the terminal SL_7 to the terminal SL_12 in FIG. 10.

Next, the normal operation mode, the redundant operation mode, the high-speed operation mode, and the high-resolution mode will each be described in detail.

Operation Example 2 of Normal Operation Mode

In the normal operation mode, the low-level potential is supplied to the terminal STB0 and the high-level potential is supplied to the terminal STB1. Thus, the switch SW1 is turned on, the switch SW2 is turned off, and the switch SC1 is turned on. When the signal generation circuit SG1 is put into an active state, the first data signal is supplied to the output terminal of the signal generation circuit SG1. In addition, when the signal generation circuit SG2 is put into a standby state, the supply of the data signal to the output terminal of the signal generation circuit SG2 is cut off.

Figure 11:
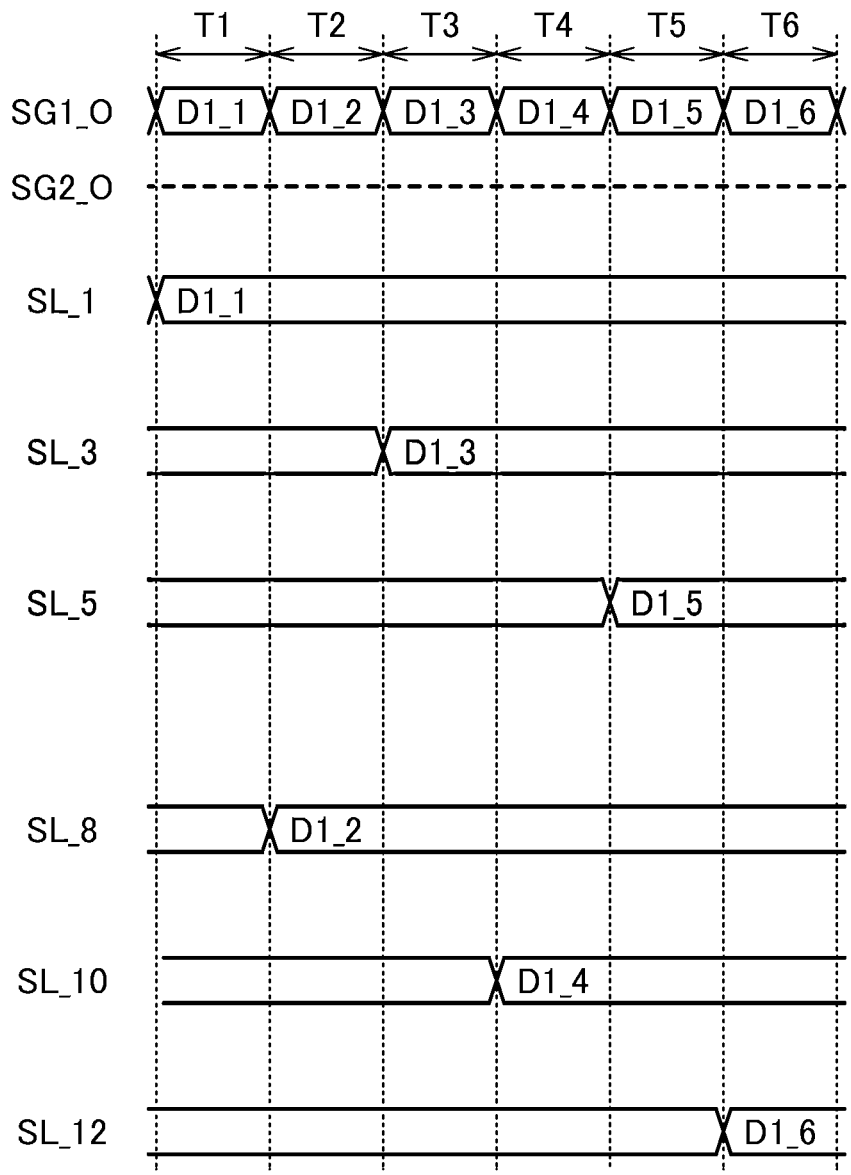
FIG. 11 is a diagram illustrating an operation example of a semiconductor device.

FIG. 11 is an example of a timing chart illustrating the states of potentials supplied to the terminal SL_1, the terminal SL_3, the terminal SL_5, the terminal SL_8, the terminal SL_10, and the terminal SL_12. Note that the timing chart in FIG. 11 shows states of potentials in a first period to a sixth period as a period T1 to a period T6, respectively. In addition, the potential states of output terminals of the signal generation circuit SG1 and the signal generation circuit SG2 are denoted by SG1_O and SG2_O, respectively.

In FIG. 11, first data signals generated by the signal generation circuit SG1 in the first period to the sixth period are denoted by a data signal D1_1 to a data signal D1_6, respectively. In the normal operation mode, the potential state SG2_O of the output terminal of the signal generation circuit SG2 is shown by a dashed line since the supply of a data signal to the output terminal of the signal generation circuit SG2 is cut off.

In the normal operation mode, the first data signal generated by the signal generation circuit SG1 is supplied to any one of the terminal SL_1, the terminal SL_3, the terminal SL_5, the terminal SL_8, the terminal SL_10, and the terminal SL_12 in order. For example, in FIG. 11, in the period T1, the selection circuit 131C selects the terminal SL_1, so that the data signal D1_1 is supplied to the terminal SL_1. In the period T2, the selection circuit 132C selects the terminal SL_8, so that the data signal D1_2 is supplied to the terminal SL_8. In the period T3, the selection circuit 131C selects the terminal SL_3, so that the data signal D1_3 is supplied to the terminal SL_3. In the period T4, the selection circuit 132C selects the terminal SL_10, so that the data signal D1_4 is supplied to the terminal SL_10. In the period T5, the selection circuit 131C selects the terminal SL_5, so that the data signal D1_5 is supplied to the terminal SL_5. In the period T6, the selection circuit 132C selects the terminal SL_12, so that the data signal D1_6 is supplied to the terminal SL_12. Note that in the normal operation mode described above, in each of the period T1 to the period T6, the potentials of the other terminals than the terminal selected by the selection circuit 131C are kept at the potentials of the previous period.

In the circuit 100C in the normal operation mode, the signal generation circuit SG2 is put into a standby state, so that the operation of the amplifier AMP in the signal generation circuit SG2 can be stopped. Furthermore, the semiconductor device of one embodiment of the present invention can have reduced power consumption.

Operation Example 2 of Redundant Operation Mode

In the redundant operation mode, the high-level potential is supplied to the terminal STB0 and the low-level potential is supplied to the terminal STB1. Thus, the switch SW1 is turned off, the switch SW2 is turned on, and the switch SC1 is turned on. When the signal generation circuit SG1 is put into a standby state, the supply of data signal to the output terminal of the signal generation circuit SG1 is cut off. In addition, when the signal generation circuit SG2 is put into an active state, the second data signal is supplied to the output terminal of the signal generation circuit SG2.

Figure 12:
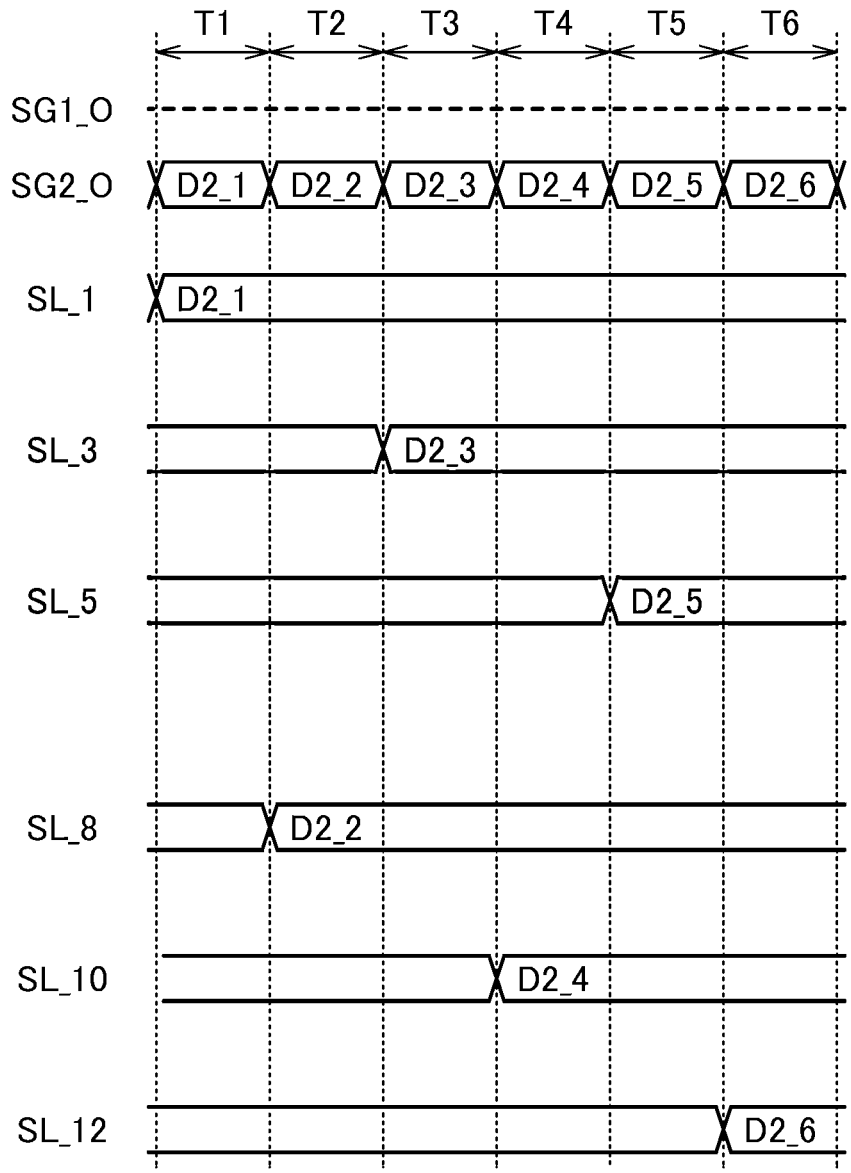
FIG. 12 is a diagram illustrating an operation example of a semiconductor device.

FIG. 12 is an example of a timing chart illustrating the states of potentials supplied to the terminal SL_1, the terminal SL_3, the terminal SL_5, the terminal SL_8, the terminal SL_10, and the terminal SL_12 in the redundant operation mode. Note that the timing chart in FIG. 12 shows the states of potentials in the first period to the sixth period as the period T1 to the period T6, respectively. In addition, the potential states of output terminals of the signal generation circuit SG1 and the signal generation circuit SG2 are denoted by SG1_O and SG2_O, respectively.

In FIG. 12, second data signals generated by the signal generation circuit SG2 in the first period to the sixth period are denoted by a data signal D2_1 to a data signal D2_6, respectively. In the redundant operation mode, the potential state SG1_O of the output terminal of the signal generation circuit SG1 is shown by a dashed line since the supply of a data signal to the output terminal of the signal generation circuit SG1 is cut off.

In the redundant operation mode, the second data signal generated by the signal generation circuit SG2 is supplied to any one of the terminal SL_1, the terminal SL_3, the terminal SL_5, the terminal SL_8, the terminal SL_10, and the terminal SL_12 in order. For example, in FIG. 12, in the period T1, the selection circuit 131C selects the terminal SL_1, so that the data signal D2_1 is supplied to the terminal SL_1. In the period T2, the selection circuit 132C selects the terminal SL_8, so that the data signal D2_2 is supplied to the terminal SL_8. In the period T3, the selection circuit 131C selects the terminal SL_3, so that the data signal D2_3 is supplied to the terminal SL_3. In the period T4, the selection circuit 132C selects the terminal SL_10, so that the data signal D2_4 is supplied to the terminal SL_10. In the period T5, the selection circuit 131C selects the terminal SL_5, so that the data signal D2_5 is supplied to the terminal SL_5. In the period T6, the selection circuit 132C selects the terminal SL_12, so that the data signal D2_6 is supplied to the terminal SL_12. Note that in the redundant operation mode described above, in each of the period T1 to the period T6, the potentials of the other terminals than the terminal selected by the selection circuit 131C are kept at the potentials in the previous period.

The circuit 100C in the redundant operation mode can have a redundancy. In other words, the circuit 100C can change its operation mode from the normal operation mode to the redundant operation mode, when the signal generation circuit SG1 cannot output normally the first data signal due to a characteristic defect or a process defect caused in some of circuit elements in the circuit 100A. Thus, in the circuit 100C, the second data signal generated by the signal generation circuit SG2 can be used. Accordingly, with the semiconductor device of one embodiment of the present invention, the fabrication yield of the circuit 100C can be improved.

The above description in this embodiment is made on the case where FIG. 11 is the normal mode and FIG. 12 is the redundant mode, but one embodiment of the present invention is not limited thereto. In one embodiment of the present invention, FIG. 11 may be for the redundant mode and FIG. 12 may be for the normal mode.

Operation Example 2 of High-Speed Operation Mode

In the high-speed operation mode, the low-level potential is supplied to the terminal STB0 and the terminal STB1. Thus, the switch SW1 is turned on, the switch SW2 is turned on, and the switch SC1 is turned off. When the signal generation circuit SG1 is put into an active state, the first data signal is supplied to the output terminal of the signal generation circuit SG1. In addition, when the signal generation circuit SG2 is put into an active state, the second data signal is supplied to the output terminal of the signal generation circuit SG2.

Figure 13:
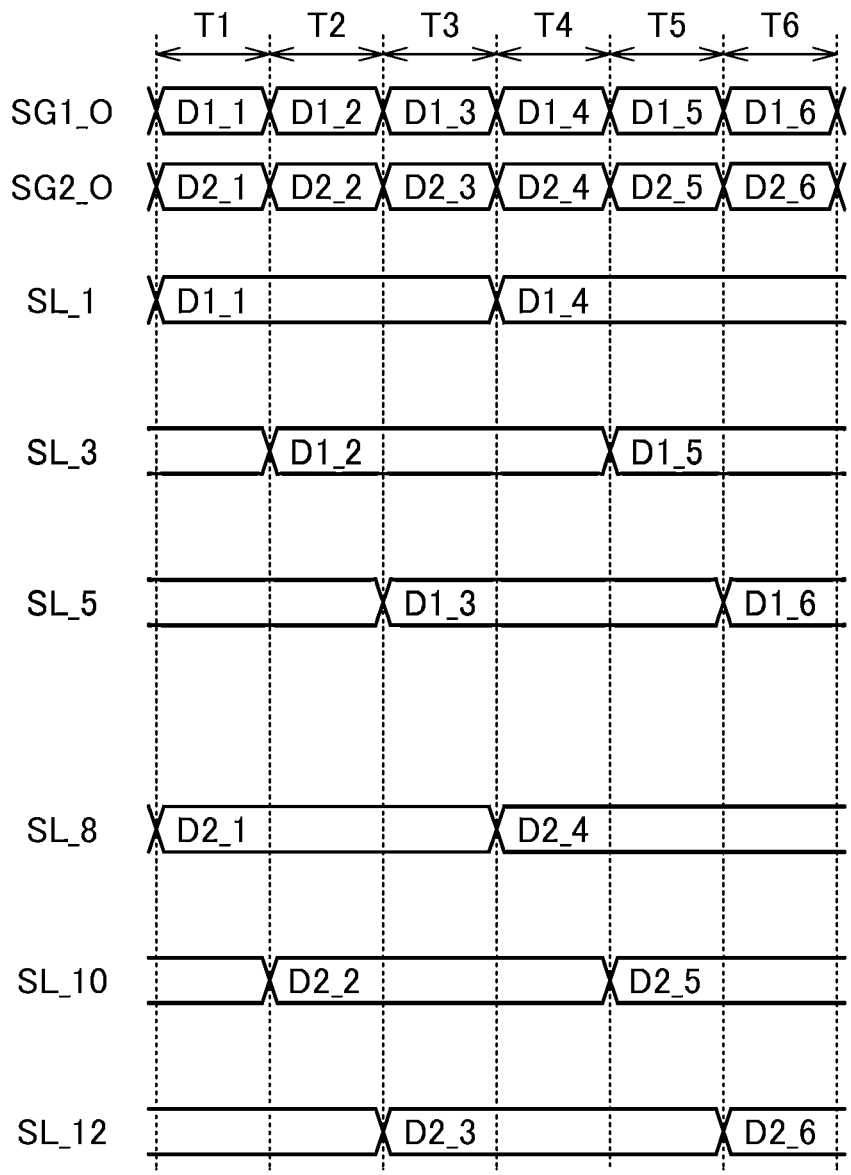
FIG. 13 is a diagram illustrating an operation example of a semiconductor device.

FIG. 13 is an example of a timing chart illustrating the states of potentials supplied to the terminal SL_1, the terminal SL_3, the terminal SL_5, the terminal SL_8, the terminal SL_10, and the terminal SL_12 in the high-speed operation mode. Note that the timing chart in FIG. 13 shows the states of potentials in the first period to the sixth period as the period T1 to the period T6, respectively. In addition, the potential states of output terminals of the signal generation circuit SG1 and the signal generation circuit SG2 are denoted by SG1_O and SG2_O, respectively.

In FIG. 13, the first data signals generated by the signal generation circuit SG1 in the first period to the sixth period are denoted as the data signal D1_1 to the data signal D1_6, respectively, and the second data signals generated by the signal generation circuit SG2 in the first period to the sixth period are denoted as the data signal D2_1 to the data signal D2_6, respectively.

In the high-speed operation mode, the first data signal generated by the signal generation circuit SG1 is supplied to any one of the terminal SL_1, the terminal SL_3, and the terminal SL_5, and the second data signal generated by the signal generation circuit SG2 is supplied to any one of the terminal SL_8, the terminal SL_10, and the terminal SL_12. For example, in FIG. 13, in the period T1, the selection circuit 131C selects the terminal SL_1, so that the data signal D1_1 is supplied to the terminal SL_1 and the selection circuit 132C selects the terminal SL_8, so that the data signal D2_1 is supplied to the terminal SL_8. In the period T2, the selection circuit 131C selects the terminal SL_3, so that the data signal D1_2 is supplied to the terminal SL_3 and the selection circuit 132C selects the terminal SL_10, so that the data signal D2_2 is supplied to the terminal SL_10. In the period T3, the selection circuit 131C selects the terminal SL_5, so that the data signal D1_3 is supplied to the terminal SL_5 and the selection circuit 132C selects the terminal SL_12, so that the data signal D2_3 is supplied to the terminal SL_12. In the period T4, the selection circuit 131C selects the terminal SL_1, so that the data signal D1_4 is supplied to the terminal SL_1 and the selection circuit 132C selects the terminal SL_8, so that the data signal D2_4 is supplied to the terminal SL_8. In the period T5, the selection circuit 131C selects the terminal SL_3, so that the data signal D1_5 is supplied to the terminal SL_3 and the selection circuit 132C selects the terminal SL_10, so that the data signal D2_5 is supplied to the terminal SL_10. In the period T6, the selection circuit 131C selects the terminal SL_5, so that the data signal D1_6 is supplied to the terminal SL_5 and the selection circuit 132C selects the terminal SL_12, so that the data signal D2_6 is supplied to the terminal SL_12. Note that in the high-speed operation mode described above, in each of the period T1 to the period T6, the potentials of the other terminals than the terminal selected by the selection circuit 131C are kept at the potentials in the previous period.

In the circuit 100C in the high-speed operation mode, different data signals can be supplied to the terminal SL_1 and the terminal SL_8 at the same time, different data signals can be supplied to the terminal SL_3 and the terminal SL_10 at the same time, and different data signals can be supplied to the terminal SL_5 and the terminal SL_12 at the same time. In other words, the circuit 100C in the high-speed operation mode can supply data signals to the same number of terminals as that in the normal operation mode in one half the period of the normal operation mode. Therefore, the circuit performance such as a frame rate or a write rate can be improved in the display apparatus including the semiconductor device of one embodiment of the present invention. Accordingly, the display apparatus including the semiconductor device of one embodiment of the present invention can have improved display quality.

[Operation Example of High-Resolution Mode]

In the high-resolution mode, the low-level potential is supplied to the terminal STB0 and the terminal STB1. Thus, the switch SW1 is turned on, the switch SW2 is turned on, and the switch SC1 is turned off. When the signal generation circuit SG1 is put into an active state, the first data signal is supplied to the output terminal of the signal generation circuit SG1. In addition, when the signal generation circuit SG2 is put into an active state, the second data signal is supplied to the output terminal of the signal generation circuit SG2.

Figure 14:
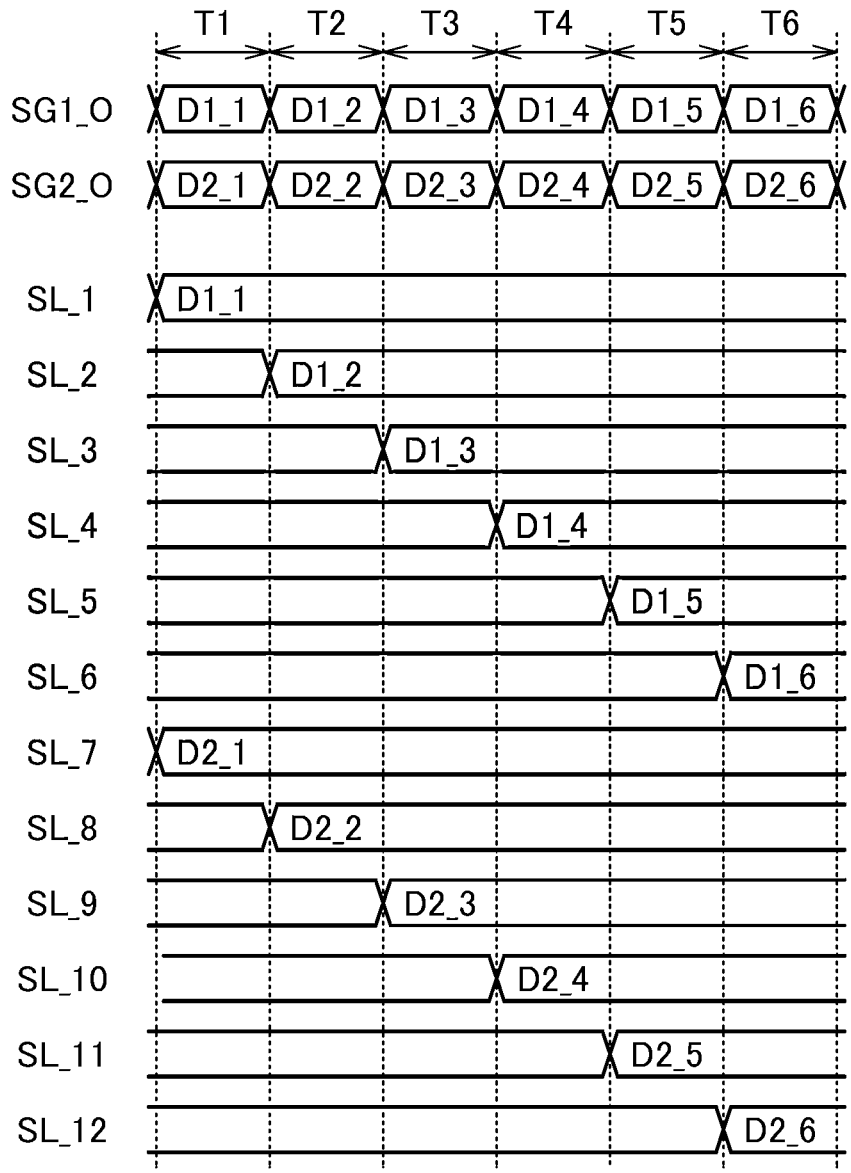
FIG. 14 is a diagram illustrating an operation example of a semiconductor device.

FIG. 14 is an example of a timing chart illustrating states of potentials supplied to the terminal SL_1 to the terminal SL_12 in the high-resolution mode. Note that the timing chart in FIG. 14 shows states of potentials in the first period to the sixth period as the period T1 to the period T6, respectively. The potential states of output terminals of the signal generation circuit SG1 and the signal generation circuit SG2 are denoted by SG1_O and SG2_O, respectively.

In FIG. 14, the first data signals generated by the signal generation circuit SG1 in the first period to the sixth period are denoted as the data signal D1_1 to the data signal D1_6, respectively, and the second data signals generated by the signal generation circuit SG2 in the first period to the sixth period are denoted as the data signal D2_1 to the data signal D2_6, respectively.

In the high-resolution mode, the first data signal generated by the signal generation circuit SG1 is supplied to any one of the terminal SL_1 to the terminal SL_6, and the second data signal generated by the signal generation circuit SG2 is supplied to any one of the terminal SL_7 to the terminal SL_12. For example, in FIG. 14, in the period T1, the selection circuit 131C selects the terminal SL_1, so that the data signal D1_1 is supplied to the terminal SL_1 and the selection circuit 132C selects the terminal SL_7, so that the data signal D2_1 is supplied to the terminal SL_7. In the period T2, the selection circuit 131C selects the terminal SL_2, so that the data signal D1_2 is supplied to the terminal SL_2 and the selection circuit 132C selects the terminal SL_8, so that the data signal D2_2 is supplied to the terminal SL_8. In the period T3, the selection circuit 131C selects the terminal SL_3, so that the data signal D1_3 is supplied to the terminal SL_3 and the selection circuit 132C selects the terminal SL_9, so that the data signal D2_3 is supplied to the terminal SL_9. In the period T4, the selection circuit 131C selects the terminal SL_4, so that the data signal D1_4 is supplied to the terminal SL_4 and the selection circuit 132C selects the terminal SL_10, so that the data signal D2_4 is supplied to the terminal SL_10. In the period T5, the selection circuit 131C selects the terminal SL_5, so that the data signal D1_5 is supplied to the terminal SL_5 and the selection circuit 132C selects the terminal SL_11, so that the data signal D2_5 is supplied to the terminal SL_11. In the period T6, the selection circuit 131C selects the terminal SL_6, so that the data signal D1_6 is supplied to the terminal SL_6 and the selection circuit 132C selects the terminal SL_12, so that the data signal D2_6 is supplied to the terminal SL_12. Note that in the high-resolution mode described above, in each of the period T1 to the period T6, the potentials of the other terminals than the terminal selected by the selection circuit 131C are kept at the potentials in the previous period.

In the circuit 100C in the high-resolution mode, different data signals can be supplied to the terminal SL_1 and the terminal SL_7 at the same time, different data signals can be supplied to the terminal SL_2 and the terminal SL_8 at the same time, different data signals can be supplied to the terminal SL_3 and the terminal SL_9 at the same time, different data signals can be supplied to the terminal SL_4 and the terminal SL_10 at the same time, different data signals can be supplied to the terminal SL_5 and the terminal SL_11 at the same time, and different data signals can be supplied to the terminal SL_6 and the terminal SL_12 at the same time. In other words, in the circuit 100C in the high-resolution mode, data signals can be supplied to the number of terminals that is twice that of the normal operation mode in the same period as in the normal operation mode. Therefore, in the case where the display apparatus including the semiconductor device of one embodiment of the present invention can be a 4K-resolution display apparatus in the normal operation mode, the display apparatus can perform an 8K-resolution display in the high-resolution mode. Thus, the display apparatus utilizing the semiconductor device of one embodiment of the present invention can have improved display quality.

Modification Example 2

Note that the semiconductor device of one embodiment of the present invention is not limited to the configuration examples illustrated in the block diagrams in FIG. 9 and FIG. 10. The semiconductor device of one embodiment of the present invention may be changed as appropriate as long as an object is achieved.

Figure 15:
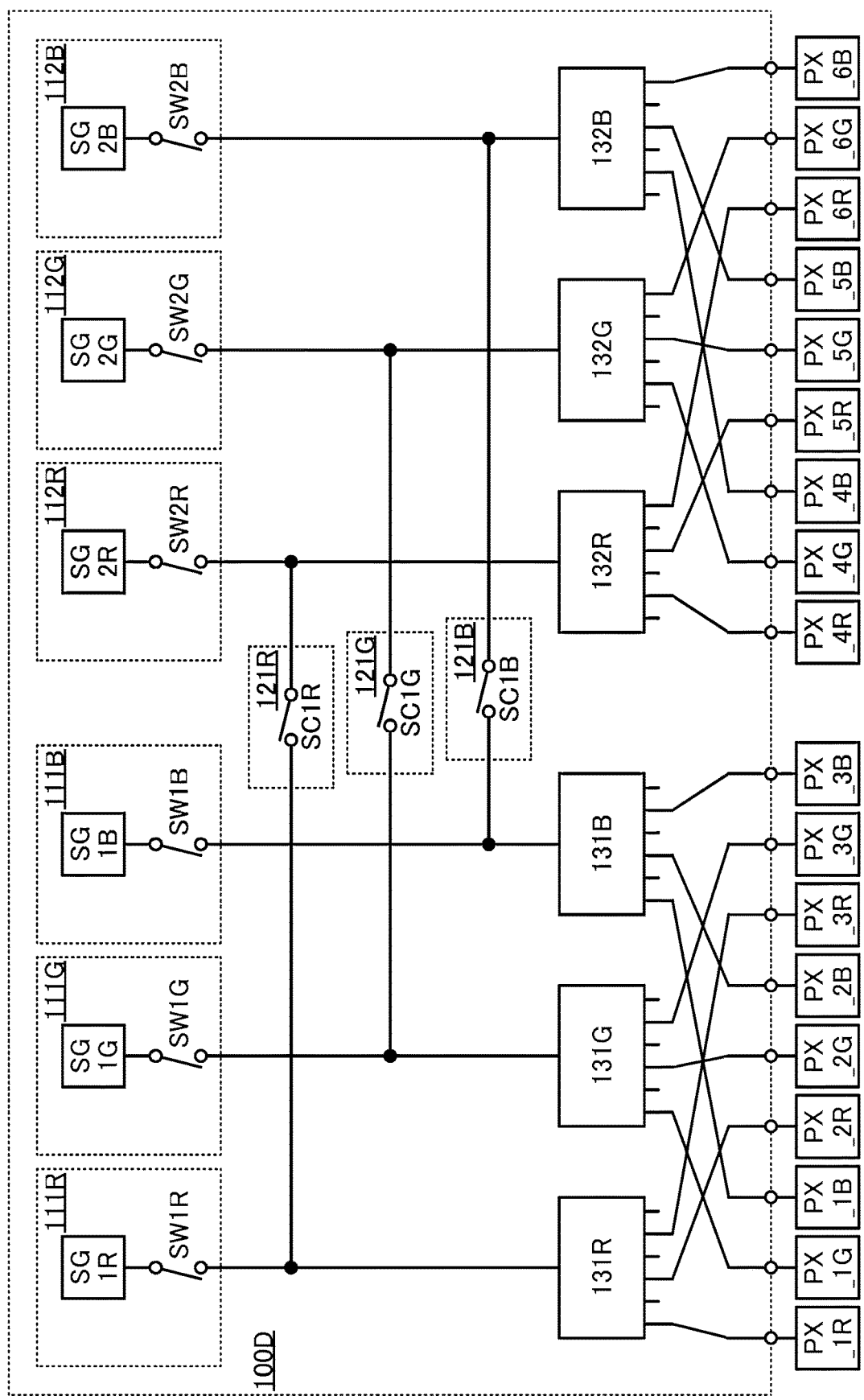
FIG. 15 is a diagram illustrating a structure example of a semiconductor device.

FIG. 15 is a block diagram illustrating an example of a semiconductor device of one embodiment of the present invention. The circuit 100D in FIG. 15 is an example of a circuit that supplies video data signals to pixel circuits of red, green, and blue and the circuits 100C are provided for the respective colors. For example, the circuit 100D includes a driver circuit 111R, a driver circuit 112R, a switch circuit 121R, a selection circuit 131R, and a selection circuit 132R as the circuits for supplying a video data signal of red. An output terminal of the driver circuit 111R is electrically connected to an input terminal of the selection circuit 131R. An output terminal of the driver circuit 112R is electrically connected to an input terminal of the selection circuit 132R. A first terminal of the switch circuit 121R is electrically connected to the input terminal of the selection circuit 131R. A second terminal of the switch circuit 121R is electrically connected to the input terminal of the selection circuit 132R. Furthermore, for example, the circuit 100D includes a driver circuit 111G, a driver circuit 112G, a switch circuit 121G, a selection circuit 131G, and a selection circuit 132G as the circuits for supplying a video data signal of green. An output terminal of the driver circuit 111G is electrically connected to an input terminal of the selection circuit 131G. An output terminal of the driver circuit 112G is electrically connected to an input terminal of the selection circuit 132G. A first terminal of the switch circuit 121G is electrically connected to the input terminal of the selection circuit 131G. A second terminal of the switch circuit 121G is electrically connected to the input terminal of the selection circuit 132G. Furthermore, for example, the circuit 100D includes a driver circuit 111B, a driver circuit 112B, a switch circuit 121B, a selection circuit 131B, and a selection circuit 132B as the circuits for supplying a video data signal of blue. An output terminal of the driver circuit 111B is electrically connected to an input terminal of the selection circuit 131B. An output terminal of the driver circuit 112B is electrically connected to an input terminal of the selection circuit 132B. A first terminal of the switch circuit 121B is electrically connected to the input terminal of the selection circuit 131B. A second terminal of the switch circuit 121B is electrically connected to the input terminal of the selection circuit 132B.

Note that the pixel circuit may be provided outside the circuit 100D. FIG. 15 illustrates an example in which a pixel circuit PX_1R to a pixel circuit PX_6R, a pixel circuit PX_1G to a pixel circuit PX_6G, and a pixel circuit PX_1B to a pixel circuit PX_6B are provided outside the circuit 100D. The pixel circuit PX_1R to the pixel circuit PX_6R are each a pixel circuit that emits red light, for example. The pixel circuit PX_1G to the pixel circuit PX_6G each a pixel circuit that emits green light, for example. The pixel circuit PX_1B to the pixel circuit PX_6B each a pixel circuit that emits blue light, for example. Each of the pixel circuit PX_1R to the pixel circuit PX_3R is electrically connected to any one of a plurality of output terminals of the selection circuit 131R. Each of the pixel circuit PX_4R to the pixel circuit PX_6R is electrically connected to any one of a plurality of output terminals of the selection circuit 132R. Each of the pixel circuit PX_1G to the pixel circuit PX_3G is electrically connected to any one of a plurality of output terminals of the selection circuit 131G. Each of the pixel circuit PX_4G to the pixel circuit PX_6G is electrically connected to any one of a plurality of output terminals of the selection circuit 132G. Each of the pixel circuit PX_1B to the pixel circuit PX_3B is electrically connected to any one of a plurality of output terminals of the selection circuit 131B. Each of the pixel circuit PX_4B to the pixel circuit PX_6B is electrically connected to any one of a plurality of output terminals of the selection circuit 132B.

The configuration of the circuit 100D in FIG. 15 can be regarded as having the configuration of the circuit 100C in FIG. 9 in each pixel circuit of red, green, and blue. In other words, gamma correction can be performed for each data signal of red, green, and blue. Thus, the display apparatus including the semiconductor device of one embodiment of the present invention can have improved display quality.

Note that although the circuit 100D in FIG. 15 has a circuit configuration in which video data signals are supplied to pixel circuits of three colors of red, green, and blue, one embodiment of the present invention is not limited thereto. The number of colors of the pixel circuits may be two or four or more, for example. In one embodiment of the present invention, even when the number of colors of the pixel circuits is two or four or more, the circuit 100C may be provided in the circuit 100D for each pixel circuit for the colors. Although the circuit 100D in FIG. 15 has the circuit configuration in which video data signals are supplied to the pixel circuits of three colors of red, green, and blue, one embodiment of the present invention is not limited thereto. In one embodiment of the present invention, three colors of magenta, cyan, and yellow may be employed, for example. In one embodiment of the present invention, the circuit 100D may be configured to correspond to pixel circuits of one or more of red, green, blue, magenta, cyan, and yellow.

Embodiment 2

Figure 16A:
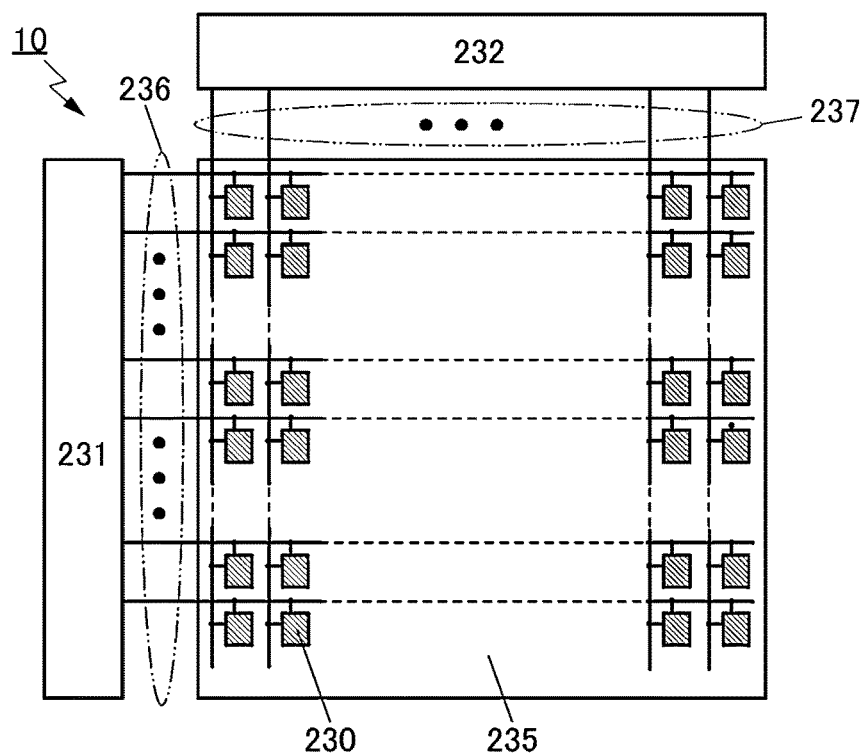
FIG. 16A to FIG. 16H are diagrams illustrating structure examples of a display apparatus.

In this embodiment, a structure example of a display apparatus 10 including a semiconductor device of one embodiment of the present invention will be described. FIG. 16A is a block diagram illustrating the display apparatus 10. The display apparatus 10 includes a display region 235, a first driver circuit portion 231, and a second driver circuit portion 232. The display region 235 includes a plurality of pixels 230 arranged in a matrix. The semiconductor device of one embodiment of the present invention described in Embodiment 1 can be used for the second driver circuit portion 232. Alternatively, the semiconductor device of one embodiment of the present invention described in Embodiment 1 can be used for one or both of the first driver circuit portion 231 and the second driving circuit portion 232. For example, a plurality of circuits 100D illustrated in FIG. 15 can be used for the second driver circuit portion 232 illustrated in FIG. 16A.

A circuit included in the first driver circuit portion 231 functions as, for example, a scan line driver circuit. A circuit included in the second driver circuit portion 232 functions as, for example, a signal line driver circuit. Some sort of circuit may be provided to face the first driver circuit portion 231 with the display region 235 positioned therebetween in the display apparatus 10. Some sort of circuit may be provided at a position facing the second driver circuit portion 232 with the display region 235 positioned therebetween in the display apparatus 10. Note that in this specification and the like, circuits included in the first driver circuit portion 231 and the second driver circuit portion 232 are collectively referred to as a "peripheral driver circuit" in some cases.

Any of various circuits such as a shift register, a level shifter, an inverter, a latch, an analog switch, and a logic circuit can be used as the peripheral driver circuit, for example. In the peripheral driver circuit, a transistor, a capacitor, or the like can be used, for example.

For example, in the display apparatus 10, OS transistors may be used as the transistors included in the pixels 230 and Si transistors (including silicon in a semiconductor layer where a channel is formed) may be used as the transistors included in the peripheral driver circuit. The off-state current of the OS transistor is low, so that power consumption can be reduced. Since the Si transistor has higher operation speed than the OS transistor, the Si transistor is preferably used in the peripheral driver circuit. The display apparatus 10 may include the OS transistors as both the transistors included in the pixels 230 and the transistors included in the peripheral driver circuit. The display apparatus 10 may include the Si transistors as both the transistors included in the pixels 230 and the transistors included in the peripheral driver circuit. The display apparatus 10 may include the Si transistors as the transistors included in the pixels 230 and the OS transistors as the transistors included in the peripheral driver circuit.

Both the Si transistor and the OS transistor may be used as the transistors included in the pixel 230. Both the Si transistor and the OS transistor may be used as the transistors included in the peripheral driver circuit.

Examples of materials used as the Si transistor in the display apparatus of one embodiment of the present invention include single crystal silicon, polycrystalline silicon, and amorphous silicon. In addition, in the display apparatus of one embodiment of the present invention, a transistor containing low-temperature polysilicon (LTPS) in its semiconductor layer (hereinafter, also referred to as an LTPS transistor) can be used. The LTPS transistor has high field-effect mobility and favorable frequency characteristics.

In the display apparatus of one embodiment of the present invention, for example, by using Si transistors such as LTPS transistors, a circuit required to be driven at a high frequency (e.g., a source driver circuit) can be formed on the same substrate as the display portion. Thus, external circuits mounted on the display apparatus can be simplified, and costs of parts and mounting costs can be reduced.

The OS transistor has extremely higher field-effect mobility than a transistor including amorphous silicon. The OS transistor has an extremely low leakage current between a source and a drain in an off state (hereinafter, also referred to as an off-state current). Thus, a capacitor serially-connected with the transistor enables long-term retention of charge accumulated in the capacitor. Furthermore, power consumption of the display apparatus of one embodiment of the present invention can be reduced with the use of the OS transistor.

The off-state current value per micrometer of channel width of the OS transistor at room temperature can be lower than or equal to 1 aA ($1 \times 10^{-18}$ A), lower than or equal to 1 zA ($1 \times 10^{-21}$ A), or lower than or equal to 1 yA ($1 \times 10^{-24}$ A). Note that the off-state current value per micrometer of channel width of the Si transistor at room temperature is higher than or equal to 1 fA ($1 \times 10^{-15}$ A) and lower than or equal to 1 pA ($1 \times 10^{-12}$ A). In other words, the off-state current of the OS transistor is lower than the off-state current of the Si transistor by approximately ten orders of magnitude.

The display apparatus 10 includes m (m is an integer of 1 or more) wirings 236 which are placed in substantially parallel with each other and whose potentials are controlled by a circuit included in the first driver circuit portion 231. The display apparatus 10 includes n (n is an integer of 1 or more) wirings 237 which are placed in parallel with each other and whose potentials are controlled by a circuit included in the second driver circuit portion 232.

Note that FIG. 16A illustrates an example in which the wirings 236 and the wirings 237 are connected to the pixels 230. However, this is an example, and the wirings connected to the pixels 230 are not limited to the wirings 236 and the wirings 237.

Figure 16B:
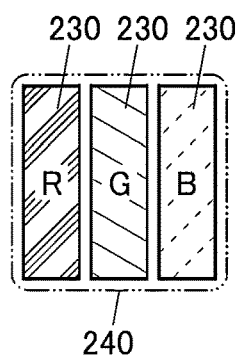
Figure 16C:
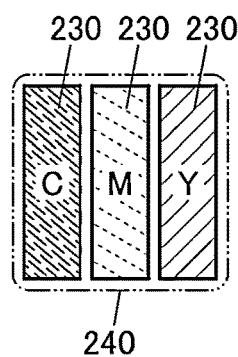

The display apparatus 10 can achieve full-color display by making the pixel 230 that controls red light, the pixel 230 that controls green light, and the pixel 230 that controls blue light collectively function as one pixel 240 and by controlling the amount of light (emission luminance) emitted from each pixel 230. Thus, the three pixels 230 each function as a subpixel. That is, three subpixels control the emission amount or the like of red light, green light, and blue light, for example (see FIG. 16B). The light colors controlled by the three subpixels are not limited to a combination of red (R), green (G), and blue (B) and may be cyan (C), magenta (M), and yellow (Y) (see FIG. 16C).

Figure 16D:
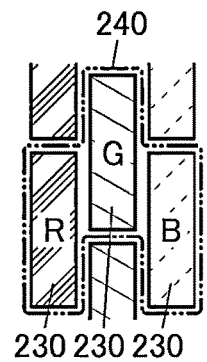

Three display pixels 230 constituting one pixel 240 may be arranged in a delta pattern (see FIG. 16D). Specifically, three pixels 230 constituting one pixel 240 may be arranged such that the lines connecting the center points of the three display pixels 230 form a triangle.

Figure 16E:
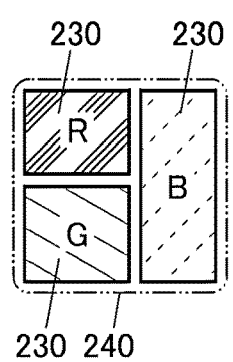

The areas of three subpixels (the pixels 230) are not necessarily the same as one another. For example, in the case where the emission efficiency, reliability, and the like are different depending on emission colors, the areas of three subpixels may be different depending on emission colors (see FIG. 16E). Note that the arrangement of the subpixels illustrated in FIG. 16E may be called "S-stripe RGB arrangement" or "S stripe arrangement", for example.

Figure 16F:
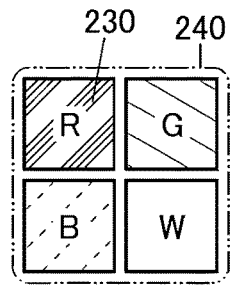
Figure 16G:
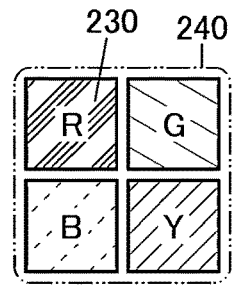
Figure 16H:
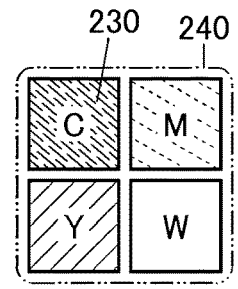

Furthermore, in the pixel 240, four subpixels may collectively function as one pixel. For example, a subpixel that controls white light may be added to the three subpixels that control red light, green light, and blue light (see FIG. 16F). With addition of the subpixel that controls white light, the luminance of a display region in the display apparatus 10 can be increased. Alternatively, a subpixel that controls yellow light may be added to the three subpixels that control red light, green light, and blue light in the pixel 240 (see FIG. 16G). Alternatively, a subpixel that controls white light may be added to the three subpixels that control cyan light, magenta light, and yellow light in the pixel 240, for example, (see FIG. 16H).

When the number of subpixels functioning as one pixel is increased and subpixels that control light of red, green, blue, cyan, magenta, yellow, and the like are used in an appropriate combination in the pixel 240, the reproducibility of halftones can be increased. Consequently, the display quality of the display apparatus of one embodiment of the present invention can be improved.

The display apparatus of one embodiment of the present invention can reproduce the color gamut of various standards. For example, the display apparatus of one embodiment of the present invention can reproduce the color gamut of the following standards: the PAL (Phase Alternating Line)

standard or NTSC (National Television System Committee) standard used for TV broadcasting; the sRGB (standard RGB) standard or Adobe RGB standard used widely for display apparatuses, for example, in electronic devices such as personal computers, digital cameras, and printers; the ITU-R BT.709 (International Telecommunication Union Radiocommunication Sector Broadcasting Service (Television) 709) standard used for HDTV (High Definition Televisions, also referred to Hi-Vision); the DCI-P3 (Digital Cinema Initiatives P3) standard used for digital cinema projection; the ITU-R BT.2020 (REC.2020 (Recommendation 2020)) standard used for UHDTV (Ultra High Definition Television, also referred to as Super Hi-Vision); and the like.

In one embodiment of the present invention, for example, by using the pixels 240 arranged in a matrix of 1920×1080, the display apparatus 10 that can perform full-color display with a resolution of what is called full high resolution (also referred to as "2K resolution", "2K1K", "2K", or the like) can be obtained. For example, in one embodiment of the present invention, by using the pixels 240 arranged in a matrix of 3840×2160, the display apparatus 10 that can perform full-color display with a resolution of what is called ultra-high resolution (also referred to as "4K resolution", "4K2K", "4K", or the like) can be obtained. For example, in one embodiment of the present invention, by using the pixels 240 arranged in a matrix of 7680×4320, the display apparatus 10 that can perform full-color display with a resolution of what is called super high resolution (also referred to as e.g., "8K resolution", "8K4K", "8K", or the like) can be obtained. In one embodiment of the present invention, by increasing the number of pixels 240, the display apparatus 10 that can perform full-color display with 16K or 32K resolution can also be obtained.

The pixel density of the display region 235 is preferably higher than or equal to 100 ppi and lower than or equal to 10000 ppi, and further preferably higher than or equal to 1000 ppi and lower than or equal to 10000 ppi. For example, the pixel density of the display region 235 may be higher than or equal to 2000 ppi and lower than or equal to 6000 ppi, or higher than or equal to 3000 ppi and lower than or equal to 5000 ppi.

Note that there is no particular limitation on the aspect ratio of the display region 235. For example, the display region 235 of the display apparatus 10 is compatible with a variety of aspect ratios such as 1:1 (square), 4:3, 16:9, and 16:10.

The diagonal size of the display region 235 may be greater than or equal to 0.1 inches and less than or equal to 100 inches and may be greater than or equal to 100 inches.

In the case where the display apparatus 10 is used as a display apparatus for virtual reality (VR) or augmented reality (AR), the diagonal size of the display region 235 can be greater than or equal to 0.1 inches and less than or equal to 5.0 inches, preferably greater than or equal to 0.5 inches and less than or equal to 2.0 inches, further preferably greater than or equal to 1 inch and less than or equal to 1.7 inches. For example, the diagonal size of the display region 235 may be 1.5 inches or approximately 1.5 inches. When the display region 235 of the display apparatus 10 has a diagonal size of less than or equal to 2.0 inches, preferably, approximately 1.5 inches, the number of times of light exposure treatment using a light exposure apparatus (typified by a scanner apparatus) can be one; thus, the productivity of a manufacturing process can be improved.

<Circuit Configuration Example of Pixel 230>

Figure 17A:
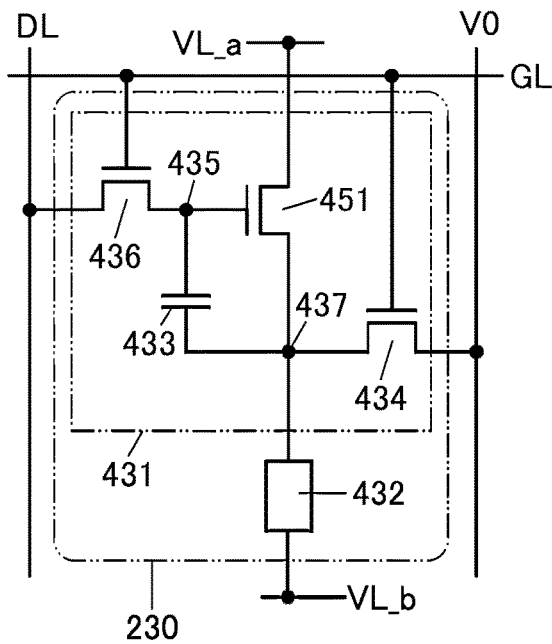
FIG. 17A to FIG. 17D are diagrams each illustrating a structure example of a pixel 230.

FIG. 17A is a diagram illustrating a circuit configuration example of the pixel 230. The pixel 230 includes a pixel circuit 431 and a display element 432.

Accordingly, each of the wirings 236 is electrically connected to the q display pixel circuits 431 arranged in a given row among the display pixel circuits 431 arranged in p rows and q columns in the display region 235. Each of the wirings 237 is electrically connected to the p display pixel circuits 431 arranged in a given column among the display pixel circuits 431 arranged in p rows and q columns.

The pixel circuit 431 includes a transistor 436, a capacitor 433, the transistor 451, and a transistor 434. The pixel circuit 431 is electrically connected to the display element 432.

One of a source electrode and a drain electrode of the transistor 436 is electrically connected to a wiring to which a data signal (also referred to as a "video signal") is supplied (hereinafter referred to as a signal line DL). A gate electrode of the transistor 436 is electrically connected to a wiring to which a gate signal is supplied (hereinafter referred to as a scan line GL). The signal line DL and the scan line GL correspond to the wiring 237 and the wiring 236, respectively. The transistor 436 has a function of controlling the writing of the data signal to a node 435.

One of a pair of electrodes of the capacitor 433 is electrically connected to the node 435, and the other is electrically connected to a node 437. The other of the source electrode and the drain electrode of the transistor 436 is electrically connected to the node 435.

The capacitor 433 has a function of a storage capacitor for storing data written to the node 435.

One of a source electrode and a drain electrode of the transistor 451 is electrically connected to a potential supply line VL_a, and the other is electrically connected to the node 437. Furthermore, a gate electrode of the transistor 451 is electrically connected to the node 435.

One of a source electrode and a drain electrode of the transistor 434 is electrically connected to a potential supply line V0, and the other is electrically connected to the node 437. Furthermore, a gate electrode of the transistor 434 is electrically connected to the scan line GL.

One of an anode and a cathode of the display element 432 is electrically connected to a potential supply line VL_b, and the other is electrically connected to the node 437.

As the display element 432, a light-emitting element (also referred to as a "light-emitting device") such as an organic electroluminescent element (also referred to as an "organic EL element") can be used. However, the display element 432 is not limited thereto. An inorganic EL element formed of an inorganic material may be used for the display element 432, for example. Note that an "organic EL element" and an "inorganic EL element" are collectively referred to as "EL element" in some cases.

The emission color of the EL element can be, for example, white, red, green, blue, cyan, magenta, yellow, or the like depending on materials included in the EL element.

Examples of a method for achieving color display include a method in which the display element 432 whose emission color is white is combined with a coloring layer and a method in which the display elements 432 with different emission colors are provided in the respective pixels. The former method is more productive than the latter method. In contrast, the latter method, which requires separate formation of the display element 432 pixel by pixel, is less productive than the former method. However, the latter method can provide higher color purity of the emission color than the former method. In the latter method, the color purity can be further increased when the display element 432 has a microcavity structure.

The display element 432 can include either a low-molecular compound or a high-molecular compound. In addition, the display element 432 may contain an inorganic compound. The layers included in the display element 432 can each be formed, for example, by a method such as an evaporation method (including a vacuum evaporation method), a transfer method, a printing method, an inkjet method, or a coating method.

The display element 432 may include an inorganic compound such as quantum dots, for example. For example, when used for the light-emitting layer, the quantum dots can function as a light-emitting material.

As a power supply potential, a potential on the relatively high potential side or a potential on the relatively low potential side can be used, for example. A power supply potential on the high potential side is referred to as a high power supply potential (also referred to as "VDD"). A power supply potential on the low potential side is referred to as a low power supply potential (also referred to as "VSS"). A ground potential can be used as the high power supply potential or the low power supply potential. For example, in the case where the high power supply potential is a ground potential, the low power supply potential is a potential lower than the ground potential. In the case where the low power supply potential is a ground potential, the high power supply potential is a potential higher than the ground potential.

For example, a high power supply potential VDD is supplied to one of the potential supply line VL_a and the potential supply line VL_b, and a low power supply potential VSS is supplied to the other, for example.

In the display apparatus including the pixel circuit 431, the pixel circuits 431 are sequentially selected row by row by the circuit included in the peripheral driver circuit, whereby the transistors 436 and the transistors 434 are turned on and a data signal is written to the nodes 435.

When the transistors 436 and the transistors 434 are turned off, the pixel circuits 431 in which the data has been written to the nodes 435 are put into a holding state. The amount of current flowing between the source electrode and the drain electrode of the transistor 451 is determined by the potential of data written to the node 435. The display element 432 emits light with a luminance corresponding to the amount of current flow. This operation is sequentially performed row by row; thus, the display apparatus including the pixel circuit 431 can display an image. The transistor 451 is also referred to as a "driving transistor".

To increase the emission luminance of the light-emitting device included in the pixel 230, the amount of current fed through the light-emitting device needs to be increased. For that purpose, it is necessary to increase the source-drain voltage of a driving transistor included in the pixel circuit 431. The OS transistor has a higher withstand voltage between its source and drain than that of a Si transistor. Therefore, a high voltage can be applied between a source and a drain of the OS transistor. Accordingly, in the light-emitting device included in the pixel 230, when the OS transistor is used as the driving transistor in the pixel circuit 431, the amount of current flowing through the light-emitting device can be increased, so that the emission luminance of the light-emitting device can be increased.

When the OS transistor operates in a saturation region, a change in the amount of the source-drain current with respect to a fluctuation in the gate-source voltage in the OS transistor is smaller than that in the Si transistor. Accordingly, when an OS transistor is used as the driving transistor included in the pixel circuit 431 in the pixel 230, a current flowing between the source and the drain of the driving transistor can be set minutely by a change in a gate-source voltage of the driving transistor; hence, the amount of current flowing through the light-emitting device included in the pixel 230 can be minutely controlled. Thus, in the display apparatus using the pixel 230, the number of gray levels in the pixel 230 can be increased.

Regarding saturation characteristics of current flowing when the OS transistor operates in a saturation region, the OS transistor can make constant current (saturation current) flow more stably than the Si transistor even when the source-drain voltage gradually increases. Thus, by using an OS transistor as the driving transistor, stable current can be fed through a light-emitting device that includes an EL material even in the case where the current-voltage characteristics of the light-emitting device vary, for example. In other words, when the OS transistor operates in the saturation region, the source-drain current hardly changes with an increase in the source-drain voltage. Therefore, in the light-emitting device including OS transistors, the emission luminance of the light-emitting device can be stable.

As described above, in the display apparatus of one embodiment of the present invention, with use of the OS transistor as a driving transistor included in the pixel circuit, it is possible to achieve "inhibition of black floating", "increase in emission luminance", "increase in gray level", "inhibition of variation in light-emitting devices", and the like.

Figure 17B:
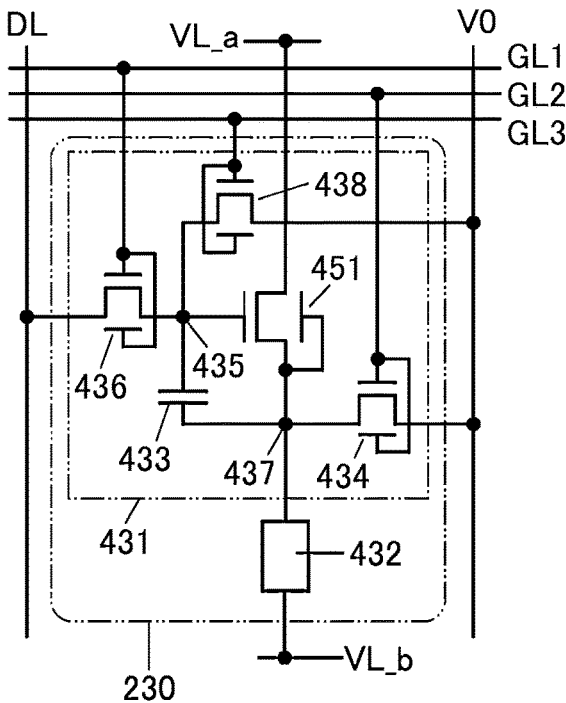

FIG. 17B is a modification example of the circuit configuration of the pixel 230 illustrated in FIG. 17A. In the circuit configuration illustrated in FIG. 17B, the gate electrode of the transistor 436 is electrically connected to a wiring to which a first scan signal is supplied (hereinafter referred to as a scan line GL1). The gate electrode of the transistor 434 is electrically connected to a wiring to which a second scan signal is supplied (hereinafter referred to as a scan line GL2).

The circuit configuration illustrated in FIG. 17B includes a transistor 438 in addition to the circuit configuration illustrated in FIG. 17A. One of a source electrode and a drain electrode of the transistor 438 is electrically connected to a potential supply line V0, and the other is electrically connected to the node 435. A gate electrode of the transistor 438 is electrically connected to a wiring to which a third scan signal is supplied (hereinafter referred to as a scan line GL3).

The scan line GL1 corresponds to the wiring 236 illustrated in FIG. 16A. In FIG. 16A, although the wirings corresponding to the scan line GL2 and the scan line GL3 are not illustrated, the scan line GL2 and the scan line GL3 are electrically connected to the first driver circuit portion 231.

In the case where the pixel 230 illustrated in FIG. 17B performs black display, for example, both the transistor 434 and the transistor 438 are turned on. Thus, the potential of the source electrode of the transistor 451 is equal to that of the gate electrode thereof. In this manner, the gate voltage of the transistor 451 is set to 0 V, so that current flowing through the display element 432 can be blocked in the pixel 230.

Some or all of the transistors included in the pixel circuit 431 may be transistors having back gates. Transistors with a back gate are used as transistors in the circuit configuration illustrated in FIG. 17B. For example, a gate and a back gate is electrically connected to each other in each of the transistor 434, the transistor 436, and the transistor 438. The backgate of the transistor 451 is electrically connected to the node 437.

Figure 17C:
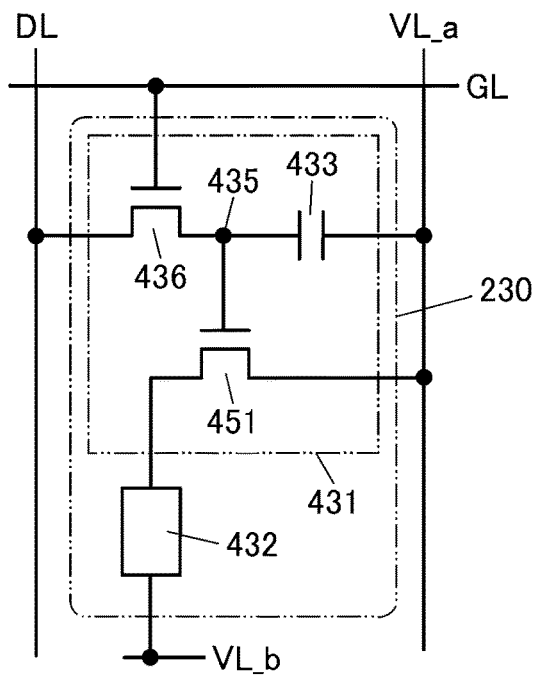

FIG. 17C is a diagram illustrating a modification example of the circuit configuration of the pixel 230 in FIG. 17A. The circuit configuration illustrated in FIG. 17C is a configuration excluding the transistor 434 and the potential supply line V0 in the circuit configuration illustrated in FIG. 17A. For understanding of other components, description of the circuit configuration illustrated in FIG. 17A can be referred to. Therefore, the detailed description of the circuit configuration in FIG. 17C is omitted to reduce repetitive description.

Figure 17D:
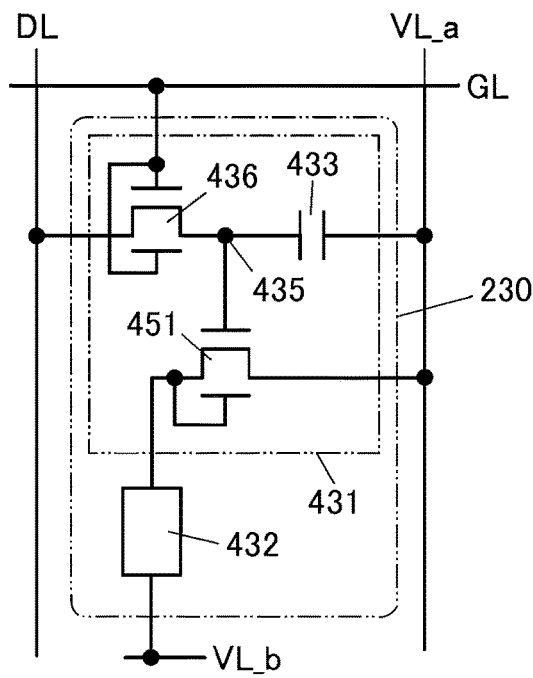

As described above, some or all of the transistors included in the pixel circuit 431 may each be a transistor having a back gate. For example, the transistor 436 may be a transistor having a back gate, and the back gate and the gate of the transistor may be electrically connected to each other in the pixel 230 illustrated in FIG. 17D. Alternatively, the transistor 451 may be a transistor having a back gate, and the back gate and one of the source and the drain of the transistor may be electrically connected to each other.

<Structure Example of Light-Emitting Element>

A light-emitting element (also referred to as light-emitting device) that can be used for a semiconductor device of one embodiment of the present invention will be described.

Figure 18A:
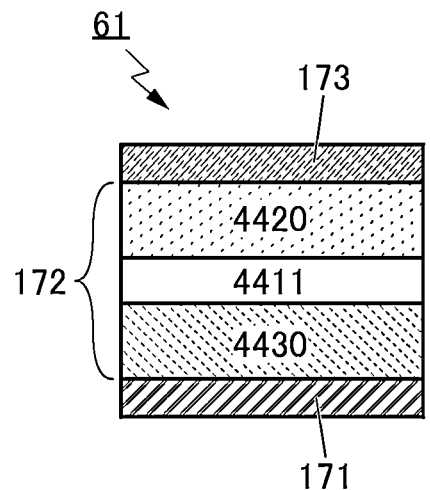
FIG. 18A to FIG. 18D are diagrams illustrating structure examples of a light-emitting element.

As illustrated in FIG. 18A, the light-emitting element 61 includes an EL layer 172 between a pair of electrodes (a conductive layer 171 and a conductive layer 173). The EL layer 172 can be formed of a plurality of layers such as a layer 4420, a light-emitting layer 4411, and a layer 4430, for example. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which are provided between the pair of electrodes, can function as a single light-emitting unit. In this specification and the like, the structure of the structure illustrated in FIG. 18A is referred to as a single structure.

Figure 18B:
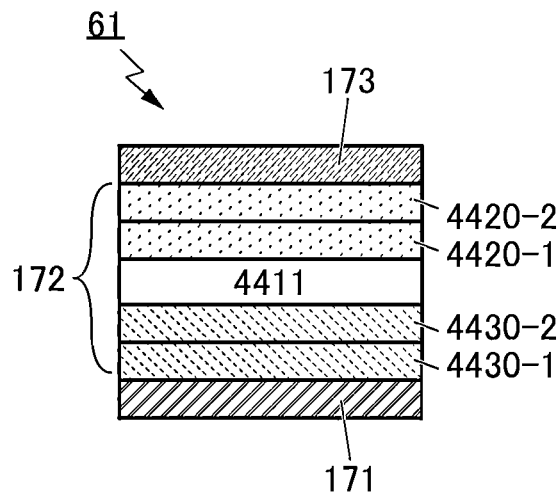

FIG. 18B is a modification example of the EL layer 172 included in the light-emitting element 61 illustrated in FIG. 18A. Specifically, the light-emitting element 61 illustrated in FIG. 18B includes a layer 4430-1 over the conductive layer 171, a layer 4430-2 over the layer 4430-1, the light-emitting layer 4411 over the layer 4430-2, a layer 4420-1 over the light-emitting layer 4411, a layer 4420-2 over the layer 4420-1, and the conductive layer 173 over the layer 4420-2. In the case where the conductive layer 171 serves as an anode and the conductive layer 173 serves as a cathode, for example, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, in the case where the conductive layer 171 is a cathode and the conductive layer 173 is an anode, the layer 4430-1 functions as an electron-injection layer, the layer 4430-2 functions as an electron-transport layer, the layer 4420-1 functions as a hole-transport layer, and the layer 4420-2 functions as a hole-injection layer. In the light-emitting element 61 with such a layered structure, carriers can be efficiently injected to the light-emitting layer 4411, and the efficiency of the recombination of carriers in the light-emitting layer 4411 can be enhanced.

Figure 18C:
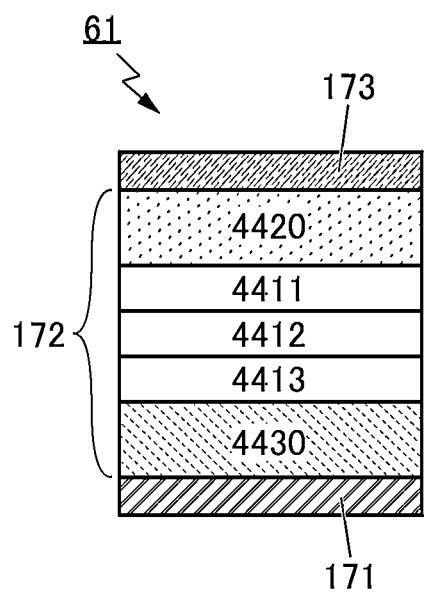

Note that the structure in which a plurality of light-emitting layers (the light-emitting layer 4411, a light-emitting layer 4412, and a light-emitting layer 4413) are provided between the layer 4420 and the layer 4430 as illustrated in FIG. 18C is also an example of the single structure.

Figure 18D:
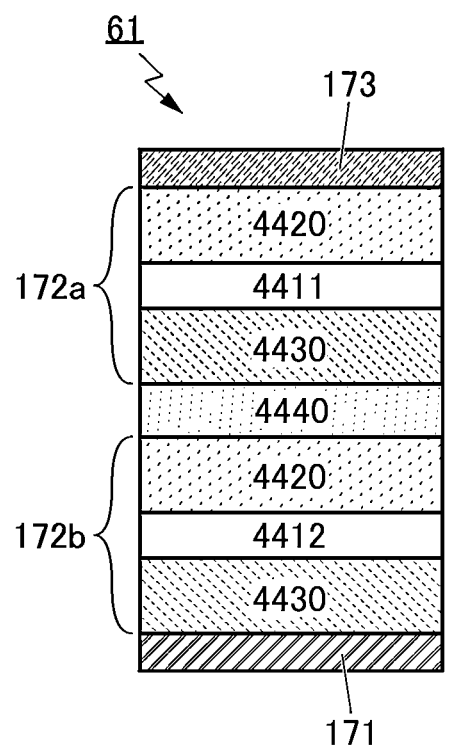

A structure in which a plurality of light-emitting units (an EL layer 172a and an EL layer 172b) are connected in series with an intermediate layer (charge-generation layer) 4440 therebetween as illustrated in FIG. 18D is referred to as a tandem structure or a stack structure in this specification and the like. Note that the tandem structure enables the light-emitting element 61 capable of high-luminance light emission.

In the case where the light-emitting element 61 has the tandem structure illustrated in FIG. 18D, the EL layer 172a and the EL layer 172b may emit light of the same color. For example, the EL layer 172a and the EL layer 172b may both emit green light. Note that in the case where the display region 235 includes three subpixels of R, G, and B and each of the subpixels includes a light-emitting element, the tandem structure may be employed for the light-emitting element of each subpixels. Specifically, the EL layer 172a and the EL layer 172b in the subpixel of Reach contain a material capable of emitting red light. The EL layer 172a and the EL layer 172b in the subpixel of G each contain a material capable of emitting green light. The EL layer 172a and the EL layer 172b in the subpixel of B each contain a material capable of emitting blue light. In other words, the light-emitting layer 4411 and the light-emitting layer 4412 may contain the same material. In the light-emitting element 61 having a tandem structure illustrated in FIG. 18D, when the EL layer 172a and the EL layer 172b emit light of the same color, the current density per unit emission luminance can be reduced. Thus, the reliability of the light-emitting element 61 can be increased.

The emission color of the light-emitting element can be, for example, red, green, blue, cyan, magenta, yellow, white, or the like depending on materials that constitutes the EL layer 172. Furthermore, the color purity can be further increased when the light-emitting element has a microcavity structure.

The light-emitting layer may contain two or more light-emitting substances that emit light of R (red), G (green), B (blue), Y (yellow), or O (orange), for example. The light-emitting element that emits white light preferably contains two or more kinds of light-emitting substances in the light-emitting layer. In the light-emitting element of one embodiment of the present invention, to obtain white light emission with the use of two kinds of light-emitting substances, the two kinds of light-emitting substances may be selected such that their emission colors are complementary colors. For example, in the light-emitting element of one embodiment of the present invention, when an emission color of a first light-emitting substance and an emission color of a second light-emitting substance are complementary colors, it is possible to obtain a light-emitting element which emits white light as a whole. In the light-emitting element of one embodiment of the present invention, to obtain white light emission by using three or more light-emitting substances, the light-emitting element may be configured to emit white light as a whole by combining emission colors of the three or more light-emitting substances.

The light-emitting layer preferably includes two or more of light-emitting substances that emit light of red (R), green (G), blue (B), yellow (Y), orange (O), and the like, for example. Alternatively, the light-emitting layer preferably includes two or more light-emitting substances that each emit light containing two or more of spectral components of R, G, and B.

Examples of a light-emitting substance include a substance that emits fluorescent light (a fluorescent material), a substance that emits phosphorescent light (a phosphorescent material), an inorganic compound (e.g., a quantum dot material and the like), and a substance that exhibits thermally activated delayed fluorescence (a thermally activated delayed fluorescence (TADF) material). Note that as a TADF material, a material that is in a thermal equilibrium state between a singlet excited state and a triplet excited state may be used. Since such a TADF material enables a short emission lifetime (excitation lifetime), an efficiency decrease of a light-emitting element in a high-luminance region can be inhibited.

<Method for Forming Light-Emitting Element>

An example of a method for forming the light-emitting element 61 will be described below.

Figure 19A:
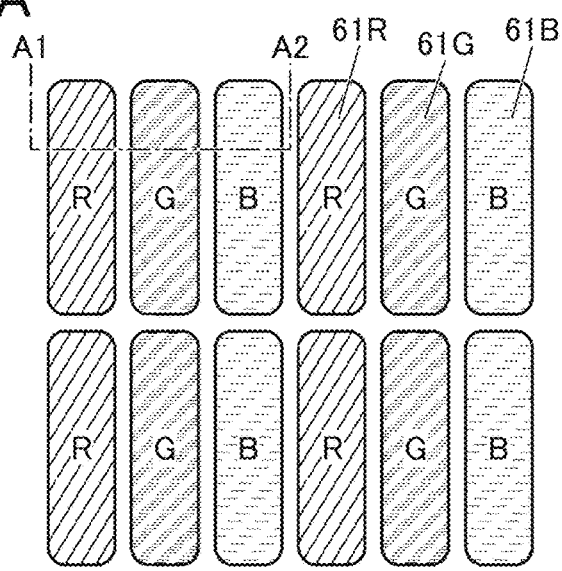
FIG. 19A to FIG. 19D are diagrams illustrating structure examples of a display apparatus.

FIG. 19A is a schematic top view of the light-emitting element 61. Note that in the description in this specification and the like, the light-emitting element 61R exhibiting red, the light-emitting element 61G exhibiting green, and the light-emitting element 61B exhibiting blue are collectively referred to as the light-emitting element 61 in some cases. In FIG. 19A, light-emitting regions of the light-emitting elements are denoted by R, G, and B to easily differentiate the light-emitting elements. Note that the structure of the light-emitting element 61 illustrated in FIG. 19A may be referred to as an SBS (Side By Side) structure. Although FIG. 19A illustrates the structure having the light-emitting element 61 for three colors of red (R), green (G), and blue (B), one embodiment of the present invention is not limited thereto. One embodiment of the present invention may include, for example, a structure including four or more light-emitting elements 61.

The light-emitting elements 61R, the light-emitting elements 61G, and the light-emitting elements 61B are arranged in a matrix. FIG. 19A illustrates what is called a stripe arrangement, in which the light-emitting elements of the same color are arranged in one direction. Note that the arrangement of the light-emitting elements is not limited thereto. Another arrangement such as a delta arrangement or zigzag arrangement may also be used. Furthermore, a PenTile arrangement may be employed for the arrangement of light-emitting elements.

As the light-emitting element 61R, the light-emitting element 61G, and the light-emitting element 61B, an organic EL device such as an OLED (Organic Light Emitting Diode) or a QLED (Quantum-dot Organic Light Emitting Diode) is preferably used, for example. Examples of a light-emitting substance contained in the light-emitting element include a substance emitting fluorescent light (a fluorescent material), a substance emitting phosphorescent light (a phosphorescent material), an inorganic compound (e.g., a quantum dot material), and a substance exhibiting thermally activated delayed fluorescence (a thermally activated delayed fluorescent (TADF) material).

Figure 19B:
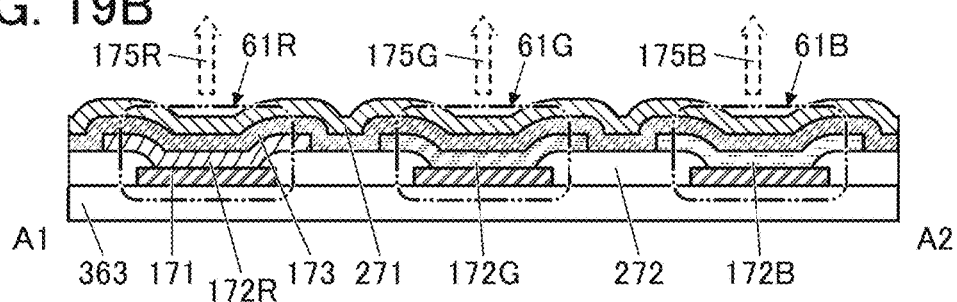

FIG. 19B is a cross-sectional schematic view taken along dashed-dotted line A1-A2 in FIG. 19A. FIG. 19B illustrates cross sections of the light-emitting element 61R, the light-emitting element 61G, and the light-emitting element 61B. The light-emitting element 61R, the light-emitting element 61G, and the light-emitting element 61B are provided over an insulating layer 363. The light-emitting element 61R, the light-emitting element 61G, and the light-emitting element 61B include the conductive layer 171 functioning as a pixel electrode and the conductive layer 173 functioning as a common electrode. As the insulating layer 363, one or both of an inorganic insulating film and an organic insulating film can be used. An inorganic insulating film is preferably used as the insulating layer 363. As the inorganic insulating film, for example, an oxide insulating film or a nitride insulating film such as a silicon oxide film, a silicon oxynitride film, a silicon nitride oxide film, a silicon nitride film, an aluminum oxide film, an aluminum oxynitride film, or a hafnium oxide film can be given.

Note that in this specification, a compound whose oxygen content is higher than nitrogen content is referred to as an oxynitride. In addition, a compound whose nitrogen content is higher than oxygen content is referred to as a nitride oxide. For example, silicon oxynitride refers to a compound that contains more oxygen than nitrogen. For example, silicon nitride oxide refers to a compound that contains more nitrogen than oxygen. The content of each element can be measured by Rutherford backscattering spectrometry (RBS), for example.

The light-emitting element 61R includes an EL layer 172R between the conductive layer 171 functioning as a pixel electrode and the conductive layer 173 functioning as a common electrode. The EL layer 172R contains at least a light-emitting organic compound that emits light with intensity in a red wavelength range. An EL layer 172G included in the light-emitting element 61G contains at least a light-emitting organic compound that emits light with intensity in a green wavelength range. An EL layer 172B included in the light-emitting element 61B contains at least a light-emitting organic compound that emits light with intensity in a blue wavelength range.

The EL layer 172R, the EL layer 172G, and the EL layer 172B may each include one or more of an electron-injection layer, an electron-transport layer, a hole-injection layer, and a hole-transport layer in addition to the layer containing a light-emitting organic compound (the light-emitting layer).

The conductive layer 171 functioning as a pixel electrode is provided in each of the light-emitting elements. The conductive layer 173 functioning as a common electrode is provided as a continuous layer shared by the light-emitting elements. A conductive film having a visible light transmitting property to visible light is used for either the conductive layer 171 functioning as a pixel electrode or the conductive layer 173 functioning as a common electrode, and a reflective conductive film is used for the other. In the display apparatus of one embodiment of the present invention, when the conductive layer 171 functioning as a pixel electrode has a light-transmitting property and the conductive layer 173 functioning as a common electrode has a reflective property, a bottom-emission display apparatus can be obtained. Alternatively, when the conductive layer 171 functioning as a pixel electrode has a reflective property and the conductive layer 173 functioning as a common electrode has a light-transmitting property, a top-emission display apparatus can be obtained. Note that when both the conductive layer 171 functioning as a pixel electrode and the conductive layer 173 functioning as a common electrode have a light-transmitting property, the display apparatus of one embodiment of the present invention can be a dual-emission display apparatus.

For example, in the case where the light-emitting element 61R has a top-emission structure, light 175R is emitted from the light-emitting element 61R to the conductive layer 173 side. In the case where the light-emitting element 61G has a top-emission structure, light 175G is emitted from the light-emitting element 61G to the conductive layer 173 side. In the case where the light-emitting element 61B has a top-emission structure, light 175B is emitted from the light-emitting element 61B to the conductive layer 173 side.

An insulating layer 272 is provided to cover end portions of the conductive layer 171 functioning as a pixel electrode. An end portion of the insulating layer 272 is preferably tapered. For the insulating layer 272, a material similar to the material that can be used for the insulating layer 363 can be used.

The insulating layer 272 is provided to prevent an unintentional electric short-circuit between adjacent light-emitting elements 61R, light-emitting elements 61G, and light-emitting elements 61B and unintended light emission. The insulating layer 272 also has a function of preventing the contact of a metal mask with the conductive layer 171 in the case where the metal mask is used to form the EL layer 172R, the EL layer 172G, and the EL layer 172B.

The EL layer 172R, the EL layer 172G, and the EL layer 172B each include a region in contact with the top surface of the conductive layer 171 functioning as a pixel electrode and a region in contact with the surface of the insulating layer 272. End portions of the EL layer 172R, the EL layer 172G, and the EL layer 172B are positioned over the insulating layer 272.

In the structure illustrated in FIG. 19B, there is a gap between the EL layers of the light-emitting elements that exhibit two different colors. In this manner, the EL layer 172R, the EL layer 172G, and the EL layer 172B are preferably provided so as not to be in contact with each other. This can favorably prevent unintentional light emission (also referred to as crosstalk) from being caused by a current flowing through two adjacent EL layers in the structure. As a result, one embodiment of the present invention can increase the contrast and achieve a display apparatus with high display quality.

The EL layer 172R, the EL layer 172G, and the EL layer 172B can be formed separately by a vacuum evaporation method or the like using a shadow mask such as a metal mask, for example. Alternatively, these layers may be formed separately by a photolithography method. In one embodiment of the present invention, the use of the photolithography method achieves a high-definition display apparatus, which is difficult to obtain in the case of using a metal mask.

In this specification and the like, a device formed using a metal mask or an FMM (fine metal mask, high-resolution metal mask) may be referred to as a device having an MM (metal mask) structure. In this specification and the like, a device fabricated without using a metal mask or an FMM may be referred to as a device having an MML (metal maskless) structure. A display apparatus having an MML structure is fabricated without using a metal mask and thus has higher flexibility in designing the pixel arrangement, the pixel shape, and the like than a display apparatus having an MM structure.

A protective layer 271 is provided over the conductive layer 173 functioning as a common electrode so as to cover the light-emitting element 61R, the light-emitting element 61G, and the light-emitting element 61B. The protective layer 271 has a function of preventing diffusion of e.g., impurities such as water into the light-emitting elements from above.

The protective layer 271 can have, for example, a single-layer structure or a stacked-layer structure at least including an inorganic insulating film. As the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide (IGZO) may be used for the protective layer 271, for example. Note that the protective layer 271 is formed by an ALD method, a CVD method, or a sputtering method, for example. Although the protective layer 271 includes an inorganic insulating film in this example, one embodiment of the present invention is not limited thereto. For example, the protective layer 271 may have a stacked-layer structure of an inorganic insulating film and an organic insulating film.

In the case where an indium gallium zinc oxide is used as the protective layer 271, the indium gallium zinc oxide can be processed by a wet etching method or a dry etching method. For example, in the case where IGZO is used as the protective layer 271, a chemical solution of e.g., oxalic acid, phosphoric acid, a mixed chemical solution (e.g., a mixed chemical solution of phosphoric acid, acetic acid, nitric acid, and water, which is also referred to as a mixed acid aluminum etchant), or the like can be used for processing. Note that the volume ratio of phosphoric acid, acetic acid, nitric acid, and water mixed in the mixed acid aluminum etchant can be 53.3:6.7:3.3:36.7 or in the neighborhood thereof.

Figure 19C:
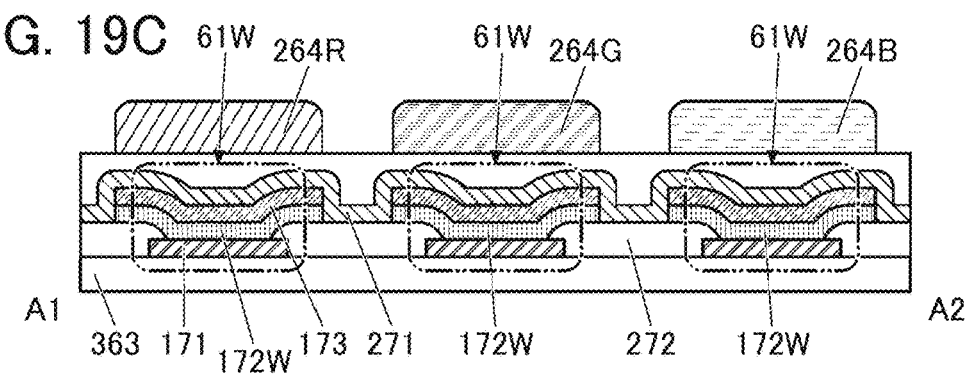

FIG. 19C illustrates an example different from the above. Specifically, in FIG. 19C, light-emitting elements 61W that emit white light are provided. The light-emitting elements 61W each include an EL layer 172W that emits white light between the conductive layer 171 functioning as a pixel electrode and the conductive layer 173 functioning as a common electrode.

The EL layer 172W can have, for example, a structure in which two light-emitting layers that are selected so as to emit light of complementary colors are stacked. It is also possible to use a stacked EL layer in which a charge-generation layer is interposed between light-emitting layers.

FIG. 19C illustrates three light-emitting elements 61W arranged side by side. The coloring layer 264R is provided above the light-emitting element 61W on the left. The coloring layer 264R functions as a band path filter that transmits red light. Similarly, a coloring layer 264G that transmits green light is provided above the light-emitting element 61W in the middle. Similarly, a coloring layer 264B that transmits blue light is provided above the light-emitting element 61W on the right. In this manner, the display apparatus can display an image with colors.

Here, the EL layer 172W and the conductive layer 173 functioning as a common electrode are each separated between two adjacent light-emitting elements 61W of the light-emitting elements 61W. This can prevent unintentional light emission from being caused by current flowing through the EL layers 172W of two adjacent light-emitting elements 61W of the light-emitting elements 61W. Particularly when a stack-type EL layer in which a charge-generation layer is provided between two light-emitting layers is used as the EL layer 172W, in the display device including the EL element, crosstalk is more significant as the definition increases, i.e., as the distance between adjacent pixels decreases, leading to lower contrast. Thus, the above structure of one embodiment of the present invention can achieve a display apparatus having both high definition and high contrast.

The EL layer 172W and the conductive layer 173 functioning as a common electrode are each preferably separated by a photolithography method. Thus, the distance between light-emitting elements can be decreased in accordance with one embodiment of the present invention, and thus a display apparatus with a higher aperture ratio than a display apparatus formed using, for example, a shadow mask such as a metal mask can be achieved.

Note that in the case of a bottom-emission light-emitting element, a coloring layer may be provided between the conductive layer 171 functioning as a pixel electrode and the insulating layer 363 in the display apparatus of one embodiment of the present invention.

Figure 19D:
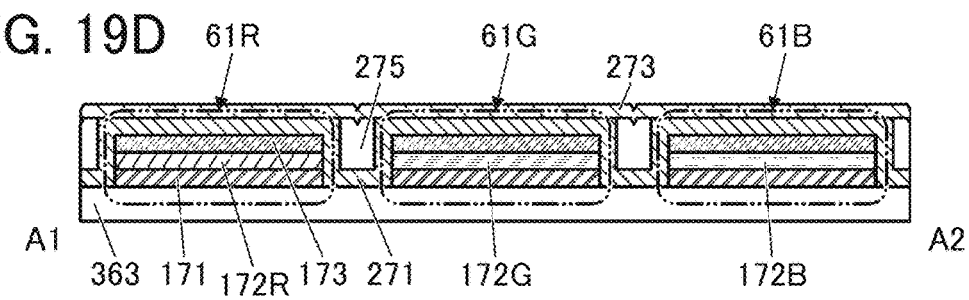

FIG. 19D illustrates an example different from the above. Specifically, in FIG. 19D, the insulating layers 272 are not provided between the light-emitting element 61R, the light-emitting element 61G, and the light-emitting element 61B. The display apparatus according to one embodiment of the present invention can have a structure with a high aperture ratio. When the insulating layer 272 is not provided, unevenness formed by the light-emitting elements 61 can be reduced, thereby improving the viewing angle of the display apparatus of one embodiment of the present invention. Specifically, the viewing angle of the display apparatus can be greater than or equal to 150° and less than 180°, preferably greater than or equal to 160° and less than 180°, further preferably greater than or equal to 160° and less than 180°.

The protective layer 271 covers the side surfaces of the EL layer 172R, the EL layer 172G, and the EL layer 172B. With this structure, the protective layer 271 can inhibit impurities (typically, water or the like) from entering the EL layer 172R, the EL layer 172G, and the EL layer 172B through their side surfaces. In addition, by employing the structure for the display apparatus of one embodiment of the present invention, leak current between adjacent light-emitting elements 61 is reduced, so that color saturation and contrast ratio are improved and power consumption is reduced.

In the structure illustrated in FIG. 19D, the top shapes of the conductive layer 171, the EL layer 172R, and the conductive layer 173 are substantially the same. This structure can be formed in the following manner: the conductive layer 171, the EL layer 172R, and the conductive layer 173 are formed and collectively processed using a resist mask or the like, for example. In this process, the EL layer 172R and the conductive layer 173 are processed using the conductive layer 173 as a mask, and thus this process can be called self-alignment patterning. Although the EL layer 172R is described here, the EL layer 172G and the EL layer 172B can each have a similar structure.

Furthermore, in FIG. 19D, the protective layer 273 is provided over the protective layer 271. For example, the protective layer 271 is formed with an apparatus that can deposit a film with excellent coverage (typically, an ALD apparatus), and the protective layer 273 is formed with an apparatus that can deposit a film with coverage inferior to that of the protective layer 271 (typically, a sputtering apparatus). Thus, the region 275 can be provided between the protective layer 271 and the protective layer 273. In other words, the regions 275 are positioned between the EL layer 172R and the EL layer 172G and between the EL layer 172G and the EL layer 172B.

Note that the region 275 includes, for example, one or more of air, nitrogen, oxygen, carbon dioxide, and Group 18 elements (typically, helium, neon, argon, xenon, krypton, and the like). Furthermore, for example, a gas used during deposition of the protective layer 273 is sometimes included in the region 275. For example, in the case where the protective layer 273 is deposited using a sputtering method, any one or more of the above-described Group 18 elements is sometimes included in the region 275. In the case where a gas is included in the region 275, the gas can be identified with a gas chromatography method or the like. Alternatively, in the case where the protective layer 273 is formed using a sputtering method, a gas used in the sputtering is sometimes contained in the protective layer 273. In this case, for example, an element such as argon is sometimes detected when the protective layer 273 is analyzed by an energy dispersive X-ray analysis (EDX analysis) or the like, for example.

In the case where the refractive index of the region 275 is lower than the refractive index of the protective layer 271, light emitted from the EL layer 172R, the EL layer 172G, or the EL layer 172B is reflected at the interface between the protective layer 271 and the region 275. Thus, in the region 275, light emitted from the EL layer 172R, the EL layer 172G, or the EL layer 172B can be inhibited from entering an adjacent pixel in some cases. This can inhibit color mixture of light emitted from adjacent pixels in the region 275 and thus can improve the display quality of the display apparatus.

In the case of the structure illustrated in FIG. 19D, a region between the light-emitting element 61R and the light-emitting element 61G or a region between the light-emitting element 61G and the light-emitting element 61B (hereinafter, simply referred to as a distance between the light-emitting elements) can be small. Specifically, the distance between the light-emitting elements can be less than or equal to 1 µm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus includes a region where an interval between the side surface of the EL layer 172R and the side surface of the EL layer 172G or an interval between the side surface of the EL layer 172G and the side surface of the EL layer 172B is less than or equal to 1 µm, preferably less than or equal to 0.5 µm (500 nm), further preferably less than or equal to 100 nm.

In the structure, in the case where the region 275 includes a gas, for example, the light-emitting elements can be isolated from each other and color mixture of light from the light-emitting elements, crosstalk, or the like can be inhibited.

Alternatively, the region 275 may be filled with a filler. Examples of the filler include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. Alternatively, a photoresist may be used as the filler. The photoresist used as the filler may be a positive photoresist or a negative photoresist.

When the white-light-emitting device (having a single structure or a tandem structure) and a light-emitting device having an SBS structure are compared to each other, the light-emitting device having an SBS structure can have lower power consumption than the white-light-emitting device. Therefore, in the display apparatus of one embodiment of the present invention, a light-emitting device having an SBS structure is preferably used to reduce power consumption. Meanwhile, the manufacturing process of the white-light-emitting device is simpler than that of a light-emitting device having an SBS structure. Therefore, the display apparatus of one embodiment of the present invention is suitably used for the white-light-emitting device, in which case the manufacturing cost can be lowered or the manufacturing yield can be increased.

Figure 20A:
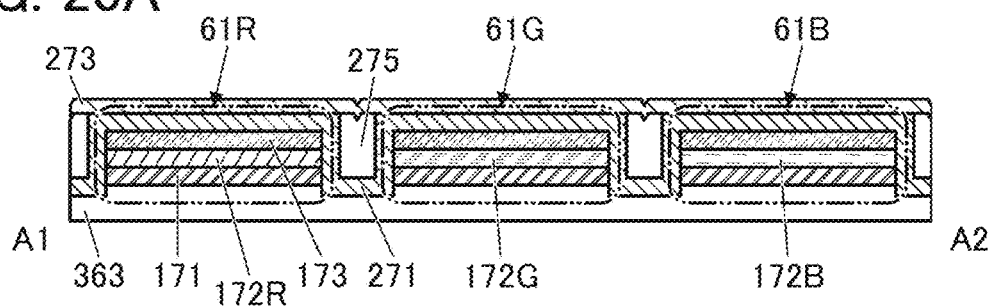
FIG. 20A to FIG. 20D are diagrams illustrating structure examples of a display apparatus.

FIG. 20A illustrates an example different from the above. Specifically, the structure illustrated in FIG. 20A is different from the structure illustrated in FIG. 19D in the structure of the insulating layer 363. The insulating layer 363 has a recessed portion in its top surface that is formed by being partially etched when the light-emitting element 61R, the light-emitting element 61G, and the light-emitting element 61B are processed. The protective layer 271 is formed in the recessed portion. In other words, in the cross-sectional view, the insulating layer 363 includes a region in which the bottom surface of the protective layer 271 is positioned below the bottom surface of the conductive layer 171. The insulating layer 363 having the region can suitably inhibit impurities (typically, water or the like) from entering the light-emitting element 61R, the light-emitting element 61G, and the light-emitting element 61B from the bottom. It is likely that the recessed portion can be formed when impurities (also referred to as residue) that could be attached to the side surfaces of the light-emitting element 61R, the light-emitting element 61G, and the light-emitting element 61B in processing of the light-emitting elements are removed by wet etching or the like, for example. In the display apparatus of one embodiment of the present invention, after the residue is removed, the side surfaces of the light-emitting elements are covered with the protective layer 271, whereby a highly reliable display apparatus can be provided.

Figure 20B:
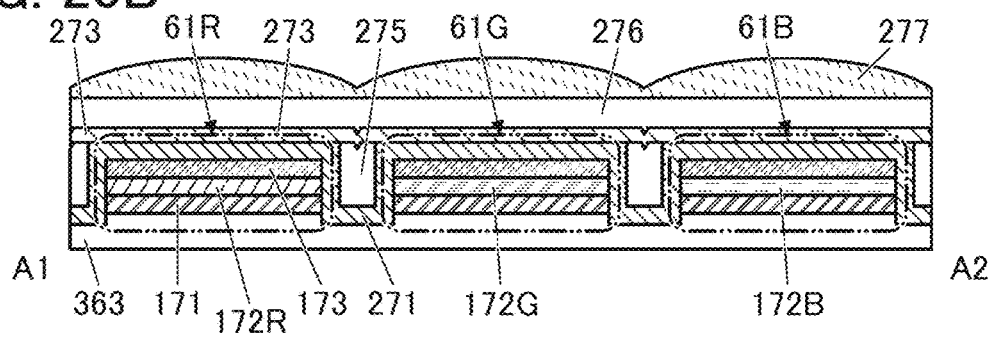

FIG. 20B illustrates an example different from the above. Specifically, the structure illustrated in FIG. 20B includes an insulating layer 276 and a microlens array 277 in addition to the structure illustrated in FIG. 20A. The insulating layer 276 functions as an adhesive layer. Note that when the refractive index of the insulating layer 276 is lower than the refractive index of the microlens array 277, the microlens array 277 can condense light emitted from the light-emitting element 61R, the light-emitting element 61G, and the light-emitting element 61B. Thus, the structure can increase the light extraction efficiency of the display apparatus. In particular, this is suitable, because a user can see bright images when the user sees the display surface from the front of the display surface of the display apparatus. As the insulating layer 276, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable, for example. A two-liquid-mixture-type resin may be used. An adhesive sheet may be used, for example.

Figure 20C:
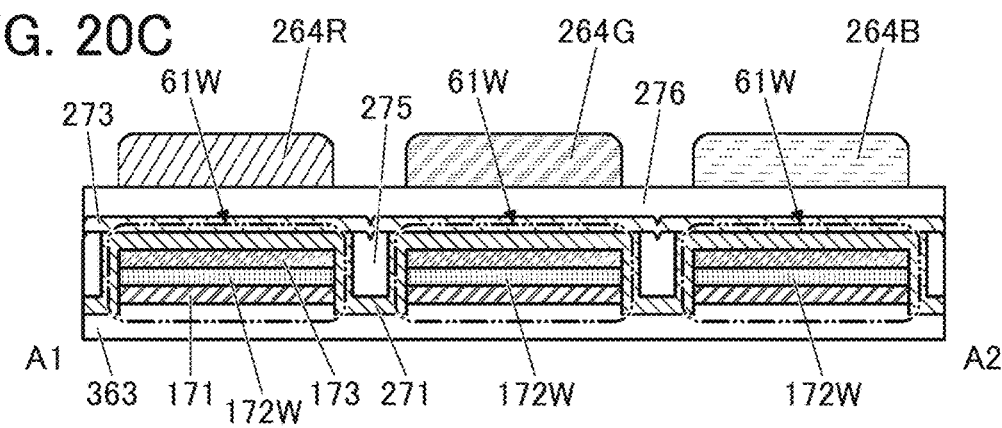

FIG. 20C illustrates an example different from the above. Specifically, the structure illustrated in FIG. 20C includes three light-emitting elements 61W instead of the light-emitting element 61R, the light-emitting element 61G, and the light-emitting element 61B in the structure illustrated in FIG. 20A. In addition, the structure includes the insulating layer 276 over the three light-emitting elements 61W. The structure also includes the coloring layer 264R, the coloring layer 264G, and the coloring layer 264B over the insulating layer 276. Specifically, the coloring layer 264R that transmits red light is provided at a position overlapping with the light-emitting element 61W on the left. The coloring layer 264G that transmits green light is provided at a position overlapping with the light-emitting element 61W in the middle. The coloring layer 264B that transmits blue light is provided at a position overlapping with the light-emitting element 61W on the right. Thus, the display apparatus can display a color image. The structure illustrated in FIG. 20C is also a modification example of the structure illustrated in FIG. 19C.

Figure 20D:
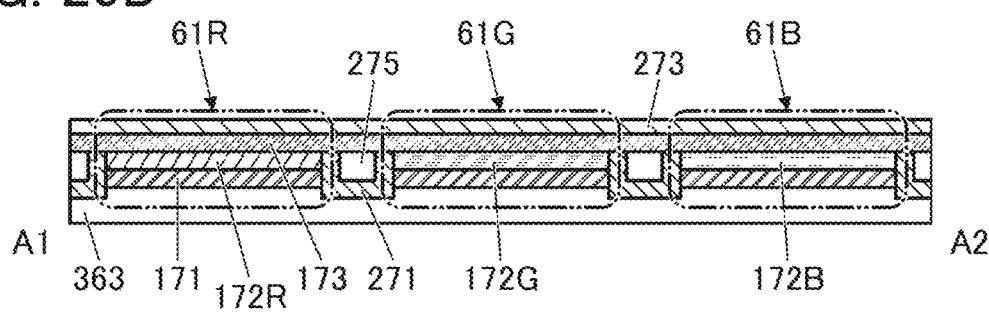

FIG. 20D illustrates an example different from the above. Specifically, in the structure illustrated in FIG. 20D, the protective layer 271 is provided adjacent to the side surfaces of the conductive layer 171 and the EL layer 172. The conductive layer 173 is provided as a continuous layer shared by the light-emitting elements. In the structure illustrated in FIG. 20D, the region 275 is preferably filled with a filler.

A color purity of the emission color can be increased when the light-emitting element 61 of one embodiment of the present invention has a micro-optical resonator (microcavity) structure. In the case where the light-emitting element 61 has a microcavity structure, the light-emitting element may be configured in such a manner that a product of a distance d between the conductive layer 171 and the conductive layer 173 and a refractive index n of the EL layer 172 (optical distance) is set to m times as large as ½ of a wavelength λ (m is an integer greater than or equal to 1). The distance d can be obtained by Formula 1.

$$d = m \times \lambda / (2 \times n) \tag{Formula 1}$$

According to Formula 1, in the light-emitting element 61 having the microcavity structure, the distance d is determined in accordance with the wavelength (emission color) of emitted light. The distance d corresponds to the thickness of the EL layer 172. Thus, the EL layer 172G is provided to have a larger thickness than the EL layer 172B, and the EL layer 172R is provided to have a larger thickness than the EL layer 172G, in some cases.

Note that to be exact, the distance d is a distance from a reflection region in the conductive layer 171 functioning as a reflective electrode to a reflection region in the conductive layer 173 functioning as a transflective electrode. For example, in the case where the conductive layer 171 is a stack of silver and ITO that is a transparent conductive film and the ITO is positioned on the EL layer 172 side, the distance d suitable for the emission color can be set by adjusting the thickness of the ITO. That is, even when the EL layer 172R, the EL layer 172G, and the EL layer 172B have the same thickness, the distance d suitable for the emission color can be obtained by adjusting the thickness of the ITO.

However, it is sometimes difficult to determine the exact position of the reflection region in each of the conductive layer 171 and the conductive layer 173. In that case, the light-emitting element can obtain a sufficient effect of the microcavity, supposed that a certain position in each of the conductive layer 171 and the conductive layer 173 serves as the reflective region.

The light-emitting element 61 includes a hole-injection layer, a hole-transport layer, a light-emitting layer, an electron-transport layer, an electron-injection layer, and the like, for example. Note that a specific structure example of the light-emitting element 61 will be described in another embodiment. In order to increase the outcoupling efficiency in the microcavity structure in the light-emitting element 61, the optical path length from the conductive layer 171 functioning as a reflective electrode to the light-emitting layer is preferably set to an odd multiple of λ/4. In order to achieve this optical path length in the light-emitting element 61, the thicknesses of the layers included in the light-emitting element 61 are preferably adjusted as appropriate.

In the case where light is emitted from the conductive layer 173 side, the light reflectance of the conductive layer 173 is preferably higher than the light transmittance thereof. The light transmittance of the conductive layer 173 is preferably higher than or equal to 2% and lower than or equal to 50%, further preferably higher than or equal to 2% and lower than or equal to 30%, still further preferably higher than or equal to 2% and lower than or equal to 10%. When the transmittance of the conductive layer 173 is set low (the light reflectance is set high), the effect of the microcavity of the light-emitting element 61 can be enhanced.

Figure 21A:
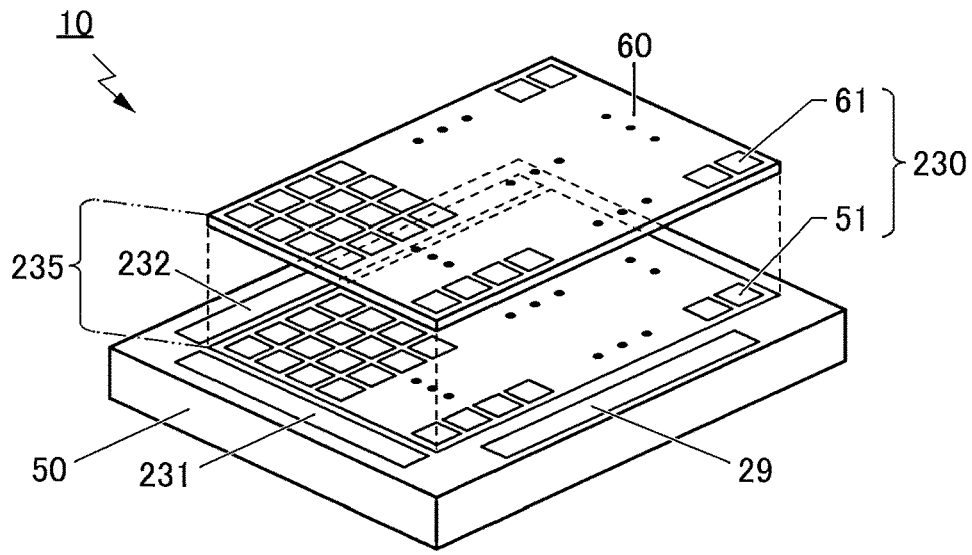
FIG. 21A and FIG. 21B are perspective views of a display apparatus.

FIG. 21A is a schematic perspective view of the display apparatus 10. The display apparatus 10 illustrated in FIG. 21A includes a layer 60 overlapping with a layer 50. The layer 50 includes a plurality of pixel circuits 51 arranged in a matrix, the first driver circuit portion 231, the second driver circuit portion 232, and an input/output terminal portion 29. The layer 60 includes the plurality of light-emitting elements 61 arranged in a matrix.

One pixel circuit 51 and one light-emitting element 61 are electrically connected to each other and function as one pixel 230. Thus, a region where the plurality of pixel circuits 51 included in the layer 50 and the plurality of light-emitting elements 61 included in the layer 60 overlap with each other functions as the display region 235.

For example, power, a signal, and the like necessary for the operation of the display apparatus 10 are supplied to the display apparatus 10 through the input/output terminal portion 29. In the display apparatus 10 illustrated in FIG. 21A, the transistors included in the peripheral driver circuit can be formed in the same steps as the transistors included in the pixels 230.

Figure 21B:
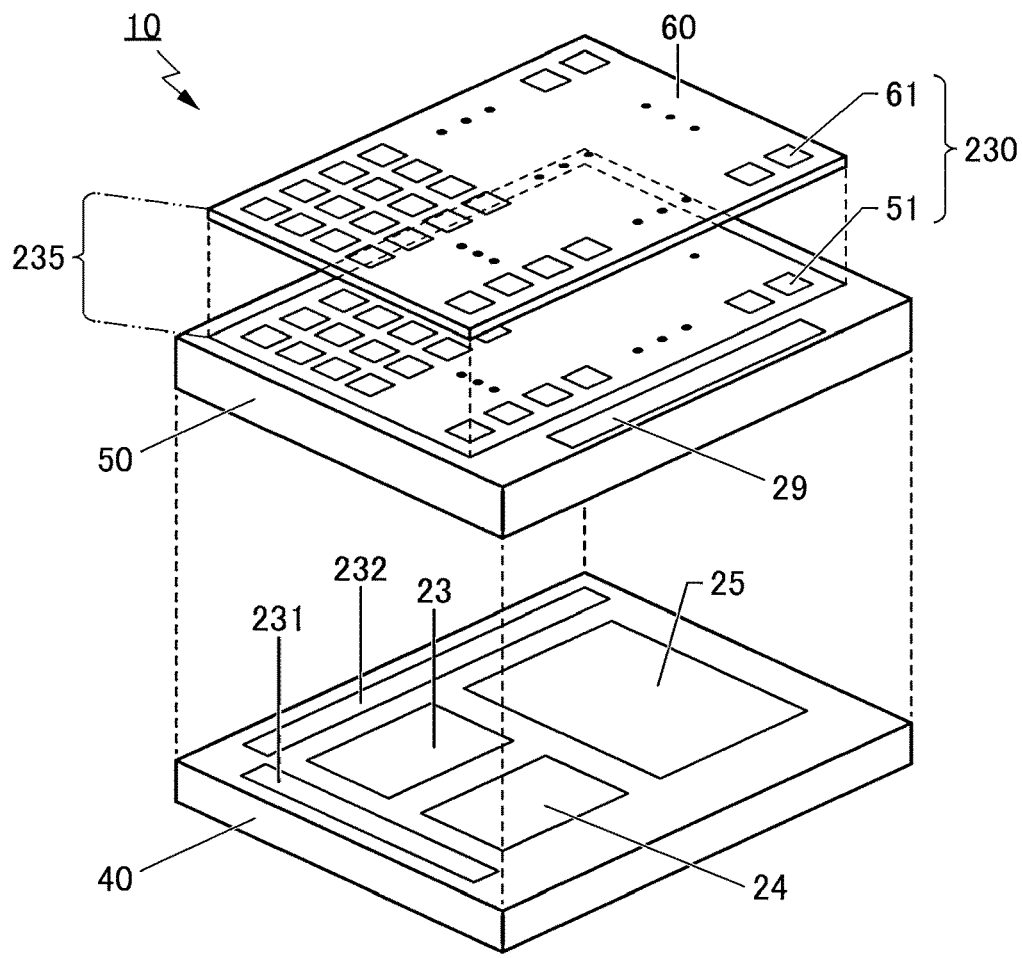

The display apparatus 10 may have a structure illustrated in FIG. 21B in which a layer 40, the layer 50, and the layer 60 are provided to overlap with one another. In the display apparatus 10 in FIG. 21B, the plurality of pixel circuits 51 arranged in a matrix are provided in the layer 50, and the first driver circuit portion 231 and the second driver circuit portion 232 are provided in the layer 40. By providing the first driver circuit portion 231 and the second driver circuit portion 232 in a layer different from that of the pixel circuit 51 in the display apparatus 10, the bezel width around the display region 235 can be small; thus, the area occupied by the display region 235 can be increased.

The display region 235 having an increased occupied area can increase the resolution. Under a fixed resolution of the display region 235 having an increased occupied area, the occupation area per pixel can be increased; thus, the emission luminance can be increased. In addition, the proportion of the light-emitting region to the area occupied by one pixel (also referred to as "aperture ratio") can be increased by enlarging the area occupied by one pixel. For example, the pixel aperture ratio can be greater than or equal to 40% and less than 100%, preferably greater than or equal to 50% and less than or equal to 95%, further preferably greater than or equal to 60% and less than or equal to 95%. An increase in the occupation area per pixel can lower the density of current supplied to the light-emitting elements 61. Thus, a load applied to the light-emitting element 61 is reduced. Thus, the reliability of the semiconductor device of one embodiment of the present invention can be increased. Thus, the reliability of the display apparatus 10 including the semiconductor device of one embodiment of the present invention can be increased.

Stacking the display region 235, the peripheral driver circuit, and the like can shorten a wiring electrically connecting them. Thus, wiring resistance and parasitic capacitance are reduced. Moreover, the semiconductor device of one embodiment of the present invention can have a higher operation speed. The semiconductor device of one embodiment of the present invention is reduced in power consumption.

The layer 40 may include a CPU 23 (Central Processing Unit), a GPU 24 (Graphics Processing Unit), and a memory circuit portion 25, in addition to the peripheral driver circuit. In this embodiment and the like, a peripheral driver circuit, a CPU 23, a GPU 24, and a memory circuit portion 25 are collectively referred to as a "functional circuit" in some cases.

For example, the CPU 23 has a function of controlling the operations of the GPU 24 and the circuits provided in the layer 40 in accordance with a program stored in the memory circuit portion 25. The GPU 24 has a function of performing arithmetic processing for generating image data. Furthermore, the GPU 24 can perform a large number of matrix operations (product-sum operations) in parallel and thus can perform arithmetic processing using a neural network at high speed, for example. The GPU 24 has a function of correcting image data using correction data stored in the memory circuit portion 25, for example. The GPU 24 has a function of generating image data in which one or more of brightness, hue, contrast, and the like are corrected, for example.

Upconversion or downconversion of image data may be performed using the GPU 24 in the display apparatus 10. A super-resolution circuit may be provided in the layer 40 in the display apparatus 10. The super-resolution circuit has a function of determining a potential of any pixel included in the display region 235 by product-sum operation of weights and potentials of pixels placed in the periphery of the pixel. The super-resolution circuit has a function of upconverting image data with a lower resolution than that of the display region 235. The super-resolution circuit has a function of downconverting image data with a higher resolution than that of the display region 235.

Providing the super-resolution circuit can reduce the load on the GPU 24 in the display apparatus 10. For example, the GPU 24 executes processing up to 2K resolution (or 4K resolution) and the super-resolution circuit performs upconversion to 4K resolution (or 8K resolution), whereby the load on the GPU 24 can be reduced. Downconversion may be performed in a similar manner.

Note that the functional circuit included in the layer 40 does not necessarily include all of these components, and may include another component. For example, one or more of a potential generation circuit that generates a plurality of different potentials, a power management circuit that controls supply or stop of power for each circuit included in the display apparatus 10, and the like may be provided.

The supply or stop of electrical power may be performed per circuit included in the CPU 23. For example, power consumption can be reduced by stopping power supply to a circuit, which is determined not to be used for a while, of the circuits included in the CPU 23 and restarting power supply to the circuit as needed. Data necessary for restarting power supply is stored in e.g., a memory circuit in the CPU 23, the memory circuit portion 25, or the like before the circuit is stopped. The CPU 23 stores data necessary for recovery of the circuit, and can achieve high-speed recovery of the circuit stopped. Note that supply of a clock signal may be stopped by the CPU 23 to stop the circuit operation.

As the functional circuit, a DSP circuit, a sensor circuit, a communication circuit, an FPGA (Field Programmable Gate Array), and/or the like may be included, for example.

Some of the transistors in the functional circuit included in the layer 40 may be provided in the layer 50. Moreover, some of the transistors in the pixel circuits 51 included in the layer 50 may be provided in the layer 40. Thus, the functional circuit may include a Si transistor and an OS transistor. In addition, the pixel circuits 51 may each include the Si transistor and the OS transistor.

Figure 22:
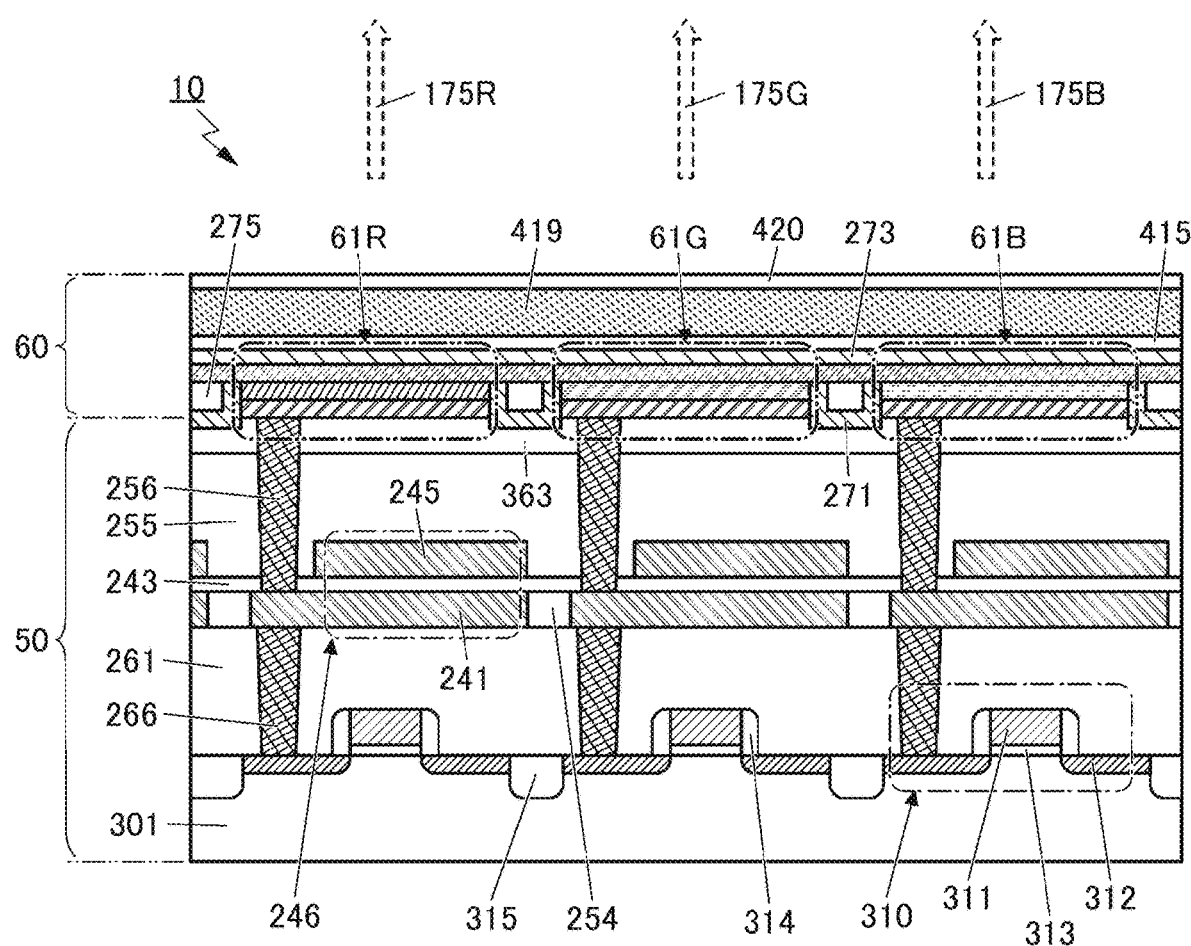
FIG. 22 is a cross-sectional view illustrating an example of a display apparatus.

FIG. 22 illustrates a cross-sectional structure example of part of the display apparatus 10 illustrated in FIG. 21A. The display apparatus 10 illustrated in FIG. 22 includes the layer 50 including a substrate 301, a capacitor 246, and a transistor 310 and the layer 60 including the light-emitting element 61R, the light-emitting element 61G, and the light-emitting element 61B. The layer 60 is provided over the insulating layer 363 included in the layer 50.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover the side surface of the conductive layer 311 and functions as an insulating layer.

In addition, an element isolation layer 315 is provided between two adjacent transistors 310 to be embedded in the substrate 301.

The insulating layer 261 is provided to cover the transistor 310. The capacitor 246 is provided over the insulating layer 261.

The capacitor 246 includes a conductive layer 241, a conductive layer 245, and an insulating layer 243 positioned therebetween. The conductive layer 241 functions as one electrode of the capacitor 246. The conductive layer 245 functions as the other electrode of the capacitor 246 and the insulating layer 243 functions as a dielectric of the capacitor 246.

The conductive layer 241 is provided over the insulating layer 261 and is embedded in an insulating layer 254. The conductive layer 241 is electrically connected to one of the source and the drain of the transistor 310 through a plug 266 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255 is provided to cover the capacitor 246. The insulating layer 363 is provided over the insulating layer 255. The light-emitting element 61R, the light-emitting element 61G, and the light-emitting element 61B are provided over the insulating layer 363. A protective layer 415 is provided over the light-emitting element 61R, the light-emitting element 61G, and the light-emitting element 61B. A substrate 420 is provided over the top surface of the protective layer 415 with a resin layer 419 therebetween.

The pixel electrode of the light-emitting element is electrically connected to one of the source and the drain of the transistor 310 through a plug 256 embedded in the insulating layer 255 and the insulating layer 363, the conductive layer 241 embedded in the insulating layer 254, and the plug 266 embedded in the insulating layer 261.

Figure 23:
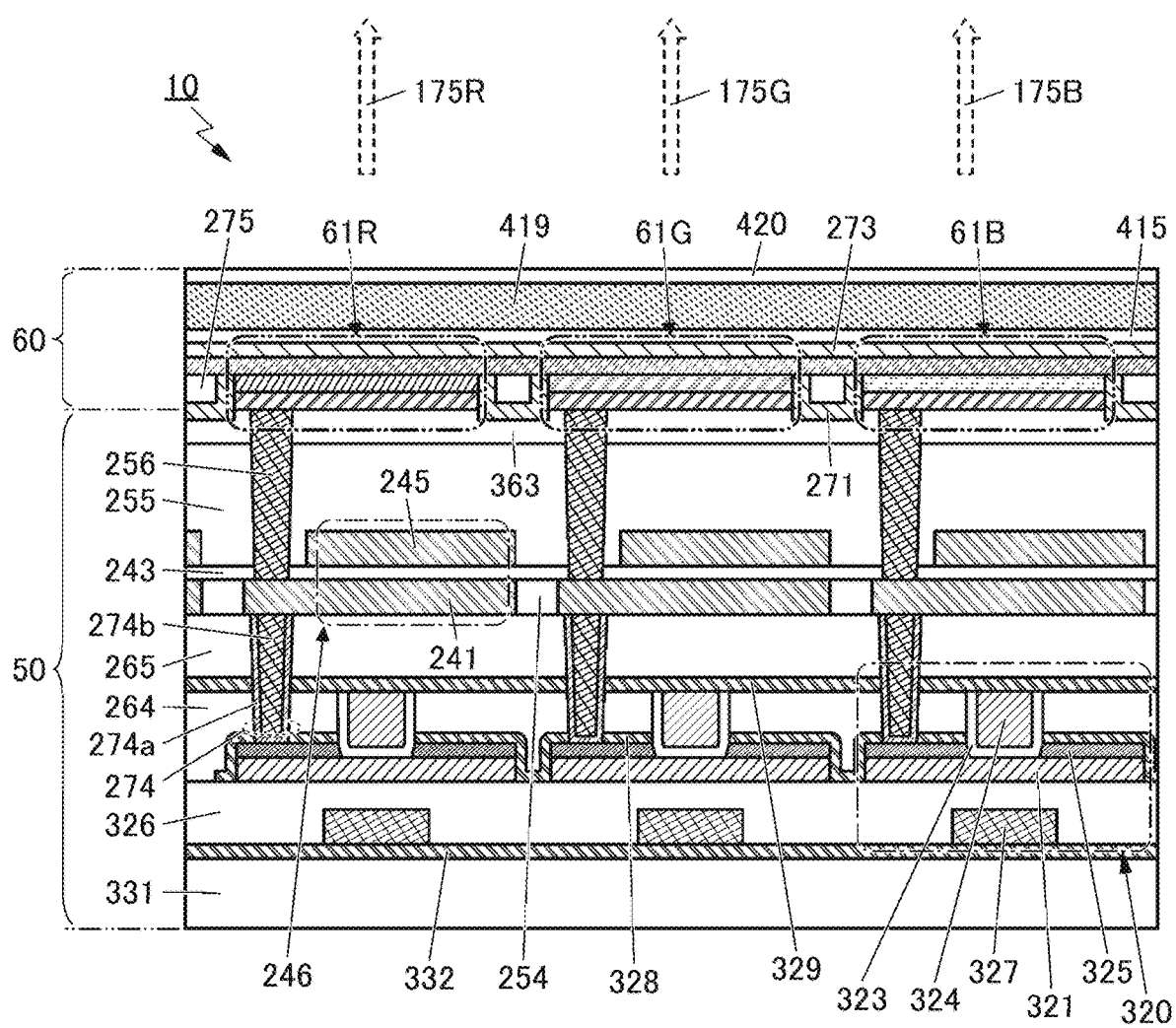
FIG. 23 is a cross-sectional view illustrating an example of a display apparatus.

FIG. 23 is a modification example of the cross-sectional structure example illustrated in FIG. 22. The cross-sectional structure example of the display apparatus 10 illustrated in FIG. 23 is different from the cross-sectional structure example illustrated in FIG. 22 mainly in that a transistor 320 is provided instead of the transistor 310. Note that description of portions similar to those in FIG. 22 is sometimes omitted.

A transistor 320 is a transistor that includes a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

As the substrate 331, an insulating substrate or a semiconductor substrate can be used.

An insulating layer 332 is provided over the substrate 331. The insulating layer 332 functions, for example, as a barrier layer that prevents diffusion of impurities such as water or hydrogen from the substrate 331 into the transistor 320 and release of oxygen from the semiconductor layer 321 to the insulating layer 332 side. As the insulating layer 332, for example, a film through which hydrogen or oxygen is less likely to diffuse than through a silicon oxide film. As the insulating layer 332, an aluminum oxide film, a hafnium oxide film, a silicon nitride film, or the like can be used.

The conductive layer 327 is provided over the insulating layer 332. The insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321, for example. The top surface of the insulating layer 326 is preferably planarized The semiconductor layer 321 is provided over the insulating layer 326. The semiconductor layer 321 preferably includes a metal oxide (also referred to as an oxide semiconductor) film having semiconductor characteristics. Materials that can be suitably used for the semiconductor layer 321 will be described in detail later.

The pair of conductive layers 325 is provided over and in contact with the semiconductor layer 321, and functions as a source electrode and a drain electrode.

An insulating layer 328 is provided to cover, for example, the top and side surfaces of the pair of conductive layers 325, the side surface of the semiconductor layer 321, and the like. The insulating layer 264 is provided over the insulating layer 328. The insulating layer 328 functions as a barrier layer that prevents diffusion of e.g., impurities such as water or hydrogen from e.g., the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325, and the top surface of the semiconductor layer 321 and the conductive layer 324 are embedded in the opening. The conductive layer 324 functions as a second gate electrode. The insulating layer 323 functions as a second gate insulating layer.

The top surface of the conductive layer 324, the top surface of the insulating layer 323, and the top surface of the insulating layer 264 are planarized such that they are substantially level with each other. The insulating layer 329 and the insulating layer 265 are provided to cover these layers.

The insulating layer 264 and the insulating layer 265 each function as an interlayer insulating layer. The insulating layer 329 functions as a barrier layer that prevents diffusion of e.g., impurities such as water and hydrogen from e.g., the insulating layer 265 or the like into the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274a that covers side surfaces of each opening formed in the insulating layer 265, the insulating layer 329, the insulating layer 264, and the insulating layer 328 and part of the top surface of the conductive layer 325, and a conductive layer 274b in contact with a top surface of the conductive layer 274a. In that case, a conductive material in which hydrogen and oxygen are less likely to diffuse is preferably used for the conductive layer 274a.

Figure 24:
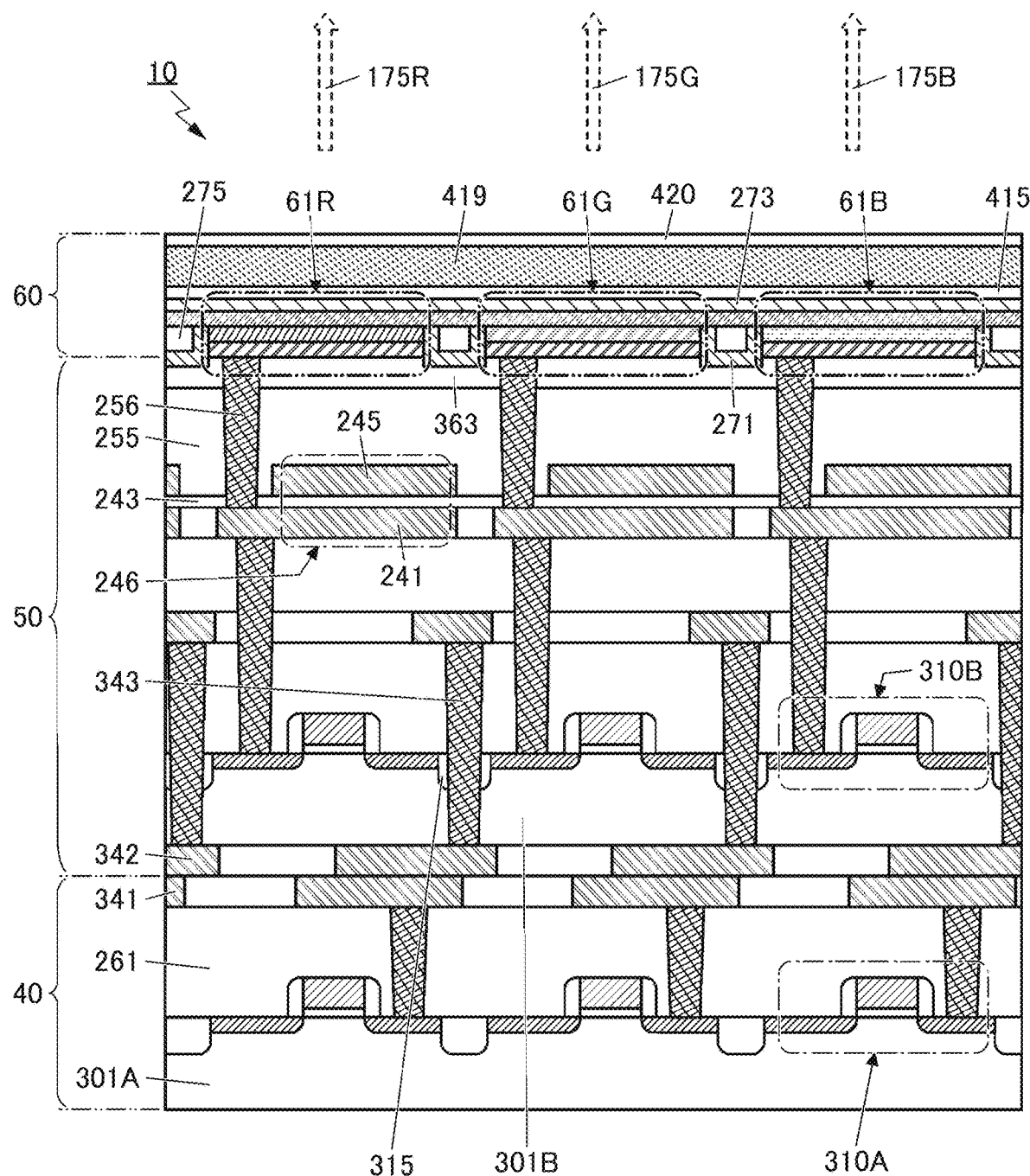
FIG. 24 is a cross-sectional view illustrating an example of a display apparatus.

FIG. 24 illustrates a cross-sectional structure example of part of the display apparatus 10 illustrated in FIG. 21B. The display apparatus 10 illustrated in FIG. 24 has a structure in which a transistor 310A whose channel is formed in a substrate 301A included in the layer 40 and a transistor 310B whose channel is formed in the substrate 301B included in the layer 50 are stacked. A material similar to that of the substrate 301 can be used for the substrate 301A.

The display apparatus 10 illustrated in FIG. 24 has a structure in which the layer 60 including the light-emitting element 61, the layer 50 including a substrate 301B, the transistor 310B, and the capacitor 246, and the layer 40 including the substrate 301A and the transistor 310A are attached to each other.

The substrate 301B is provided with a plug 343 that penetrates the substrate 301B. The plug 343 functions as a Si through electrode (TSV: Through Silicon Via). The plug 343 is electrically connected to a conductive layer 342 provided on the rear surface (the surface that is opposite to the substrate 420 side) of the substrate 301B. The conductive layer 341 is provided over the insulating layer 261 over the substrate 301A.

The conductive layer 341 and the conductive layer 342 are bonded to each other, whereby the layer 40 and the layer 50 are electrically connected to each other.

The same conductive material is preferably used for the conductive layer 341 and the conductive layer 342. For example, a metal film containing an element selected from Al, Cr, Cu, Ta, Sn, Zn, Au, Ag, Pt, Ti, Mo, and W, a metal nitride film containing the above element as its component (a titanium nitride film, a molybdenum nitride film, or a tungsten nitride film), or the like can be used. Copper is particularly preferably used for the conductive layer 341 and the conductive layer 342. In that case, it is possible to employ Cu—Cu (copper-copper) direct bonding (a technique for achieving electrical continuity by connecting Cu (copper) pads) for bonding between the conductive layer 341 and the conductive layer 342. Note that the conductive layer 341 and the conductive layer 342 may be bonded to each other with a bump therebetween.

Figure 25:
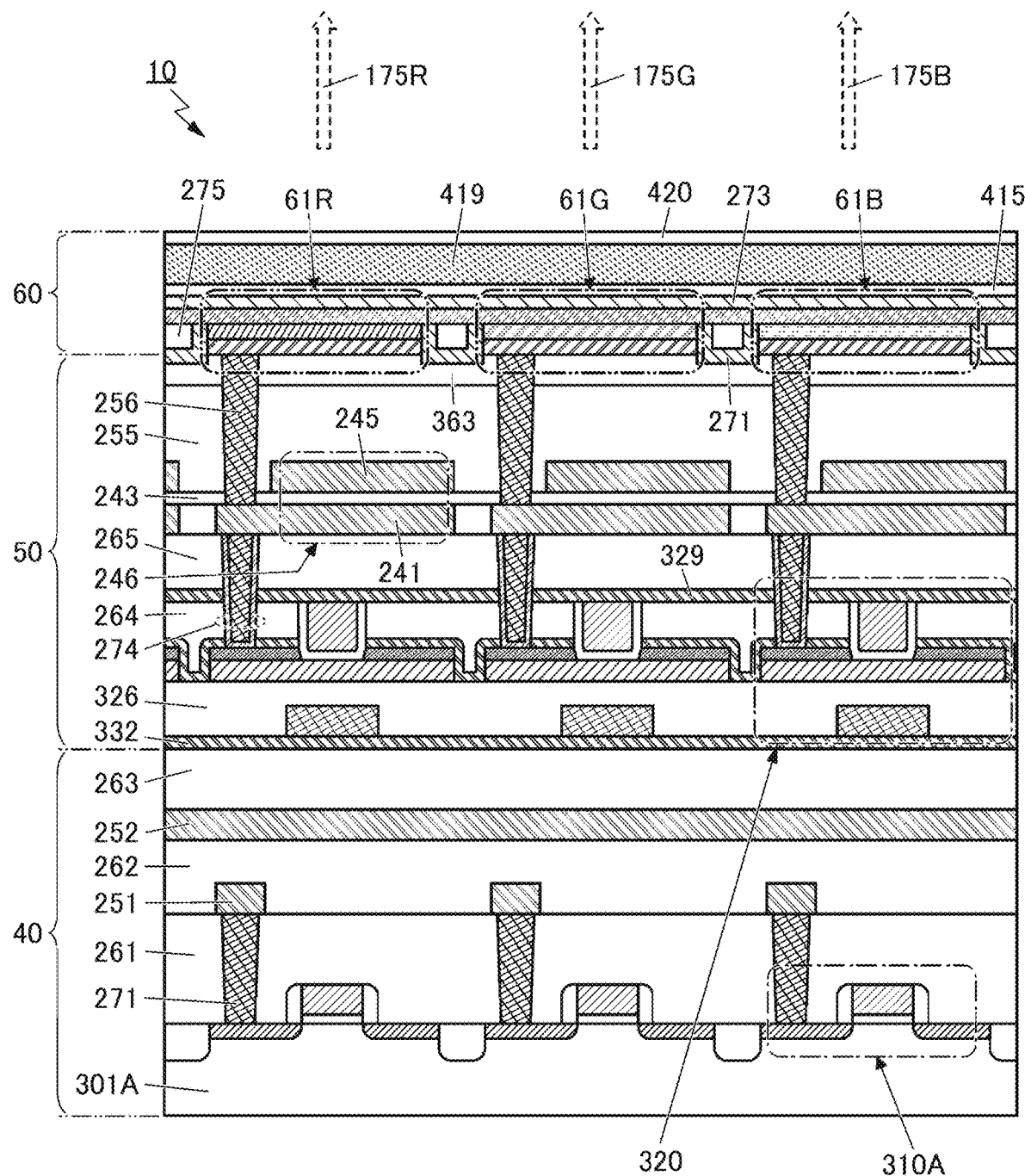
FIG. 25 is a cross-sectional view illustrating an example of a display apparatus.

FIG. 25 is also a modification example of the cross-sectional structure example illustrated in FIG. 24. In the cross-sectional structure example of the display apparatus 10 illustrated in FIG. 25, the transistor 310A whose channel is formed in the substrate 301A and the transistor 320 including a metal oxide in the semiconductor layer where the channel is formed are stacked. Note that portions similar to those in FIG. 22 to FIG. 24 are not described in some cases.

The layer 50 illustrated in FIG. 25 has a structure in which the substrate 331 is removed from the layer 50 illustrated in FIG. 23. In the layer 40 illustrated in FIG. 25, the insulating layer 261 is provided to cover the transistor 310A. A conductive layer 251 is provided over the insulating layer 261. An insulating layer 262 is provided to cover the conductive layer 251. A conductive layer 252 is provided over the insulating layer 262. The conductive layer 251 and the conductive layer 252 each function as a wiring. An insulating layer 263 and the insulating layer 332 are provided to cover the conductive layer 252. The transistor 320 is provided over the insulating layer 332. The insulating layer 265 is provided to cover the transistor 320, and the capacitor 246 is provided over the insulating layer 265. The capacitor 246 and the transistor 320 are electrically connected to each other through the plug 274. The layer 50 is provided to overlap with the insulating layer 263 included in the layer 40.

The transistor 320 can be used as transistors included in the pixel circuits 51. The transistor 310 can be used as the transistors included in the pixel circuits 51 or transistors included in the peripheral driver circuit. The transistor 310 and the transistor 320 can also be used as transistors included in a functional circuit such as an arithmetic circuit or a memory circuit, for example.

In the display apparatus 10 having such a structure illustrated in FIG. 25, not only the pixel circuits 51 but also the peripheral driver circuit or the like can be formed directly under the layer 60 including the light-emitting element 61, for example. Thus, the display apparatus 10 illustrated in FIG. 25 can be downsized as compared with the case where a driver circuit is provided around a display region.

The structure described in this embodiment can be used in an appropriate combination with any of the structures described in the other embodiments and examples.

Embodiment 3

In this embodiment, a transistor that can be used in the semiconductor device of one embodiment of the present invention will be described.

<Structure Example of Transistor>

Figure 26A:
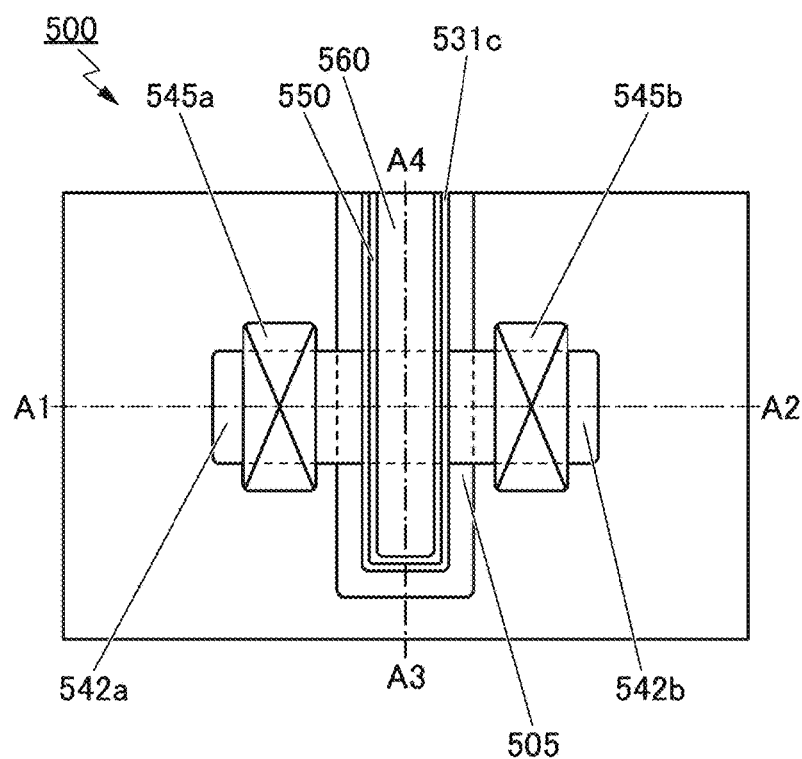
FIG. 26A is a top view illustrating a structure example of a transistor.
Figure 26C:
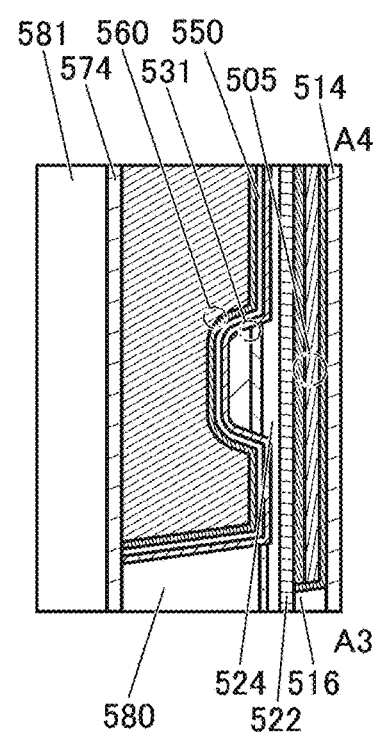
FIG. 26B and FIG. 26C are cross-sectional views illustrating the structure example of the transistor.
Figure 26B:
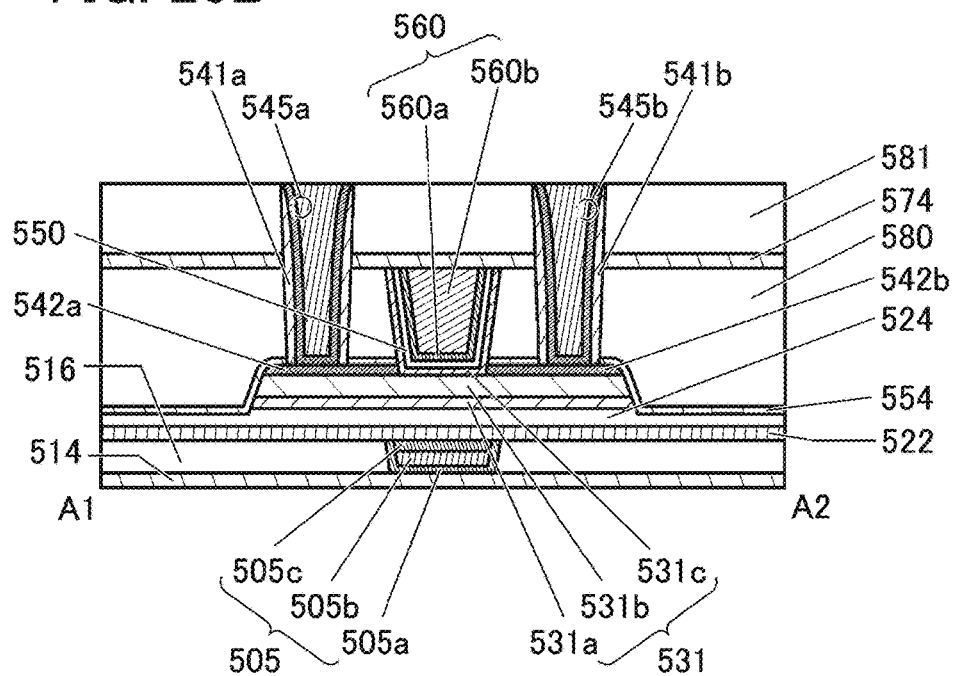

FIG. 26A, FIG. 26B, and FIG. 26C are a top view and cross-sectional views of a transistor 500 that can be used in the semiconductor device of one embodiment of the present invention. The transistor 500 can be used in the semiconductor device of one embodiment of the present invention.

FIG. 26A is the top view of the transistor 500. FIG. 26B and FIG. 26C are the cross-sectional views of the transistor 500. Here, FIG. 26B is a cross-sectional view of a portion indicated by the dashed-dotted line A1-A2 in FIG. 26A and is a cross-sectional view of the transistor 500 in the channel length direction. FIG. 26C is a cross-sectional view of a portion indicated by the dashed-dotted line A3-A4 in FIG. 26A and is a cross-sectional view of the transistor 500 in the channel width direction. Note that some components are omitted in the top view of FIG. 26A for clarity of the drawing.

As illustrated in FIG. 26, the transistor 500 includes a metal oxide 531a placed over a substrate (not illustrated); a metal oxide 531b placed over the metal oxide 531a; a conductor 542a and a conductor 542b that are placed apart from each other over the metal oxide 531b; an insulator 580 that is placed over the conductor 542a and the conductor 542b and has an opening between the conductor 542a and the conductor 542b; a conductor 560 placed in the opening; an insulator 550 placed between the conductor 560 and the metal oxide 531b, the conductor 542a, the conductor 542b, and the insulator 580; and a metal oxide 531c placed between the insulator 550 and the metal oxide 531b, the conductor 542a, the conductor 542b, and the insulator 580. Here, as illustrated in FIG. 26B and FIG. 26C, it is preferable that the top surface of the conductor 560 be substantially aligned with the top surfaces of the insulator 550, an insulator 554, the metal oxide 531c, and the insulator 580. Hereinafter, the metal oxide 531a, the metal oxide 531b, and the metal oxide 531c may be collectively referred to as a metal oxide 531. The conductor 542a and the conductor 542b may be collectively referred to as a conductor 542.

In the transistor 500 illustrated in FIG. 26, the side surfaces of the conductor 542a and the conductor 542b on the conductor 560 side are substantially perpendicular. Note that the transistor 500 is not limited thereto, and in the transistor 500, the angle formed between the side surfaces and the bottom surfaces of the conductor 542a and the conductor 542b may be greater than or equal to 10° and less than or equal to 80°, preferably greater than or equal to 30° and less than or equal to 60°. The side surfaces of the conductor 542a and the conductor 542b that face each other may have a plurality of faces.

As illustrated in FIG. 26, in the transistor 500, the insulator 554 is preferably placed between the insulator 580 and an insulator 524, the metal oxide 531a, the metal oxide 531b, the conductor 542a, the conductor 542b, and the metal oxide 531c. Here, as illustrated in FIG. 26B and FIG. 26C, the insulator 554 is preferably in contact with the side surface of the metal oxide 531c, the top surface and the side surface of the conductor 542a, the top surface and the side surface of the conductor 542b, the side surfaces of the metal oxide 531a and the metal oxide 531b, and the top surface of the insulator 524.

In the transistor 500 illustrated in FIG. 26, three layers of the metal oxide 531a, the metal oxide 531b, and the metal oxide 531c are stacked as the metal oxide 531 in and around a region where a channel is formed (hereinafter, also referred to as a channel formation region); however, one embodiment of the present invention is not limited thereto. For example, a two-layer structure of the metal oxide 531b and the metal oxide 531c or a stacked-layer structure of four or more layers may be employed as the metal oxide 531. Although the conductor 560 is illustrated to have a stacked-layer structure of two layers in the transistor 500 illustrated in FIG. 26, the present invention is not limited thereto. For example, the conductor 560 may have a single-layer structure or a stacked-layer structure of three or more layers. Furthermore, in the metal oxide 531, each of the metal oxide 531a, the metal oxide 531b, and the metal oxide 531c may have a stacked-layer structure of two or more layers.

For example, in the case where the metal oxide 531c has a stacked-layer structure including a first metal oxide and a second metal oxide provided over the first metal oxide, it is preferable that the first metal oxide have a composition similar to that of the metal oxide 531b and the second metal oxide have a composition similar to that of the metal oxide 531a.

Here, the conductor 560 functions as a gate electrode of the transistor, and the conductor 542a and the conductor 542b function as a source electrode and a drain electrode of a transistor. As described above, the conductor 560 is formed to be embedded in the opening of the insulator 580 and the region sandwiched between the conductor 542a and the conductor 542b. Here, the positions of the conductor 560, the conductor 542a, and the conductor 542b are selected in a self-aligned manner with respect to the opening of the insulator 580. That is, in accordance with one embodiment of the present invention, in the transistor 500, the gate electrode can be placed between the source electrode and the drain electrode in a self-aligned manner. Thus, the conductor 560 can be formed without an alignment margin, resulting in a reduction in the area occupied by the transistor 500. Accordingly, the display apparatus can have higher definition. In addition, the display apparatus can have a narrow bezel.

As illustrated in FIG. 26, the conductor 560 preferably includes a conductor 560a provided inside the insulator 550 and a conductor 560b provided to be embedded inside the conductor 560a.

The transistor 500 preferably includes an insulator 514 placed over the substrate (not illustrated); an insulator 516 placed over the insulator 514; a conductor 505 placed to be embedded in the insulator 516; an insulator 522 placed over the insulator 516 and the conductor 505; and the insulator 524 placed over the insulator 522. Moreover, the metal oxide 531a is preferably placed over the insulator 524.

An insulator 574 and an insulator 581 functioning as interlayer films are preferably placed over the transistor 500. Here, the insulator 574 is preferably placed in contact with the top surfaces of the conductor 560, the insulator 550, the insulator 554, the metal oxide 531c, and the insulator 580.

The insulator 522, the insulator 554, and the insulator 574 preferably have a function of inhibiting diffusion of hydrogen (e.g., at least one of a hydrogen atom, a hydrogen molecule, and the like). For example, the insulator 522, the insulator 554, and the insulator 574 preferably have a lower hydrogen permeability than the insulator 524, the insulator 550, and the insulator 580. Moreover, the insulator 522 and the insulator 554 preferably have a function of inhibiting diffusion of oxygen (e.g., at least one of an oxygen atom, an oxygen molecule, and the like). For example, the insulator 522 and the insulator 554 preferably have a lower oxygen permeability than the insulator 524, the insulator 550, and the insulator 580.

Here, the insulator 524, the metal oxide 531, and the insulator 550 are separated from the insulator 580 and the insulator 581 by the insulator 554 and the insulator 574. The insulator 554 and the insulator 574 can inhibit entry of e.g., impurities such as hydrogen contained in the insulator 580 and the insulator 581 and excess oxygen into the insulator 524, the metal oxide 531, and the insulator 550.

A conductor 545 (a conductor 545a and a conductor 545b) that is electrically connected to the transistor 500 and functions as a plug is preferably provided. Note that an insulator 541 (an insulator 541a and an insulator 541b) is provided in contact with the side surface of the conductor 545 functioning as a plug. That is, the insulator 541 is provided in contact with the inner wall of an opening in the insulator 554, the insulator 580, the insulator 574, and the insulator 581. In addition, a structure may be employed in which a first conductor of the conductor 545 is provided in contact with the side surface of the insulator 541 and a second conductor of the conductor 545 is provided on the inner side of the first conductor of the conductor 545. Here, the top surface of the conductor 545 and the top surface of the insulator 581 can be substantially level with each other. Although the transistor 500 illustrated in FIG. 26 has a structure in which the first conductor of the conductor 545 and the second conductor of the conductor 545 are stacked, one embodiment of the present invention is not limited thereto. For example, the conductor 545 may have a single-layer structure or a stacked-layer structure of three or more layers. In the case where a component has a stacked-layer structure, layers may be distinguished by ordinal numbers corresponding to the formation order.

In the transistor 500, a metal oxide functioning as an oxide semiconductor (hereinafter, also referred to as an oxide semiconductor) is preferably used as the metal oxide 531 including the channel formation region (the metal oxide 531a, the metal oxide 531b, and the metal oxide 531c). For example, it is preferable to use a metal oxide having a band gap of 2 eV or more, preferably 2.5 eV or more as the metal oxide to be the channel formation region of the metal oxide 531.

The metal oxide preferably contains at least indium (In) or zinc (Zn). In particular, indium (In) and zinc (Zn) are preferably contained. In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). The element M further preferably contains one or both of Ga and Sn.

As illustrated in FIG. 26B, the metal oxide 531b in a region that does not overlap with the conductor 542 sometimes has a smaller thickness than the metal oxide 531b in a region that overlaps with the conductor 542. The thin region is formed when part of the top surface of the metal oxide 531b, which does neither overlap with the conductor 542a nor the conductor 542b, is removed at the time of forming the conductor 542a and the conductor 542b. In the metal oxide 531b, when a conductive film to be the conductor 542 is formed over the top surface of the metal oxide 531b, a low-resistance region is sometimes formed in the vicinity of the interface with the conductive film. Removing the low-resistance region positioned between the conductor 542a and the conductor 542b on the top surface of the metal oxide 531b in the transistor 500 can prevent formation of the channel in the region.

According to one embodiment of the present invention, a display apparatus that includes small-size transistors and thus has high definition can be provided. A display apparatus that includes a transistor with a high on-state current and thus has high luminance can be provided. A display apparatus that includes a transistor operating at high speed and thus operates at high speed can be provided. A display apparatus that includes a transistor having stable electrical characteristics and thus is highly reliable can be provided. A display apparatus that includes a transistor with a low off-state current and thus has low power consumption can be provided.

The structure of the transistor 500 that can be used in the display apparatus of one embodiment of the present invention will be described in detail.

The conductor 505 is placed to include a region overlapping with the metal oxide 531 and the conductor 560. Furthermore, the conductor 505 is preferably provided to be embedded in the insulator 516.

The conductor 505 includes a conductor 505a, a conductor 505b, and a conductor 505c. The conductor 505a is provided in contact with the bottom surface and the sidewall of the opening provided in the insulator 516. The conductor 505b is provided to be embedded in a recessed portion formed in the conductor 505a. Here, the top surface of the conductor 505b is lower in level than the top surface of the conductor 505a and the top surface of the insulator 516. The conductor 505c is provided in contact with the top surface of the conductor 505b and the side surface of the conductor 505a. Here, the top surface of the conductor 505c is substantially level with the top surface of the conductor 505a and the top surface of the insulator 516. That is, the conductor 505b is surrounded by the conductor 505a and the conductor 505c.

Here, for the conductor 505a and the conductor 505c, for example, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 505a and the conductor 505c are formed using a conductive material having a function of inhibiting diffusion of hydrogen, e.g., impurities such as hydrogen contained in the conductor 505b can be inhibited from diffusing into the metal oxide 531 through the insulator 524 and the like. When the conductor 505a and the conductor 505c are formed using a conductive material having a function of inhibiting diffusion of oxygen, the conductivity of the conductor 505b can be inhibited from being lowered because of oxidation. As the conductive material having a function of inhibiting diffusion of oxygen, for example, titanium, titanium nitride, tantalum, tantalum nitride, ruthenium, ruthenium oxide, or the like is preferably used. Thus, the conductor 505a is a single layer or stacked layers of the above conductive materials. For example, titanium nitride is used for the conductor 505a.

For the conductor 505b, a conductive material containing tungsten, copper, or aluminum as its main component is preferably used. For example, tungsten is used for the conductor 505b.

The conductor 560 sometimes functions as a first gate (also referred to as top gate) electrode. The conductor 505 sometimes functions as a second gate (also referred to as bottom gate) electrode. In that case, by changing a potential applied to the conductor 505 independently of a potential applied to the conductor 560 in the transistor 500, Vth of the transistor 500 can be controlled. In particular, by applying a negative potential to the conductor 505, Vth of the transistor 500 can be higher than 0 V and the off-state current can be made low. Thus, a drain current at the time when a potential applied to the conductor 560 is 0 V can be lower in the case where a negative potential is applied to the conductor 505 than in the case where the negative potential is not applied to the conductor 505.

The conductor 505 is preferably provided to be larger than the channel formation region in the metal oxide 531. In particular, it is preferable that the conductor 505 extend beyond an end portion of the metal oxide 531 that intersects with the channel width direction, as illustrated in FIG. 26C. That is, the conductor 505 and the conductor 560 preferably overlap with each other with the insulator therebetween, in a region outside the side surface of the metal oxide 531 in the channel width direction.

With the above structure of the transistor 500, the channel formation region of the metal oxide 531 can be electrically surrounded by an electric field of the conductor 560 having a function of the first gate electrode and an electric field of the conductor 505 having a function of the second gate electrode.

As illustrated in FIG. 26C, the conductor 505 extends to function as a wiring as well. However, without limitation to this structure, a structure in which a conductor functioning as a wiring is provided below the conductor 505 may be employed for one embodiment of the present invention.

The insulator 514 preferably functions as a barrier insulating film that inhibits entry of e.g., impurities such as water or hydrogen into the transistor 500 from the substrate side. Accordingly, it is preferable to use, for the insulator 514, an insulating material having a function of inhibiting diffusion of e.g., impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (an insulating material through which the impurities are less likely to pass). Alternatively, it is preferable to use an insulating material having a function of inhibiting diffusion of oxygen (e.g., at least one of an oxygen atom, an oxygen molecule, and the like) (an insulating material through which the oxygen is less likely to pass).

For example, aluminum oxide, silicon nitride, or the like is preferably used as the insulator 514. Accordingly, it is possible for the insulator 514 to inhibit diffusion of impurities such as water or hydrogen to the transistor 500 side from the substrate side through the insulator 514. Alternatively, it is possible for the insulator 514 to inhibit diffusion of oxygen contained in the insulator 524 and the like to the substrate side through the insulator 514.

The permittivity of each of the insulator 516, the insulator 580, and the insulator 581 functioning as an interlayer film is preferably lower than that of the insulator 514. In one embodiment of the present invention, when a material with a low permittivity is used for an interlayer film, the parasitic capacitance generated between wirings can be reduced. As the insulator 516, the insulator 580, and the insulator 581, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 522 and the insulator 524 have a function of a gate insulator.

Here, the insulator 524 in contact with the metal oxide 531 preferably releases oxygen by heating. In this specification, oxygen that is released by heating is referred to as excess oxygen in some cases. For example, silicon oxide, silicon oxynitride, or the like can be used as appropriate for the insulator 524. When the insulator 524 containing oxygen is provided in contact with the metal oxide 531 in the transistor 500, oxygen vacancies in the metal oxide 531 can be reduced, leading to improved reliability of the transistor 500.

Specifically, an oxide material that releases part of oxygen by heating is preferably used for the insulator 524. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C., inclusive or 100° C. to 400° C., inclusive.

As illustrated in FIG. 26C, the insulator 524 is sometimes thinner in a region that overlaps with neither the insulator 554 nor the metal oxide 531b than in the other regions. In the insulator 524, the region that overlaps with neither the insulator 554 nor the metal oxide 531b preferably has a thickness with which the above oxygen can be adequately diffused.

For example, like the insulator 514 and the like, the insulator 522 preferably functions as a barrier insulating film that inhibits entry of e.g., impurities such as water or hydrogen into the transistor 500 from the substrate side. For example, the insulator 522 preferably has a lower hydrogen permeability than the insulator 524. In one embodiment of the present invention, when the insulator 524, the metal oxide 531, the insulator 550, and the like are surrounded by the insulator 522, the insulator 554, and the insulator 574, entry of impurities such as water or hydrogen into the transistor 500 from the outside can be inhibited.

Furthermore, it is preferable that the insulator 522 have a function of inhibiting diffusion of oxygen (e.g., at least one of an oxygen atom, an oxygen molecule, and the like) (the insulator through which the oxygen is less likely to pass). For example, the insulator 522 preferably has a lower oxygen permeability than the insulator 524. The insulator 522 preferably has a function of inhibiting diffusion of oxygen and impurities, in which case oxygen contained in the metal oxide 531 is less likely to diffuse to the substrate side. Moreover, the conductor 505 can be inhibited from reacting with oxygen contained in the insulator 524 and the metal oxide 531.

As the insulator 522, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used, for example. In the case where the insulator 522 is formed using such a material, the insulator 522 functions as a layer inhibiting release of oxygen from the metal oxide 531 and entry of e.g., impurities such as hydrogen into the metal oxide 531 from the periphery of the transistor 500.

Alternatively, in the insulator 522, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

The insulator 522 may be a single layer or a stacked layer using an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST), for example. With scaling down and higher integration of transistors, a problem such as leakage current may arise because of a thinned gate insulator. When a high-k material is used for the insulator functioning as a gate insulator in the transistor 500, a gate potential at the time of the operation of the transistor can be reduced while the physical thickness is maintained.

Note that the insulator 522 and the insulator 524 may each have a stacked-layer structure of two or more layers. In that case, without limitation to a stacked-layer structure formed of the same material, a stacked-layer structure formed of different materials may be employed. For example, an insulator similar to the insulator 524 may be provided below the insulator 522.

The metal oxide 531 includes the metal oxide 531a, the metal oxide 531b over the metal oxide 531a, and the metal oxide 531c over the metal oxide 531b. When the metal oxide 531 includes the metal oxide 531a under the metal oxide 531b, it is possible to inhibit diffusion of impurities into the metal oxide 531b from the components formed below the metal oxide 531a. Moreover, when the metal oxide 531 includes the metal oxide 531c over the metal oxide 531b, it is possible to inhibit diffusion of impurities into the metal oxide 531b from the components formed above the metal oxide 531c.

Note that the metal oxide 531 preferably has a stacked-layer structure of a plurality of oxide layers that differ in the atomic ratio of metal atoms. For example, in the case where the metal oxide 531 contains at least indium (In) and the element M, the proportion of the number of atoms of the element M contained in the metal oxide 531a to the number of atoms of all elements that constitute the metal oxide 531a is preferably higher than the proportion of the number of atoms of the element M contained in the metal oxide 531b to the number of atoms of all elements that constitute the metal oxide 531b. In addition, the atomic ratio of the element M to In in the metal oxide 531a is preferably greater than the atomic ratio of the element M to In in the metal oxide 531b. Here, a metal oxide that can be used as the metal oxide 531a or the metal oxide 531b can be used as the metal oxide 531c.

The energy of the conduction band minimum of each of the metal oxide 531a and the metal oxide 531c is preferably higher than the energy of the conduction band minimum of the metal oxide 531b. In other words, the electron affinity of each of the metal oxide 531a and the metal oxide 531c is preferably smaller than the electron affinity of the metal oxide 531b. In this case, a metal oxide that can be used as the metal oxide 531a is preferably used as the metal oxide 531c. Specifically, the proportion of the number of atoms of the element M contained in the metal oxide 531c to the number of atoms of all elements that constitute the metal oxide 531c is preferably higher than the proportion of the number of atoms of the element M contained in the metal oxide 531b to the number of atoms of all elements that constitute the metal oxide 531b. In addition, the atomic ratio of the element M to In in the metal oxide 531c is preferably greater than the atomic ratio of the element M to In in the metal oxide 531b.

Here, the energy level of the conduction band minimum gently changes at junction portions between the metal oxide 531a, the metal oxide 531b, and the metal oxide 531c. In other words, at the junction portions between the metal oxide 531a, the metal oxide 531b, and the metal oxide 531c, the energy level of the conduction band minimum continuously changes or the energy levels are continuously connected. This can be achieved by decreasing the density of defect states in a mixed layer formed at the interface between the metal oxide 531a and the metal oxide 531b and the interface between the metal oxide 531b and the metal oxide 531c.

Specifically, when the metal oxide 531a and the metal oxide 531b, and the metal oxide 531b and the metal oxide 531c contain the same element (as a main component) in addition to oxygen, a mixed layer with a low density of defect states can be formed. In the case where the metal oxide 531b is an In—Ga—Zn oxide, for example, an In—Ga—Zn oxide, a Ga—Zn oxide, gallium oxide, or the like may be used as the metal oxide 531a and the metal oxide 531c. The metal oxide 531c may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 531c may have a stacked-layer structure of an In—Ga—Zn oxide and an oxide that does not contain In.

Specifically, as the metal oxide 531a, a metal oxide with In:Ga:Zn=1:3:4 [atomic ratio] or 1:1:0.5 [atomic ratio] can be used. As the metal oxide 531b, a metal oxide with In:Ga:Zn=4:2:3 [atomic ratio] or 3:1:2 [atomic ratio] can be used. As the metal oxide 531c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 531c include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and a layer of gallium oxide.

At this time, the metal oxide 531b serves as a main carrier path in the metal oxide 531. When the metal oxide 531a and the metal oxide 531c have the above structure, the density of defect states at the interface between the metal oxide 531a and the metal oxide 531b and the interface between the metal oxide 531b and the metal oxide 531c can be made low for the metal oxide 531b. This reduces the influence of interface scattering on carrier conduction in the metal oxide 531b, and the transistor 500 can have a high on-state current and high frequency characteristics. Note that in the case where the metal oxide 531c has a stacked-layer structure, the metal oxide 531c can reduce the density of defect states at the interface between the metal oxide 531b and the metal oxide 531c and inhibit diffusion of the constituent element contained in the metal oxide 531c to the insulator 550 side. Specifically, in the case where an oxide not containing In is stacked in an upper portion of the metal oxide 531c, the metal oxide 531c can inhibit the diffusion of In to the insulator 550 side. The insulator 550 functions as a gate insulator. Thus, the transistor 500 might be defective in characteristics if In diffuses to the insulator 550. Thus, in accordance with one embodiment of the present invention, the metal oxide 531c having a stacked-layer structure allows a highly reliable display apparatus to be provided.

The conductor 542 (the conductor 542a and the conductor 542b) functioning as the source electrode and the drain electrode is provided over the metal oxide 531b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen.

When the conductor 542 is provided in contact with the metal oxide 531, the oxygen concentration of the metal oxide 531 in the vicinity of the conductor 542 sometimes decreases. In addition, a metal compound layer that contains the metal contained in the conductor 542 and the component of the metal oxide 531 is sometimes formed in the metal oxide 531 in the vicinity of the conductor 542. In such cases, the carrier density of the region in the metal oxide 531 in the vicinity of the conductor 542 increases, and the region becomes a low-resistance region.

Here, the region between the conductor 542a and the conductor 542b is formed to overlap with the opening of the insulator 580. Accordingly, the conductor 560 can be placed in a self-aligned manner between the conductor 542a and the conductor 542b in the transistor 500.

The insulator 550 functions as a gate insulator. The insulator 550 is preferably placed in contact with the top surface of the metal oxide 531c. For the insulator 550, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 524, for example, the concentration of impurities such as water or hydrogen in the insulator 550 is preferably reduced. The thickness of the insulator 550 is preferably greater than or equal to 1 nm and less than or equal to 20 nm.

In the transistor 500, a metal oxide may be provided between the insulator 550 and the conductor 560. The metal oxide preferably inhibits oxygen diffusion from the insulator 550 to the conductor 560. Accordingly, oxidation of the conductor 560 due to oxygen in the insulator 550 can be inhibited by the metal oxide.

The metal oxide functions as part of the gate insulator in some cases. Thus, when silicon oxide, silicon oxynitride, or the like is used for the insulator 550, a metal oxide that is a high-k material with a high dielectric constant is preferably used as the metal oxide. When the gate insulator has a stacked-layer structure of the insulator 550 and the metal oxide, the stacked-layer structure can be thermally stable and have a high dielectric constant. Accordingly, in the transistor 500, a gate potential applied during the operation of the transistor can be reduced while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used for the metal oxide. It is particularly preferable to use an insulator containing an oxide of one or both of aluminum and hafnium, such as aluminum oxide, hafnium oxide, or an oxide containing aluminum and hafnium (hafnium aluminate).

Although the conductor 560 is illustrated to have a two-layer structure in FIG. 26, the conductor 560 may have a single-layer structure or a stacked-layer structure of three or more layers.

For example, the conductor 560a is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting diffusion of oxygen, the conductivity of the conductor 560b can be inhibited from being lowered because of oxidation due to oxygen contained in the insulator 550. As a conductive material having a function of inhibiting oxygen diffusion, for example, tantalum, tantalum nitride, ruthenium, ruthenium oxide, or the like is preferably used.

A conductive material containing tungsten, copper, or aluminum as its main component is preferably used for the conductor 560b. The conductor 560 also functions as a wiring and thus is preferably formed using a conductor having high conductivity. For example, a conductive material containing tungsten, copper, or aluminum as its main component can be used. The conductor 560b may have a stacked-layer structure, for example, a stacked-layer structure of titanium or titanium nitride and the above conductive material.

As illustrated in FIG. 26A and FIG. 26C, the side surface of the metal oxide 531 is covered with the conductor 560 in a region of the metal oxide 531b not overlapping with the conductor 542, that is, the channel formation region of the metal oxide 531. Accordingly, an electric field of the conductor 560 functioning as the first gate electrode is likely to act on the side surface of the metal oxide 531. Thus, the on-state current of the transistor 500 can be increased and the frequency characteristics can be improved.

The insulator 554, like the insulator 514 and the like, for example, preferably functions as a barrier insulating film that inhibits entry of e.g., impurities such as water or hydrogen into the transistor 500 from the insulator 580 side. The insulator 554 preferably has a lower hydrogen permeability than the insulator 524, for example. Furthermore, as illustrated in FIG. 26B and FIG. 26C, the insulator 554 is preferably in contact with the side surface of the metal oxide 531c, the top and side surfaces of the conductor 542a, the top and side surfaces of the conductor 542b, the side surfaces of the metal oxide 531a and the metal oxide 531b, and the top surface of the insulator 524. Such a structure of the insulator 554 can inhibit entry of hydrogen contained in the insulator 580 into the metal oxide 531 through the top surfaces or side surfaces of the conductor 542a, the conductor 542b, the metal oxide 531a, the metal oxide 531b, and the insulator 524.

Furthermore, it is preferable that the insulator 554 have a function of inhibiting diffusion of oxygen (e.g., at least one of an oxygen atom, an oxygen molecule, and the like) (the insulator through which the oxygen is less likely to pass). For example, the insulator 554 preferably has a lower oxygen permeability than the insulator 580 or the insulator 524.

The insulator 554 is preferably formed by a sputtering method. When the insulator 554 is formed by a sputtering method in an oxygen-containing atmosphere, oxygen can be added to the vicinity of a region of the insulator 524 that is in contact with the insulator 554. Thus, the insulator 554 can supply oxygen from the region to the metal oxide 531 through the insulator 524. Here, with the insulator 554 having a function of inhibiting upward diffusion of oxygen, oxygen can be prevented from diffusing from the metal oxide 531 into the insulator 580. Moreover, with the insulator 522 having a function of inhibiting downward diffusion of oxygen, oxygen can be prevented from diffusing from the metal oxide 531 to the substrate side. In the above manner, oxygen is supplied to the channel formation region of the metal oxide 531 in the transistor 500. Accordingly, oxygen vacancies in the metal oxide 531 can be reduced, so that the transistor can be inhibited from having normally-on characteristics.

As the insulator 554, an insulator containing an oxide of one or both of aluminum and hafnium is preferably formed, for example. Note that as the insulator containing an oxide of one or both of aluminum and hafnium, aluminum oxide, hafnium oxide, an oxide containing aluminum and hafnium (hafnium aluminate), or the like is preferably used, for example.

The insulator 524, the insulator 550, and the metal oxide 531 are covered with the insulator 554 having a barrier property against hydrogen, whereby the insulator 580 is separated from the insulator 524, the metal oxide 531, and the insulator 550. Thus, the insulator 554 can inhibit entry of e.g., impurities such as hydrogen from the outside of the transistor 500. Therefore, excellent electrical characteristics and high reliability can be given to the transistor 500.

The insulator 580 is provided over the insulator 524, the metal oxide 531, and the conductor 542 with the insulator 554 therebetween. The insulator 580 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride, which are thermally stable, are preferable. In particular, for example, materials such as silicon oxide, silicon oxynitride, and porous silicon oxide are preferably used, in which case a region containing oxygen to be released by heating can be easily formed.

The concentration of e.g., impurities such as water or hydrogen in the insulator 580 is preferably reduced. In addition, the top surface of the insulator 580 may be planarized.

Like the insulator 514 and the like, for example, the insulator 574 preferably functions as a barrier insulating film that inhibits entry of e.g., impurities such as water or hydrogen into the insulator 580 from the above. As the insulator 574, for example, the insulator that can be used as the insulator 514, the insulator 554, or the like can be used.

The insulator 581 functioning as an interlayer film is preferably provided over the insulator 574. For example, as in the insulator 524 or the like, the concentration of e.g., impurities such as water or hydrogen in the insulator 581 is preferably reduced.

The conductor 545a and the conductor 545b are placed in openings formed in the insulator 581, the insulator 574, the insulator 580, and the insulator 554. The conductor 545a and the conductor 545b are provided to face each other with the conductor 560 therebetween. Note that the top surfaces of the conductor 545a and the conductor 545b may be on the same plane as the top surface of the insulator 581.

The insulator 541a is provided in contact with the inner wall of the opening in the insulator 581, the insulator 574, the insulator 580, and the insulator 554, and a first conductor of the conductor 545a is formed in contact with the side surface of the insulator 541a. The conductor 542a is positioned on at least part of the bottom portion of the opening, and is in contact with the conductor 545a. Similarly, the insulator 541b is provided in contact with the inner wall of the opening in the insulator 581, the insulator 574, the insulator 580, and the insulator 554. A first conductor of the conductor 545b is formed in contact with the side surface of the insulator 541b. The conductor 542b is positioned on at least part of the bottom portion of the opening, and is in contact with the conductor 545b.

The conductor 545a and the conductor 545b are preferably formed using a conductive material containing tungsten, copper, or aluminum as its main component. The conductor 545a and the conductor 545b may each have a stacked-layer structure.

In the case where the conductor 545 has a stacked-layer structure, the aforementioned conductor having a function of inhibiting diffusion of e.g., impurities such as water or hydrogen is preferably used as the conductor in contact with the metal oxide 531a, the metal oxide 531b, the conductor 542, the insulator 554, the insulator 580, the insulator 574, and the insulator 581. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material for the conductor 545a and the conductor 545b can inhibit oxygen added to the insulator 580 from being absorbed by the conductor 545a and the conductor 545b. Moreover, impurities such as water or hydrogen can be inhibited from entering the metal oxide 531 through the conductor 545a and the conductor 545b from a layer above the insulator 581.

As the insulator 541a and the insulator 541b, for example, the insulator that can be used as the insulator 554 or the like can be used. Since the insulator 541a and the insulator 541b are provided in contact with the insulator 554, for example, impurities such as water or hydrogen in the insulator 580 or the like can be inhibited from entering the metal oxide 531 through the conductor 545a and the conductor 545b. Furthermore, the insulator 541a and the insulator 541b can inhibit oxygen contained in the insulator 580 from being absorbed by the conductor 545a and the conductor 545b.

Although not illustrated, a conductor functioning as a wiring may be placed in contact with the top surface of the conductor 545a and the top surface of the conductor 545b. For the conductor functioning as a wiring, a conductive material containing tungsten, copper, or aluminum as its main component is preferably used. Furthermore, the conductor may have a stacked-layer structure. For example, a stacked layer of titanium or titanium nitride and the above conductive material may be employed. Note that the conductor may be formed to be embedded in an opening provided in an insulator.

<Materials for Transistor>

Materials that can be used for the transistor will be described.

[Substrate]

As a substrate where the transistor 500 is formed, an insulator substrate, a semiconductor substrate, or a conductor substrate may be used, for example. Examples of the insulator substrate used as the substrate include a glass substrate, a quartz substrate, a sapphire substrate, a stabilized zirconia substrate (e.g., an yttria-stabilized zirconia substrate), and a resin substrate. Examples of the semiconductor substrate used as the substrate include a semiconductor substrate of silicon, germanium, or the like and a compound semiconductor substrate of silicon carbide, silicon germanium, gallium arsenide, indium phosphide, zinc oxide, or gallium oxide. Another example of the substrate is a semiconductor substrate in which an insulator region is included in the semiconductor substrate, e.g., an SOI (Silicon On Insulator) substrate. Examples of the conductor substrate used as the substrate include a graphite substrate, a metal substrate, an alloy substrate, and a conductive resin substrate. Other examples of the substrate include a substrate including a metal nitride and a substrate including a metal oxide. Other examples of the substrate include an insulator substrate provided with a conductor or a semiconductor, a semiconductor substrate provided with a conductor or an insulator, and a conductor substrate provided with a semiconductor or an insulator. Moreover, any of these substrates provided with elements may be used for the substrate. Examples of the elements provided for the substrates include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property.

With scaling down and higher integration of transistors, for example, a problem of the transistors such as leakage current may arise because of a thinned gate insulator. When a high-k material is used for the insulator functioning as a gate insulator, the voltage at the time of the operation of the transistor can be reduced while the physical thickness is maintained. By contrast, when a material with a low dielectric constant is used for the insulator functioning as an interlayer film, the parasitic capacitance generated between wirings can be reduced. Thus, a material of the insulator is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting passage of e.g., oxygen and impurities such as hydrogen (e.g., the insulator 514, the insulator 522, the insulator 554, and the insulator 574), the electrical characteristics of the transistor can be stable. An insulator having a function of inhibiting passage of e.g., oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting passage of e.g., oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator is preferably an insulator including a region containing oxygen to be released by heating. For example, when a structure is employed in which silicon oxide or silicon oxynitride that includes a region containing oxygen to be released by heating is in contact with the metal oxide 531, oxygen vacancies included in the metal oxide 531 can be filled.

[Conductor]

For a conductor, for example, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used as the conductor.

A plurality of conductors formed using any of the above materials may be stacked in the conductor. For example, a stacked-layer structure combining a material containing the above metal element and a conductive material containing oxygen may be employed. In addition, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably employs a stacked-layer structure combining a material containing the above metal element and a conductive material containing oxygen. In that case, in the conductor, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. A conductive material containing the above metal element and nitrogen may be used as the conductor. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used.

With the use of such a material for the conductor, hydrogen contained in the metal oxide where the channel is formed can be captured in some cases. Alternatively, for example, hydrogen entering from an external insulator or the like can be captured in some cases.

At least part of this embodiment can be implemented in combination with any of the other embodiments described in this specification as appropriate.

The structure described in this embodiment can be used in an appropriate combination with any of the structures described in the other embodiments and examples.

Embodiment 4

In this embodiment, a metal oxide (hereinafter, also referred to as an oxide semiconductor) that can be used in an OS transistor described in the above embodiment will be described.

<Classification of Crystal Structure>

First, the classification of crystal structures of an oxide semiconductor will be described with reference to FIG. 27A. FIG. 27A is a diagram showing the classification of the crystal structures of an oxide semiconductor, typically IGZO (a metal oxide containing In, Ga, and Zn).

As shown in FIG. 27A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that in the classification of "Crystalline", single crystal, poly crystal, and completely amorphous are excluded. The term "Crystal" includes single crystal and poly crystal.

Note that the structures in the thick frame in FIG. 27A are in an intermediate state between "Amorphous" and "Crystal", and belong to a new crystalline phase. That is, these structures are different from "Crystal" and "Amorphous", which is energetically unstable.

Note that a crystal structure of a film or a substrate can be evaluated with an X-ray diffraction (XRD) spectrum. Here, FIG. 27B shows an XRD spectrum, which is obtained by GIXD (Grazing-Incidence XRD) measurement, of a CAAC-IGZO film classified into "Crystalline" (the horizontal axis represents 2θ [deg.] and the vertical axis represents intensity in arbitrary unit [a. u]). Note that a GIXD method is also referred to as a thin film method or a Seemann-Bohlin method. The XRD spectrum that is shown in FIG. 27B and obtained by GIXD measurement is hereinafter simply referred to as an XRD spectrum. The CAAC-IGZO film in FIG. 27B has a composition in the vicinity of In:Ga:Zn=4:2:3 [atomic ratio]. The CAAC-IGZO film in FIG. 27B has a thickness of 500 nm.

As shown in FIG. 27B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 27B, the peak at 2θ of around 31° is asymmetric with respect to the axis of the angle at which the peak intensity (Intensity) is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 27C shows a diffraction pattern of the CAAC-IGZO film. FIG. 27C shows a diffraction pattern observed by NBED in which an electron beam is incident in the direction parallel to the substrate. The CAAC-IGZO film in FIG. 27C has a composition in the vicinity of In:Ga:Zn=4:2:3 [atomic ratio]. In the nanobeam electron diffraction method, electron diffraction is performed with a probe diameter of 1 nm.

As shown in FIG. 27C, a plurality of spots indicating c-axis alignment are observed in the diffraction pattern of the CAAC-IGZO film.

[Structure of Oxide Semiconductor]

Oxide semiconductors may be classified in a manner different from that in FIG. 27A when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the CAAC-OS, the nc-OS, and the a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a plurality of fine crystals, the maximum diameter of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Note that indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement. However, a unit lattice of the lattice arrangement is not always a regular hexagon and is a non-regular hexagon in some cases. A pentagonal lattice arrangement, a heptagonal lattice arrangement, and the like are included in the distortion in the CAAC-OS in some cases. Note that a clear crystal grain boundary (grain boundary) is difficult to be observed even in the vicinity of the distortion in the CAAC-OS. That is, in the CAAC-OS, formation of a crystal grain boundary is inhibited by the distortion of a lattice arrangement. This is likely to be due to the factor that the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained in the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by one or more of entry of impurities, formation of defects, and the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process of the OS transistor.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

[Structure of Oxide Semiconductor]

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal elements are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has [In] higher than [In] in the second region and has [Ga] lower than [Ga] in the second region. Moreover, the second region has [Ga] higher than [Ga] in the first region and has [In] lower than [In] in the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region is difficult to be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, the CAC-OS can give a switching function (On/Off switching function) owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, the transistor can achieve a high on-state current ($I_{on}$), high field-effect mobility ($\mu$), and excellent switching operation.

An oxide semiconductor has various structures with different properties. Two or more kinds of the amorphous oxide semiconductor, the polycrystalline oxide semiconductor, the a-like OS, the CAC-OS, the nc-OS, and the CAAC-OS may be included in the oxide semiconductor of one embodiment of the present invention.

<Transistor Including Oxide Semiconductor>

Next, the case where the above oxide semiconductor is used for a transistor will be described.

When the above oxide semiconductor is used for a transistor, the transistor can achieve high field-effect mobility. In addition, the transistor can achieve high reliability.

It is particularly preferable to use an oxide containing indium (In), gallium (Ga), and zinc (Zn) (also referred to as "IGZO") for a semiconductor layer where a channel is formed in the transistor. Alternatively, an oxide containing indium (In), aluminum (Al), and zinc (Zn) (also referred to as "IAZO") may be used for the semiconductor layer. Alternatively, an oxide containing indium (In), aluminum (Al), gallium (Ga), and zinc (Zn) (also referred to as "IAGZO") may be used for the semiconductor layer.

An oxide semiconductor with a low carrier concentration is preferably used for a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor (the concentration obtained by Secondary Ion Mass Spectrometry (SIMS)) is set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor including an oxide semiconductor containing nitrogen is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, the transistor can give stable electrical characteristics.

The structure described in this embodiment can be used in an appropriate combination with any of the structures described in the other embodiments and examples.

Embodiment 5

In this embodiment, electronic devices in which the semiconductor device of one embodiment of the present invention can be used will be described.

The semiconductor device of one embodiment of the present invention can be used for a display portion of an electronic device. Thus, one embodiment of the present invention can achieve an electronic device having high display quality. Alternatively, one embodiment of the present invention can achieve an electronic device with extremely high definition. Alternatively, one embodiment of the present invention can achieve a highly reliable electronic device.

Examples of electronic devices using the semiconductor device or the like of one embodiment of the present invention include display apparatuses such as televisions and monitors, lighting devices, desktop or laptop personal computers, word processors, image reproduction devices that reproduce still images and moving images stored in recording media such as DVDs (Digital Versatile Discs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as chain saws, smoke detectors, and medical equipment such as dialyzers. Other examples include industrial equipment such as guide lights, traffic lights, belt conveyors, elevators, escalators, industrial robots, power storage systems, and power storage devices for leveling the amount of power supply and smart grid. In addition, moving objects and the like driven by fuel engines and electric motors using power from power storage units may also be included in the category of electronic devices. Examples of the moving objects include electric vehicles (EVs), hybrid electric vehicles (HVs) that include both an internal-combustion engine and a motor, plug-in hybrid electric vehicles (PHVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The electronic device of one embodiment of the present invention may include a secondary battery (battery), and furthermore, it is preferable that the secondary battery be capable of being charged by contactless power transmission.

Examples of the secondary battery include a lithium-ion secondary battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display images, information, and the like on a display portion. When the electronic device includes an antenna and a secondary battery, the antenna may be used for contactless power transmission.

The electronic device of one embodiment of the present invention may include a sensor (e.g., a sensor having a function of measuring force, displacement, position, speed, acceleration, angular velocity, rotational frequency, distance, light, liquid, magnetism, temperature, a chemical substance, sound, time, hardness, an electric field, current, voltage, power, radiation, a flow rate, humidity, gradient, oscillation, a smell, infrared rays, or the like).

The electronic device of one embodiment of the present invention can have a variety of functions. For example, the electronic device can have a function of displaying a variety of information (e.g., a still image, a moving image, a text image, and the like) on the display portion, a touch panel function, a function of displaying a calendar, date, time, and the like, a function of executing a variety of software (programs), a wireless communication function, and a function of reading a program or data stored in a recording medium.

Furthermore, an electronic device including a plurality of display portions can have a function of displaying image information mainly on one display portion while displaying text information mainly on another display portion, a function of displaying a three-dimensional image by displaying images on the plurality of display portions with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display portion, or the like. Note that the functions of the electronic device of one embodiment of the present invention are not limited to these. The electronic device of one embodiment of the present invention can have a variety of functions.

The semiconductor device of one embodiment of the present invention can display a high-definition image. Thus, the semiconductor device can be suitably used especially for a portable electronic device, a wearable electronic device (wearable device), an e-book reader, or the like. For example, the semiconductor device can be suitably used for XR devices such as a VR device and an AR device.

Figure 28A:
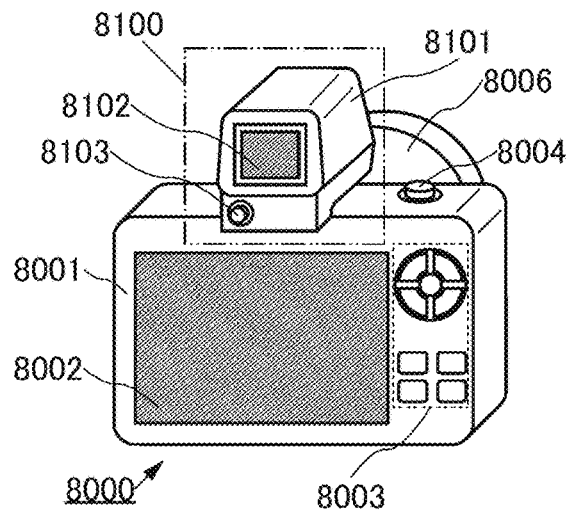
FIG. 28A to FIG. 28F are diagrams illustrating examples of electronic devices.

FIG. 28A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing, for example.

The finder 8100 includes a housing 8101, a display portion 8102, a button 8103, and the like.

The housing 8101 is attached to the camera 8000 by a mount for engagement with the mount of the camera 8000. The finder 8100 can display an image and the like received from the camera 8000 on the display portion 8102, for example.

The button 8103 functions as a power button or the like, for example.

The semiconductor device of one embodiment of the present invention can be used in the display portion 8002 of the camera 8000 and the display portion 8102 of the finder 8100. Note that the finder 8100 may be incorporated in the camera 8000.

Figure 28B:
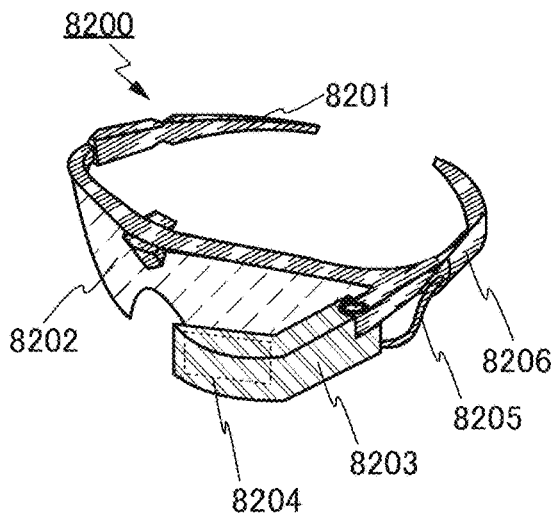

FIG. 28B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 has a function of supplying power from the battery 8206 to the main body 8203. The main body 8203 includes a wireless receiver or the like to receive image information and display it on the display portion 8204, for example. The main body 8203 includes a camera, and information on the movement of the eyeballs or the eyelids of the user can be used as an input means, for example.

The mounting portion 8201 may include a plurality of electrodes capable of sensing current flowing in response to the movement of the user's eyeball at a position in contact with the user to recognize the user's sight line. The mounting portion 8201 may also have a function of monitoring the user's pulse with the use of current flowing through the electrodes. The mounting portion 8201 may include a variety of sensors such as a temperature sensor, a pressure sensor, and an acceleration sensor. The head-mounted display 8200 may have a function of displaying the user's biological information on the display portion 8204, a function of changing an image displayed on the display portion 8204 in response to the movement of the user's head, or the like.

The semiconductor device of one embodiment of the present invention can be used in the display portion 8204.

Figure 28C:
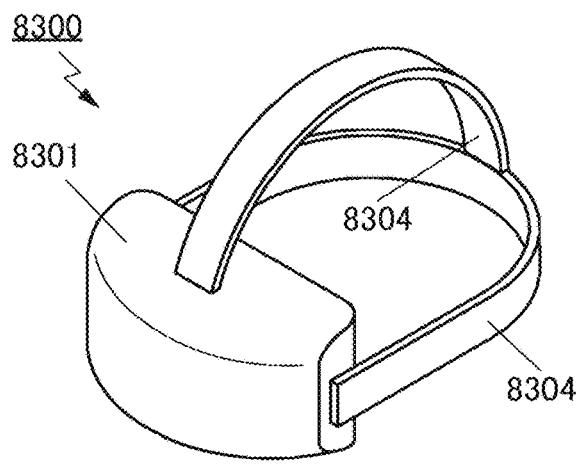
Figure 28D:
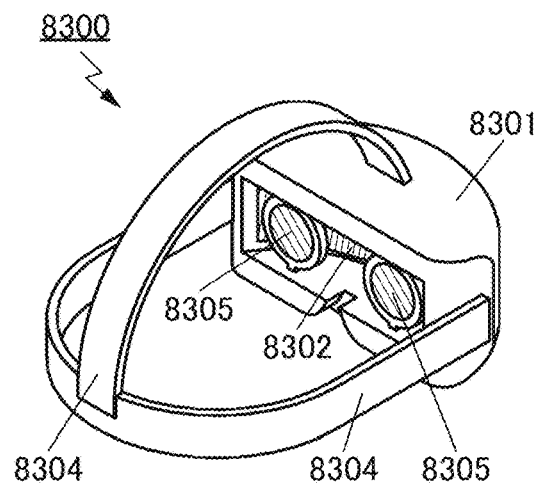
Figure 28E:
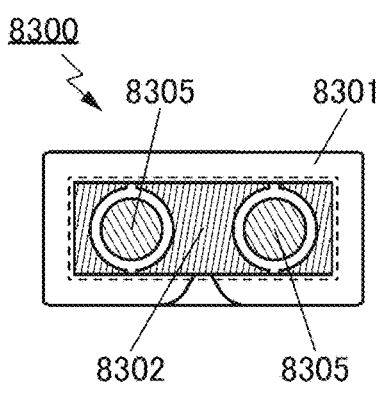

FIG. 28C to FIG. 28E are external views of a head-mounted display 8300. The head-mounted display 8300 includes a housing 8301, a display portion 8302, a band-like fixing member 8304, and a pair of lenses 8305.

A user can see display on the display portion 8302 through the lenses 8305. In the head-mounted display 8300, the display portion 8302 is preferably curved because the user can feel a high realistic sensation. For example, another image displayed on another region of the display portion 8302 is viewed through the lenses 8305, so that three-dimensional display using parallax or the like can be performed. Note that the number of display portions 8302 is not limited to one; for example, two display portions 8302 may be provided for the user's respective eyes.

The semiconductor device of one embodiment of the present invention can be used for the display portion 8302. The semiconductor device of one embodiment of the present invention can achieve extremely high definition. For example, a pixel is not easily seen by the user even when the user sees display that is magnified by the lenses 8305 as illustrated in FIG. 28E. That is, an image with a strong sense of reality can be seen by the user with the use of the display portion 8302.

Figure 28F:
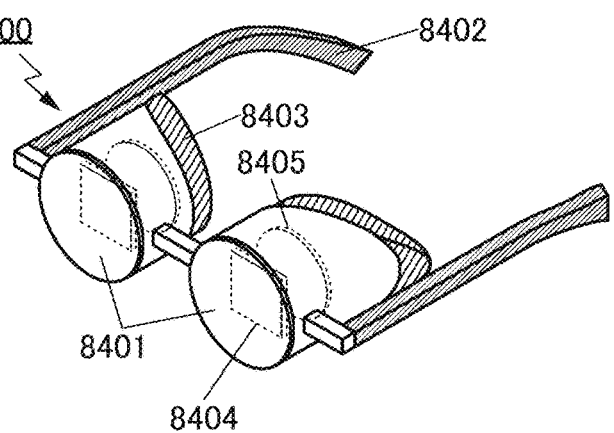

FIG. 28F is an external view of a goggle-type head-mounted display 8400. The head-mounted display 8400 includes a pair of housings 8401, a mounting portion 8402, and a cushion 8403. A display portion 8404 and a lens 8405 are provided in the pair of housings 8401 each. Furthermore, when the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has plasticity and elasticity so as to be adjusted to fit the size of the user's face and not to slide down. In addition, part of the mounting portion 8402 preferably has a vibration mechanism functioning as a bone conduction earphone, for example. Thus, a separate audio device such as an earphone or a speaker is not needed, and the user can enjoy images and sounds only by wearing the head-mounted display. Note that the housing 8401 may have a function of outputting sound data by wireless communication, for example.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used for example, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

FIG. 29A illustrates an example of a television device. In a television device 7100, a display portion 7000 is incorporated in a housing 7101. Here, the housing 7101 is supported by a stand 7103.

The semiconductor device of one embodiment of the present invention can be used for the display portion 7000 in FIG. 29A.

Operation of the television device 7100 illustrated in FIG. 29A can be performed with an operation switch provided in the housing 7101 or a separate remote controller 7111.

Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and images displayed on the display portion 7000 can be operated in the television device 7100.

Note that the television device 7100 has a structure in which a receiver, a modem, and the like are provided, for example. A general television broadcast can be received with the receiver. When the television device is connected to a communication network with or without wires via the modem, one-way (e.g., from a transmitter to a receiver) or two-way (between a transmitter and a receiver or between receivers, for example) information communication can be performed.

FIG. 29B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The semiconductor device of one embodiment of the present invention can be used for the display portion 7000 in FIG. 29B.

FIG. 29C and FIG. 29D illustrate examples of digital signage.

Digital signage 7300 illustrated in FIG. 29C includes a housing 7301, the display portion 7000, a speaker 7303, and the like. The digital signage 7300 can also include an LED lamp, an operation key (including a power switch or an operation switch), a connection terminal, a variety of sensors, a microphone, or the like.

FIG. 29D illustrates digital signage 7400 attached to a cylindrical pillar. The digital signage 7400 includes the display portion 7000 provided along a curved surface of the pillar 7401.

In FIG. 29C and FIG. 29D, the semiconductor device of one embodiment of the present invention can be used for the display portion 7000.

The digital signage 7300 or the digital signage 7400 including a larger area of the display portion 7000 can increase the amount of information that can be provided at a time. The larger display portion 7000 attracts more attentions, so that the effectiveness of the advertisement can be increased, for example.

The digital signage 7300 or the digital signage 7400 preferably includes a touch panel in the display portion 7000. This enables intuitive operation by a user, in addition to display of a still image or a moving image on the display portion 7000. Moreover, for an application that provides information such as route information or traffic information, usability can be enhanced by intuitive operation.

As illustrated in FIG. 29C and FIG. 29D, it is preferable that the digital signage 7300 or the digital signage 7400 be capable of working with an information terminal 7311 or an information terminal 7411 such as a smartphone a user has through wireless communication, for example. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

FIG. 29E illustrates an example of an information terminal. An information terminal 7550 includes a housing 7551, a display portion 7552, a microphone 7557, a speaker portion 7554, a camera 7553, operation switches 7555, and the like. The semiconductor device of one embodiment of the present invention can be used for the display portion 7552. The display portion 7552 has a touch panel function. The information terminal 7550 also includes an antenna, a battery, and the like inside the housing 7551. The information terminal 7550 can be used as, for example, a smartphone, a mobile phone, a tablet information terminal, a tablet personal computer, an e-book reader, or the like.

FIG. 29F illustrates an example of a watch-type information terminal. An information terminal 7660 includes a housing 7661, a display portion 7662, a band 7663, a buckle 7664, an operation switch 7665, an input/output terminal 7666, and the like. The information terminal 7660 also includes, for example, an antenna, a battery, and the like inside the housing 7661. The information terminal 7660 is capable of executing a variety of applications such as mobile phone calls, e-mailing, text viewing and editing, music reproduction, Internet communication, and computer games, for example.

The information terminal 7660 includes a touch sensor in the display portion 7662, and can be operated by touching the screen with a finger, a stylus, or the like. For example, by touching an icon 7667 displayed on the display portion 7662, an application can be started. With the operation switch 7665, for example, a variety of functions such as time setting, power on/off, on/off of wireless communication, setting or cancellation of a silent mode, and setting or cancellation of a power saving mode can be performed. For example, the functions of the operation switch 7665 can be set by the operating system incorporated in the information terminal 7660.

The information terminal 7660 can execute near field communication conformable to a communication standard. For example, mutual communication between the information terminal 7660 and a headset capable of wireless communication enables hands-free calling. The information terminal 7660 can perform data transmission and reception with another information terminal through the input/output terminal 7666. Charging through the input/output terminal 7666 is also possible. Note that the charging operation may be performed by wireless power feeding without using the input/output terminal 7666.

Figure 30A:
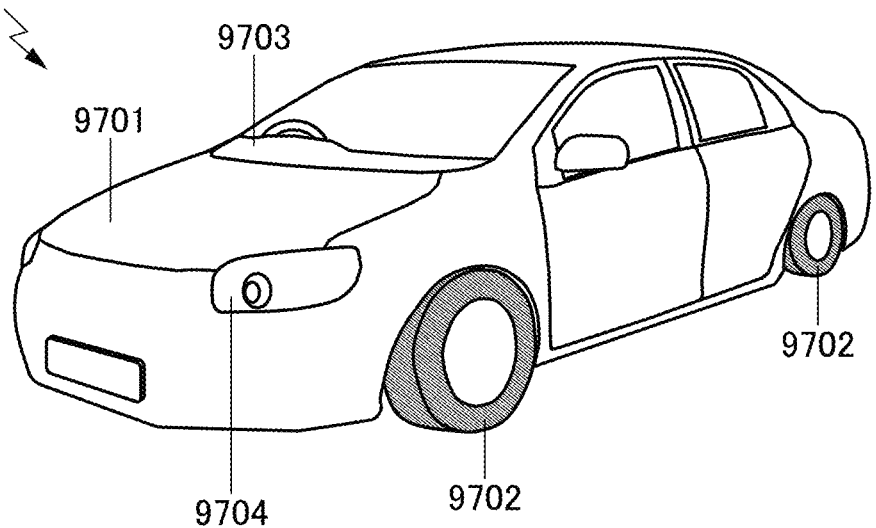
FIG. 30A and FIG. 30B are diagrams illustrating examples of electronic devices.
Figure 30B:
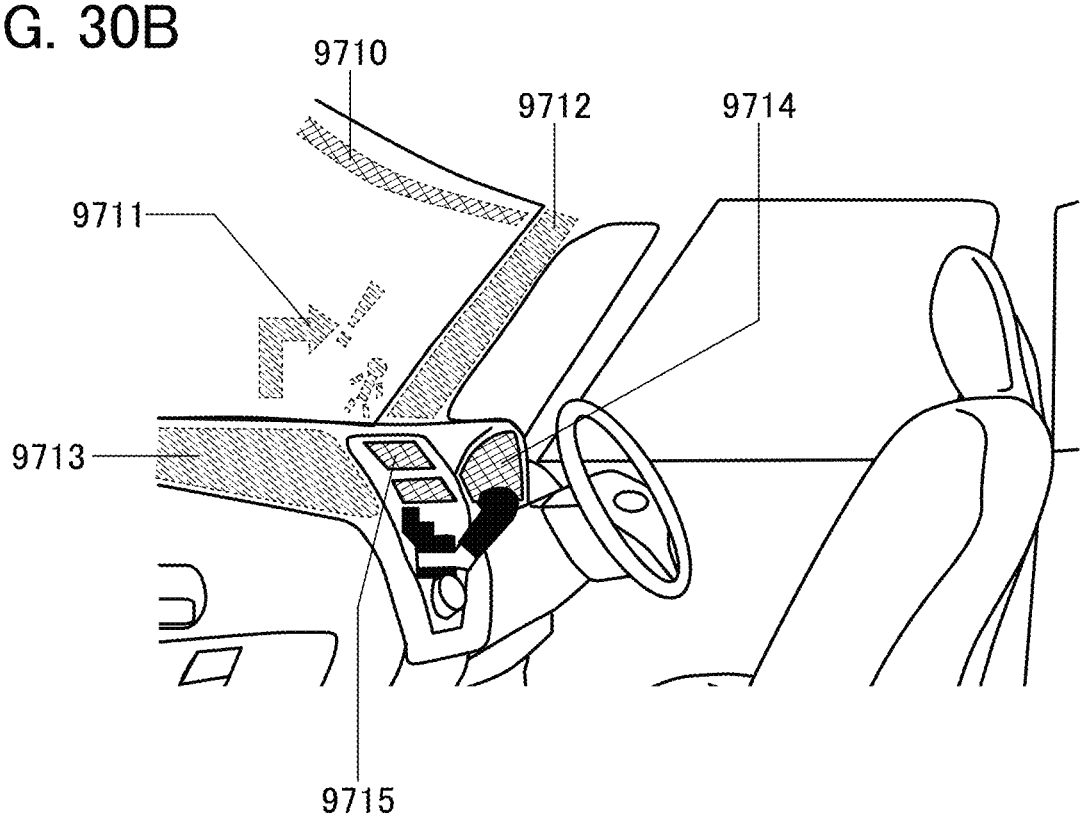

FIG. 30A is an external view of an automobile 9700. FIG. 30B illustrates a driver's seat of the automobile 9700. The automobile 9700 includes a car body 9701, wheels 9702, a dashboard 9703, lights 9704, and the like. The display apparatus of one embodiment of the present invention can be used in a display portion of the automobile 9700 or the like. For example, the display apparatus of one embodiment of the present invention can be provided for a display portion 9710 to a display portion 9715 illustrated in FIG. 30B.

The display portion 9710 and the display portion 9711 are display apparatuses provided in an automobile windshield. The display apparatus of one embodiment of the present invention can be what is called a see-through display apparatus, through which the opposite side can be seen, by using a light-transmitting conductive material for electrodes of the display apparatus. Such a see-through display apparatus does not hinder driver's vision during the driving of the automobile 9700. Thus, the display apparatus of one embodiment of the present invention can be provided in the windshield of the automobile 9700. Note that in the case where a transistor or the like for driving the display apparatus is provided in the display apparatus, for example, a transistor having a light-transmitting property, such as an organic transistor using an organic semiconductor material or a transistor using an oxide semiconductor, is preferably used as the transistor.

The display portion 9712 is a display apparatus provided on a pillar portion. For example, the display portion 9712 can compensate for the view hindered by the pillar by displaying an image taken by an imaging means provided on the car body 9701. The display portion 9713 is a display apparatus provided on a dashboard 9703. For example, the display portion 9713 can compensate for the view hindered by the dashboard 9703 by displaying an image taken by the imaging means provided on the car body 9701. That is, in the automobile 9700, an image taken by the imaging means provided on the car body 9701 is displayed on the display portion 9712 and the display portion 9713, which can compensate for blind areas and enhance safety. Display of an image that complements for a portion that cannot be seen makes it possible to confirm safety more naturally and comfortably.

Figure 31:
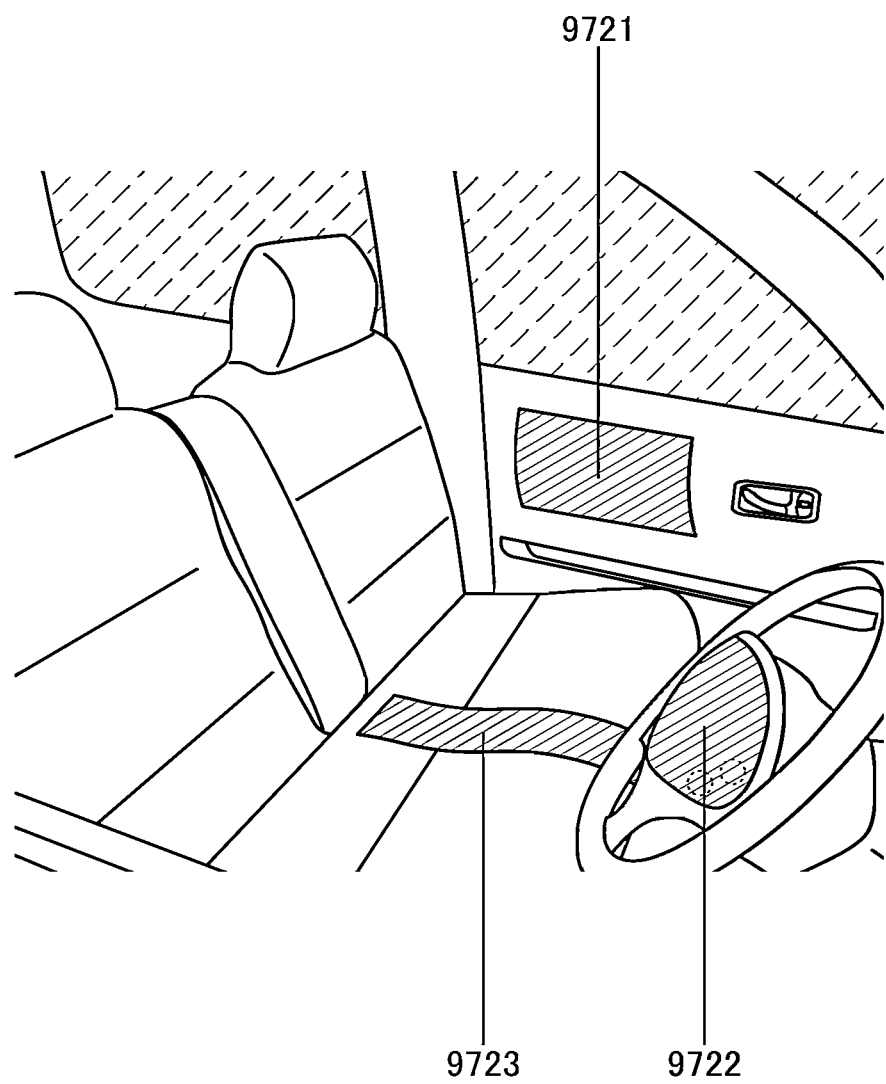
FIG. 31 is a diagram illustrating an example of an electronic device.

FIG. 31 illustrates the inside of an automobile 9700 in which a bench seat is used as a driver's seat and a front passenger's seat. A display portion 9721 is a display apparatus provided in a door portion. For example, the display portion 9721 can compensate for the view hindered by the door by displaying an image taken by an imaging means provided on the car body 9701. A display portion 9722 is a display apparatus provided in a steering wheel. A display portion 9723 is a display apparatus provided in the middle of a seating face of the bench seat.

The display portion 9714, the display portion 9715, and the display portion 9722 can provide a variety of kinds of information to a user by displaying navigation information, speed, the number of engine revolutions, a mileage, the remaining amount of fuel, a gearshift state, air-condition setting, or the like. The content, layout, and the like of the display on the display portions can be changed freely by a user as appropriate. The above information can also be displayed on one or more of the display portion 9710 to the display portion 9713, the display portion 9721, and the display portion 9723. One or more of the display portion 9710 to the display portion 9715 and the display portion 9721 to the display portion 9723 can also be used as lighting devices.

The structure described in this embodiment can be used in an appropriate combination with any of the structures described in the other embodiments and examples.

REFERENCE NUMERALS

100A: circuit, 111: driver circuit, 112: driver circuit, 121: switch circuit, 131A: selection circuit, 132A: selection circuit, 111-O: terminal, 112-O: terminal, 121-1: terminal, 121-2: terminal, 131A-I: terminal, 132A-I: terminal, SG1: signal generation circuit, SG2: signal generation circuit, SW1: switch, SW2: switch, SC1: switch, 141: terminal, 142: terminal, 143: terminal, Trnsw: n-channel transistor, Trpsw: p-channel transistor, INVsw: inverter, STB0: terminal, STB1: terminal, CHG1: terminal, INV0: inverter, INV1: inverter, XOR: circuit, 152: terminal, 154: terminal, PTL: pass transistor logic circuit, AMP: amplifier, SE1: switch, SE2: switch, SL1: terminal, SL2: terminal, SEL1: terminal, SEL2: terminal, PX1: pixel circuit, PX2: pixel circuit

The invention claimed is:

1. A semiconductor device comprising a circuit, the circuit comprising:
a first driver circuit comprising a first signal generation circuit and a first switch;
a second driver circuit comprising a second signal generation circuit and a second switch;
a switch circuit comprising a third switch;
a first selection circuit comprising a fourth switch and a fifth switch;
a second selection circuit comprising a sixth switch and a seventh switch;
a first terminal of the circuit;
a second terminal of the circuit;
a third terminal of the circuit; and
a fourth terminal of the circuit,
wherein a potential of a fifth terminal is input to the first driver circuit through a first inverter,
wherein a potential of a sixth terminal is input to the second driver circuit through a second inverter,
wherein the potential of the fifth terminal and the potential of the sixth terminal is input to an XOR circuit,
wherein a potential output from the XOR circuit is input to a control terminal of the third switch,
wherein the first signal generation circuit is configured to generate a first data signal,
wherein the second signal generation circuit is configured to generate a second data signal,
wherein the first signal generation circuit is electrically connected to a first terminal of the first switch,
wherein a second terminal of the first switch is electrically connected to a first terminal of the third switch, a first terminal of the fourth switch, and a first terminal of the fifth switch,
wherein the second signal generation circuit is electrically connected to a first terminal of the second switch,
wherein a second terminal of the second switch is electrically connected to a second terminal of the third switch, a first terminal of the sixth switch, and a first terminal of the seventh switch,
wherein a second terminal of the fourth switch is electrically connected to the first terminal of the circuit,
wherein a second terminal of the fifth switch is electrically connected to the second terminal of the circuit,
wherein a second terminal of the sixth switch is electrically connected to the third terminal of the circuit, and
wherein a second terminal of the seventh switch is electrically connected to the fourth terminal of the circuit.

2. The semiconductor device according to claim 1, wherein the first switch, the second switch, and the third switch are each an analog switch.

3. A display apparatus comprising:
the semiconductor device according to claim 1; and
a first pixel circuit capable of being electrically connected to the first terminal and the second terminal of the circuit,
wherein, when the first pixel circuit is electrically connected to one of the first terminal and the second terminal of the circuit, the first pixel circuit is not electrically connected to the other of the first terminal and the second terminal of the circuit.

4. A display apparatus comprising:
the semiconductor device according to claim 1;
a first pixel circuit electrically connected to the first terminal of the circuit; and
a second pixel circuit electrically connected to the second terminal of the circuit.

* * * * *